United States Patent
Lee et al.

(10) Patent No.: US 9,780,097 B2
(45) Date of Patent: Oct. 3, 2017

(54) DUAL-PORT SRAM DEVICES AND METHODS OF MANUFACTURING THE SAME

(71) Applicants: Kyo-Wook Lee, Goyang-si (KR); Dong-Hun Lee, Anyang-si (KR); Hee-Bum Hong, Hwaseong-si (KR); Yong-Rae Cho, Anyang-si (KR)

(72) Inventors: Kyo-Wook Lee, Goyang-si (KR); Dong-Hun Lee, Anyang-si (KR); Hee-Bum Hong, Hwaseong-si (KR); Yong-Rae Cho, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/965,316

(22) Filed: Dec. 10, 2015

(65) Prior Publication Data

US 2016/0190141 A1    Jun. 30, 2016

(30) Foreign Application Priority Data

Dec. 30, 2014 (KR) .................. 10-2014-0193548

(51) Int. Cl.
  *H01L 27/11* (2006.01)
  *H01L 29/78* (2006.01)
(52) U.S. Cl.
  CPC ...... *H01L 27/1104* (2013.01); *H01L 29/7851* (2013.01); *H01L 2924/0002* (2013.01)
(58) Field of Classification Search
  CPC ............. H01L 27/1104; H01L 29/785; H01L 27/0207; H01L 27/11; H01L 29/66795

USPC .... 365/154, 156, 230.05; 257/369, E27.099; 438/157, 197, 275

See application file for complete search history.

(56) References Cited

U.S. PATENT DOCUMENTS

| | | |
|---|---|---|
| 6,469,328 B2 | 10/2002 | Yanai et al. |
| 7,057,963 B2 | 6/2006 | Yang |
| 7,376,002 B2 | 5/2008 | Nii |
| 8,009,463 B2 | 8/2011 | Liaw |
| 8,183,639 B2 | 5/2012 | Malinge et al. |
| 8,258,572 B2 * | 9/2012 | Liaw .................. H01L 27/0207 257/327 |
| 8,625,334 B2 * | 1/2014 | Liaw .................. H01L 27/1104 365/154 |
| 8,675,397 B2 | 3/2014 | Liaw |

(Continued)

*Primary Examiner* — Jonathan Han
(74) *Attorney, Agent, or Firm* — Harness, Dickey & Pierce, P.L.C.

(57) ABSTRACT

A dual-port SRAM device includes a substrate having a field region and first to fourth active fins extending in a first direction, and a unit cell having first to eighth gate structures. The first and second gate structures are on the first, second and fourth active fins, and extend in a second direction crossing the first direction. The third and fourth gate structures are on the first, second and third active fins, and extend in the second direction. The fifth and sixth gate structures are on the third active fin, and extend in the second direction. The seventh and eighth gate structures are on the fourth active fin, and extend in the second direction. The sixth gate structure is electrically connected to the third gate structure through the first contact plug, and the seventh gate structure is electrically connected to the second gate structure through a second contact plug.

19 Claims, 48 Drawing Sheets

(56) References Cited

U.S. PATENT DOCUMENTS

| | | | |
|---|---|---|---|
| 8,913,455 B1* | 12/2014 | Camarota | H01L 21/8238 365/154 |
| 2004/0070008 A1 | 4/2004 | Kong | |
| 2013/0170275 A1* | 7/2013 | Kumar | G11C 11/412 365/63 |
| 2014/0254246 A1* | 9/2014 | Liaw | G11C 11/412 365/154 |

* cited by examiner

DUAL-PORT SRAM DEVICES AND METHODS OF MANUFACTURING THE SAME

CROSS-REFERENCE TO RELATED APPLICATION

This application claims priority under 35 USC §119 to Korean Patent Application No. 10-2014-0193548, filed on Dec. 30, 2014 in the Korean Intellectual Property Office (KIPO), the contents of which are herein incorporated by reference in their entirety.

BACKGROUND

1. Field

Example embodiments relate to SRAM devices and methods of manufacturing the same. More particularly, example embodiments relate to dual-port SRAM devices and methods of manufacturing the same.

2. Description of the Related Art

In a dual-port static random access memory (SRAM) device, two word lines and two pairs of bit lines may be connected to a unit cell, and a pair of pass-gate transistors may be connected to each word line. The pair of pass-gate transistors may be formed at active regions that may be spaced apart from a center of the unit cell at different distances from each other, and one pass-gate transistor may be connected to a first node via a contact and a metal line, while the other pass-gate transistor may be connected to a second node via a contact and a gate. Thus, a current difference may occur due to the resistance difference between the metal line and the gate.

SUMMARY

Example embodiments provide a dual-port SRAM device having desirable characteristics.

Example embodiments also provide a method of manufacturing a dual-port SRAM device having desirable characteristics.

According to example embodiments, a dual-port SRAM device includes a substrate and a unit cell. The substrate includes a field region and first to fourth active fins. An isolation layer pattern is formed on the field region, and each of the first to fourth active fins protrudes from the isolation layer pattern and extends in a first direction. The unit cell includes first to eighth gate structures and first and second contact plugs. The first and second gate structures are on the first, second and fourth active fins, and each of the first and second gate structures extends in a second direction crossing the first direction. The third and fourth gate structures are on the first, second and third active fins, and each of the third and fourth gate structures extends in the second direction. The fifth and sixth gate structures are on the third active fin, and each of the fifth and sixth gate structures extends in the second direction. The seventh and eighth gate structures are on the fourth active fin, and each of the seventh and eighth gate structures extends in the second direction. The sixth gate structure is electrically connected to the third gate structure through the first contact plug, and the seventh gate structure is electrically connected to the second gate structure through the second contact plug.

In example embodiments, the third gate structure on the first active fin and the second gate structure on the second active fin may form first and second pull-up transistors, respectively. The third and sixth gate structures electrically connected to each other through the first contact plug on the third active fin, and the second and seventh gate structures electrically connected to each other through the second contact plug on the fourth active fin may form first and second pull-down transistors, respectively.

In example embodiments, the fifth gate structure on the third active fin and the first gate structure on the fourth active fin may form first and second pass-gate transistors, respectively. The fourth gate structure on the third active fin and the eighth gate structure on the fourth active fin may form third and fourth pass-gate transistors, respectively.

In example embodiments, the dual-port SRAM device may further include a first word line electrically connected to the fifth and first gate structures forming the first and second pass-gate transistors, respectively, and a second word line electrically connected to the fourth and eighth gate structures forming the third and fourth pass-gate transistors, respectively.

In example embodiments, the dual-port SRAM device may further include a third contact plug electrically connecting a first pass-gate source/drain region of the first pass-gate transistor and a first pull-up source/drain region of the first pull-up transistor, and a fourth contact plug electrically connecting a fourth pass-gate source/drain region of the fourth pass-gate transistor and a second pull-up source/drain region of the second pull-up transistor.

In example embodiments, each of the third and fourth contact plugs may include a first portion extending in the first direction and a second portion extending in the second direction.

In example embodiments, the third and fourth contact plugs may be in point symmetry with respect to a center of the unit cell.

In example embodiments, the third pass-gate transistor may include a third pass-gate source/drain region electrically connected to the third contact plug through a fifth contact plug, first and second vias, and a first connection line, and the second pass-gate transistor may include a second pass-gate source/drain region electrically connected to the fourth contact plug through a sixth contact plug, third and fourth vias, and a second connection line.

In example embodiments, the third and fifth contact plugs may have top surfaces coplanar with each other, the first and second vias may contact the top surfaces of the third and fifth contact plugs, respectively, and the first connection line may contact top surfaces of the first and second vias. The fourth and sixth contact plugs may have top surfaces coplanar with each other, the third and fourth vias may contact the top surfaces of the fourth and sixth contact plugs, respectively, and the second connection line may contact top surfaces of the third and fourth vias.

In example embodiments, each of the first and second connection lines may extend in the first direction.

In example embodiments, the dual-port SRAM device may further include a power line and a ground line. The power line may extend in the first direction. The power line may be electrically connected to the first pull-up source/drain region through a seventh contact plug and a fifth via, and may be electrically connected to the second pull-up source/drain region through an eighth contact plug and a sixth via. The ground line may extend in the first direction. The ground line may be electrically connected to the first pull-down source/drain region through a ninth contact plug and a seventh via, and may be electrically connected to the second pull-down source/drain region through a tenth contact plug and an eighth via.

In example embodiments, the dual-port SRAM device may further include a first bit line extending in the first direction and electrically connected to the first pass-gate source/drain region, a first complementary bit line extending in the first direction and electrically connected to the second pass-gate source/drain region, a second bit line extending in the first direction and electrically connected to the third pass-gate source/drain region, and a second complementary bit line extending in the first direction and electrically connected to the fourth pass-gate source/drain region.

In example embodiments, the first and second connection lines, the power line, the ground line, the first and second bit lines, and the first and second complementary bit lines may have a top surface at a same level.

In example embodiments, the first and second active fins may be in point symmetry with respect to a center of the unit cell, and the third and fourth active fins may be in point symmetry with respect to a center of the unit cell.

In example embodiments, the first and second gate structures and the third and fourth gate structures may be in point symmetry with respect to a center of the unit cell, and the fifth and sixth gate structures and the seventh and eighth gate structures may be in point symmetry with respect to a center of the unit cell.

In example embodiments, each of the first to fourth active fins may have a width in the second direction that is constant along the first direction.

In example embodiments, the widths of the first and second active fins may be less than the widths of the third and fourth active fins.

In example embodiments, the widths of the first and second active fins may be the same, and the widths of the third and fourth active fins may be the same.

In example embodiments, each of the first to eighth gate structures may include a gate insulation layer pattern including a high-k dielectric material on the substrate, and a gate electrode including a metal on the gate insulation layer pattern.

In example embodiments, each of the first to eighth gate structures may further include an interface layer pattern between the substrate and the gate insulation layer pattern. The gate insulation layer pattern may cover a bottom surface and a sidewall of the gate electrode.

According to example embodiments, a dual-port SRAM device includes a substrate and a unit cell. The substrate includes a field region and first to fourth active regions. An isolation layer pattern is on the field region, each of the first to fourth active regions protrudes from the isolation layer pattern and extends in a first direction, and the first to fourth active regions are spaced apart from each other in a second direction perpendicular to the first direction. The unit cell includes first and second pull-up transistors on the first and second active regions, respectively, first and second pull-down transistors on the third and fourth active regions, respectively, first and third pass-gate transistors on the third active region, and second and fourth pass-gate transistors on the fourth active region. The first and second pull-up transistors, the first and second pull-down transistors, the first and fourth pass-gate transistors, and the second and third pass-gate transistors are respectively in point symmetry with respect to a center of a unit cell. The first pull-down transistor includes first and second gate structures extending in the second direction and a first contact plug contacting the first and second gate structures, and the second pull-down transistor includes third and fourth gate structures extending in the second direction and a second contact plug contacting the third and fourth gate structures.

In example embodiments, the dual-port SRAM device may further include a third contact plug electrically connecting a first pass-gate source/drain region of the first pass-gate transistor and a first pull-up source/drain region of the first pull-up transistor, and a fourth contact plug electrically connecting a fourth pass-gate source/drain region of the fourth pass-gate transistor and a second pull-up source/drain region of the second pull-up transistor.

In example embodiments, each of the third and fourth contact plugs may include a first portion extending in the first direction and a second portion extending in the second direction.

In example embodiments, the dual-port SRAM device may further include a fifth contact plug electrically connected to a third pass-gate source/drain region of the third pass-gate transistor, a first connection line electrically connecting the third and fifth contact plugs, a sixth contact plug electrically connected to a second pass-gate source/drain region of the second pass-gate transistor, and a second connection line electrically connecting the fourth and sixth contact plugs.

In example embodiments, wherein each of the first and second connection lines may extend in the first direction.

In example embodiments, the dual-port SRAM device may further include a power line electrically connected to the first and second pull-up source/drain regions, and a ground line electrically connected to a first pull-down source/drain region of the first pull-down transistor and a second pull-down source/drain region of the second pull-down transistor.

In example embodiments, each of the power line and the ground line may extend in the first direction.

In example embodiments, the dual-port SRAM device may further include a first bit line electrically connected to the first pass-gate source/drain region, a first complementary bit line electrically connected to the second pass-gate source/drain region, a second bit line electrically connected to the third pass-gate source/drain region, and a second complementary bit line electrically connected to the fourth source/drain region.

In example embodiments, each of the first and second bit lines, and the first and second complementary bit lines may extend in the first direction.

In example embodiments, the first and second connection lines, the power line, the ground line, the first and second bit lines, and the first and second complementary bit lines may have a top surface at a same level.

In example embodiments, the dual-port SRAM device may further include a first word line electrically connected to the third and fourth gate structures of the first and second pass-gate transistors, respectively, and a second word line electrically connected to the fifth and sixth gate structures of the third and fourth pass-gate transistors, respectively.

In example embodiments, the first and second word lines may have a top surface at a level higher than a top surface of the first and second connection lines, the power line, the ground line, the first and second bit lines, and the first and second complementary bit lines.

According to example embodiments, a method of manufacturing a dual-port SRAM device includes forming an isolation layer pattern on a substrate to define a field region and first to fourth active fins in the substrate, the field region being covered by the isolation layer pattern, each of the first to fourth active fins protruding from the isolation layer pattern, forming first to eighth gate structures on the substrate, the first and second gate structures extending in a second direction crossing a first direction on the first, second and fourth active fins, the third and fourth gate structures extending in the second direction on the first, second and third active fins, the fifth and sixth gate structures extending in the second direction on the third active fin, and the seventh and eighth gate structures extending in the second direction on the fourth active fin, forming a first contact plug contacting the sixth and third gate structures, and forming a second contact plug contacting the seventh and second gate structures.

In example embodiments, forming the first to eighth gate structures may include forming first to eighth dummy gate structures on the first to fourth active fins, forming first to eighth gate spacers on sidewalls of the first to eighth dummy gate structures, respectively, forming a first insulating interlayer on the substrate and the isolation layer pattern to cover the first to eighth dummy gate structures and the first to eighth gate spacers, planarizing the first insulating interlayer to expose the first to eighth dummy gate structures, removing the exposed first to eighth dummy gate structures to form first to eighth openings, respectively, and sequentially forming a gate insulation layer pattern and a gate electrode filling the first to eighth openings.

In example embodiments, each of the first to eighth dummy gate structures may include a dummy gate insulation layer pattern, a dummy gate electrode and a dummy gate mask sequentially stacked.

In example embodiments, the gate insulation layer pattern may include a high-k dielectric material, and the gate electrode may include a metal.

In example embodiments, upper portions of the first to fourth active fins adjacent to the first to eighth gate structures may be removed to form recesses. A selective epitaxial growth (SEG) process may be performed on the first to fourth active fins exposed by the recesses to form a source/drain region in each of the recesses.

In example embodiments, the third gate structure on the first active fin and the source/drain region adjacent thereto may form a first pull-up transistor, and the second gate structure on the second active fin and the source/drain adjacent thereto may form a second pull-up transistor. The third and sixth gate structures on the third active fin and contacting the first contact plug and the source/drain region adjacent thereto may form a first pull-down transistor, and the second and seventh gate structures on the fourth active fin contacting the second contact plug and the source/drain adjacent thereto may form a second pull-down transistor. The fifth gate structure on the third active fin and the source/drain region adjacent thereto may form a first pass-gate transistor, and the first gate structure on the fourth active fin and the source/drain adjacent thereto may form a second pass-gate transistor. The fourth gate structure on the third active fin and the source/drain region adjacent thereto may form a third pass-gate transistor, and the eighth gate structure on the fourth active fin and the source/drain adjacent thereto may form a fourth pass-gate transistor.

In example embodiments, forming the first contact plug and the second contact plug may include forming a first insulating interlayer to cover sidewalls of the first to eighth gate structures, forming a second insulating interlayer on the first insulating interlayer and the first to eighth gate structures, and forming the first and second contact plugs through the second insulating interlayer, the first contact plug contacting top surfaces of the third and sixth gate structures, and the second contact plug contacting top surfaces of the second and seventh gate structures.

In example embodiments, forming the first contact plug and the second contact plug may further include forming third and fourth contact plugs through the second insulating interlayer and the first insulating interlayer, the third contact plug contacting a first pass-gate source/drain region of the first pass-gate transistor and a first pull-up source/drain region of the first pull-up transistor, and the fourth contact plug contacting a fourth pass-gate source/drain region of the fourth pass-gate transistor and a second pull-up source/drain region of the second pull-up transistor.

In example embodiments, the method may further include forming fifth and sixth contact plugs through the first and second insulating interlayers, the fifth contact plug contacting a third pass-gate source/drain region of the third pass-gate transistor, and the sixth contact plug contacting a second pass-gate source/drain region of the second pass-gate transistor, forming a third insulating interlayer on the second insulating interlayer and the first to sixth contact plugs, forming first to fourth vias through the third insulating interlayer, the first and second vias contacting top surfaces of the third and fifth contact plugs, respectively, and the fourth and sixth contact plugs contacting top surfaces of the third and fourth vias, forming a fourth insulating interlayer on the third insulating interlayer and the first to fourth vias, and forming first and second connection lines through the fourth insulating interlayer, the first connection line contacting top surfaces of the first and second vias, and the second connection line contacting top surfaces of the third and fourth vias.

In example embodiments, the method may further include forming seventh to tenth contact plugs through the first and second insulating interlayers, the seventh contact plug contacting the first pull-up source/drain region, the eighth contact plug contacting the second pull-up source/drain region, the ninth contact plug contacting a first pull-down source/drain region of the first pull-down transistor, and the tenth contact plug contacting a second pull-down source/drain region of the second pull-down transistor, forming fifth to eighth vias through the third insulating interlayer to contact the seventh to tenth contact plugs, respectively, and forming a power line and a ground line through the fourth insulating interlayer, the power line contacting the fifth and sixth vias, and the ground line contacting the seventh and eighth vias.

In example embodiments, the method may further include forming a first bit line electrically connected to the first pass-gate source/drain region, forming a first complementary bit line electrically connected to the second pass-gate source/drain region, forming a second bit line electrically connected to the third pass-gate source/drain region, and forming a second complementary bit line electrically connected to the fourth pass-gate source/drain region.

According to example embodiments, a dual-port SRAM device includes a substrate including first to fourth active regions extending in a first direction, and a unit cell including first to fourth pass-gate transistors extending in a second direction, the first and third pass-gate transistors on the third active region, the second and fourth pass-gate transistors on the fourth active region, the second and third pass-gate transistors, and the first and fourth pass-gate transistors being in point symmetry with respect to a center of the unit cell.

In example embodiments, the unit cell may further include a first pull-up transistor on the first active region, a second pull-up transistor on the second active region, the first and second pull-up transistors being in point symmetry with respect to a center of the unit cell, a first pull-down transistor on the third active region, the first pull-down transistor including first and second gate structures extending in the second direction and a first contact plug contacting the first and second gate structures, and a second pull-down transistor on the fourth active region, the second pull-down transistor including third and fourth gate structures extending in the second direction and a second contact plug contacting the third and fourth gate structures, the first and second pull-down transistors being in point symmetry with respect to a center of the unit cell.

In example embodiments, the device may further include a first word line electrically connected to third and fourth gate structures of the first and second pass-gate transistors, respectively, and a second word line electrically connected to fifth and sixth gate structures of the third and fourth pass-gate transistors, respectively.

In example embodiments, the fifth, first, fourth and eighth gate structures of the first to fourth pass-gate transistors may be configured such that electrical current does not pass therethrough.

In the dual-port SRAM device in accordance with example embodiments, currents flowing from the pairs of pass-gate transistors to the nodes, respectively, may have values substantially the same as or similar to each other. As a length of the unit cell in a first direction may be decreased and a width thereof in a second direction may be increased, the word lines extending in the first direction and disposed in the second direction may have reduced lengths and enlarged widths so as to have relatively low resistances. Further, all of the power line, the ground line and the bit line may be formed at a single level, and thus only the word lines may be formed at another level so as to have a larger width and a lower resistance. The structures in the unit cell may have symmetry, and thus may be more easily formed.

BRIEF DESCRIPTION OF THE DRAWINGS

Example embodiments will be more clearly understood from the following detailed description taken in conjunction with the accompanying drawings.

FIG. 1 is an equivalent circuit diagram of a dual-port SRAM device in accordance with example embodiments, FIG. 2 is a plan view illustrating a unit cell of the dual-port SRAM device, FIGS. 3 to 9 are cross-sectional views illustrating the unit cell of the dual-port SRAM device, FIG. 10 is a plan view illustrating a portion of the unit cell of the dual-port SRAM device under a fourth insulating interlayer in which bit lines are formed, and FIGS. 11 to 48 are plan views and cross-sectional views illustrate stages of a method of manufacturing a dual-port SRAM device in accordance with example embodiments.

DETAILED DESCRIPTION

Figure 1:
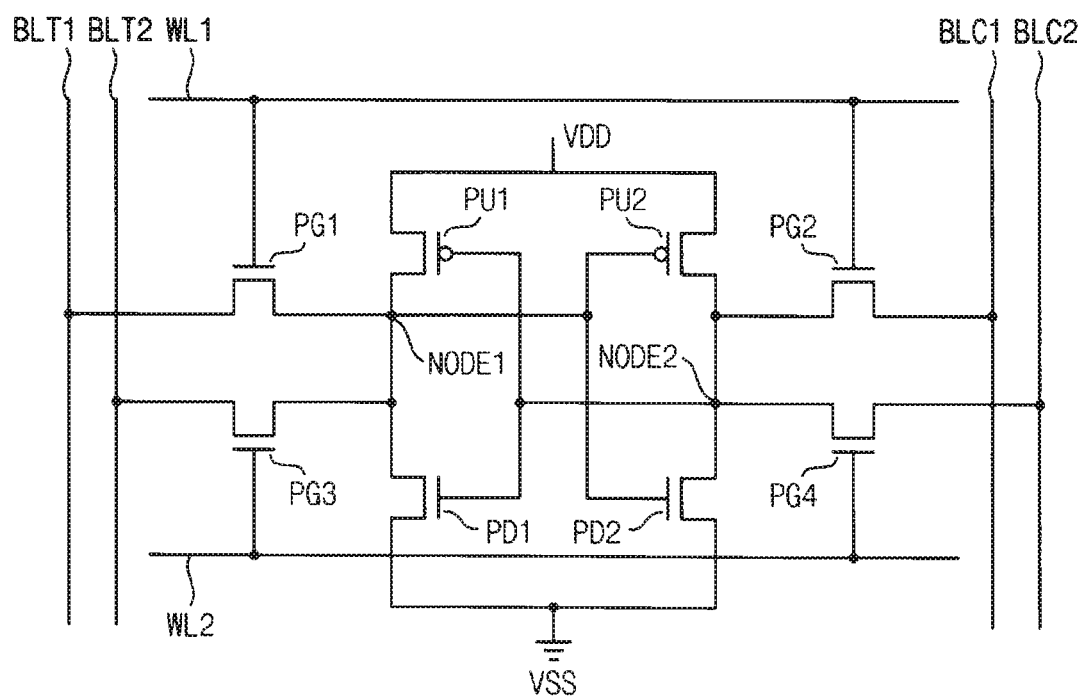
FIGS. 1 to 48 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
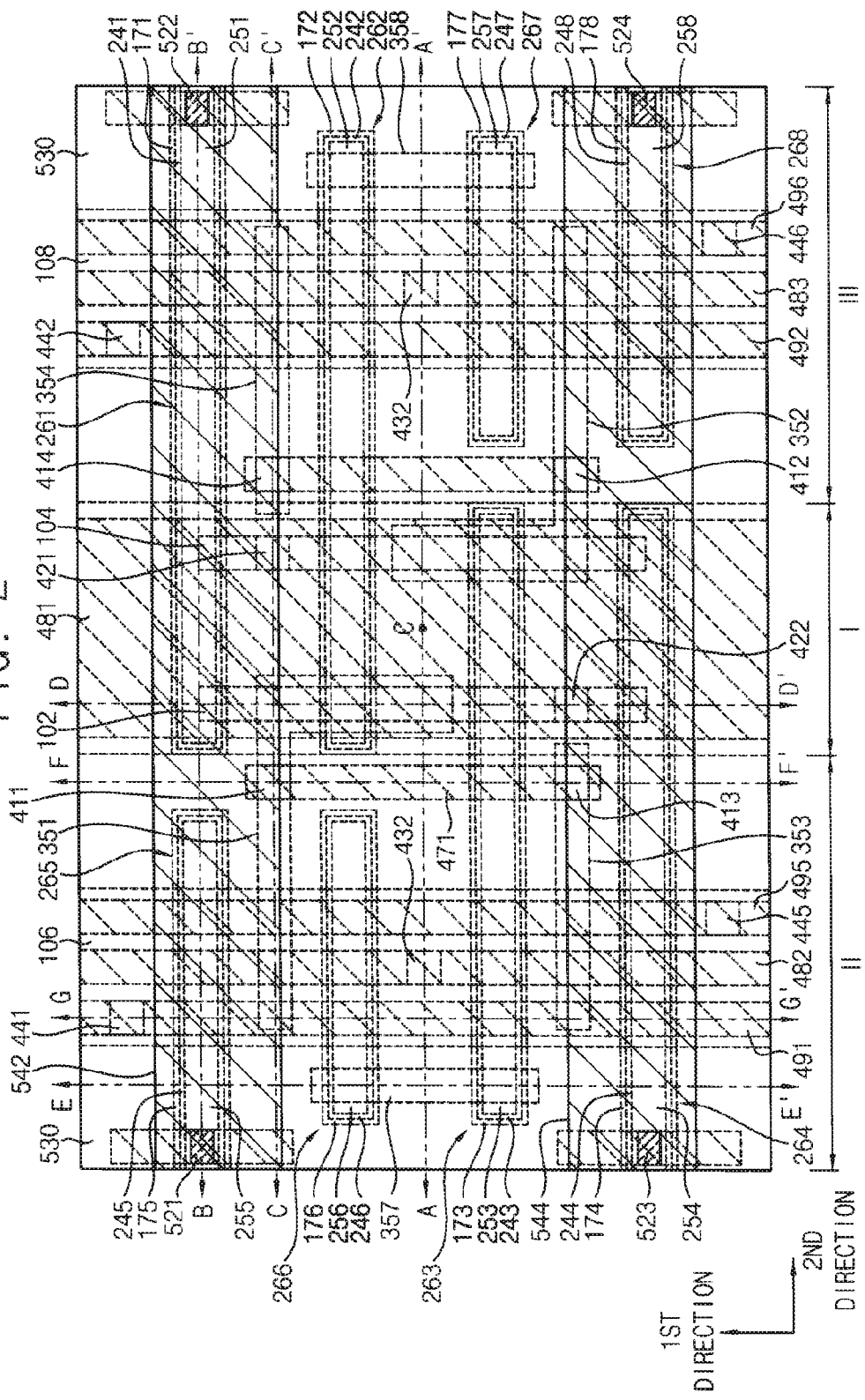
Figure 3:
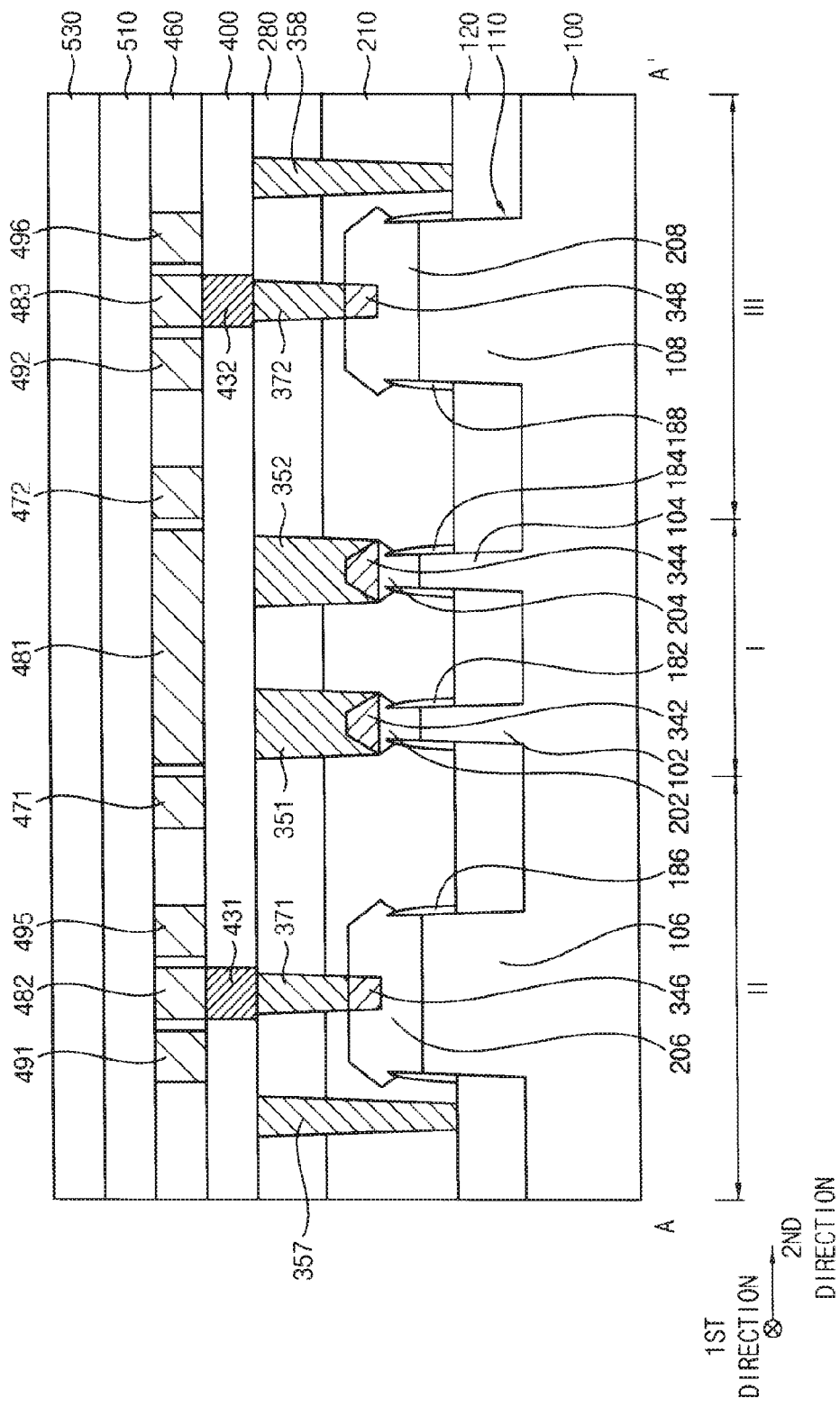
Figure 4:
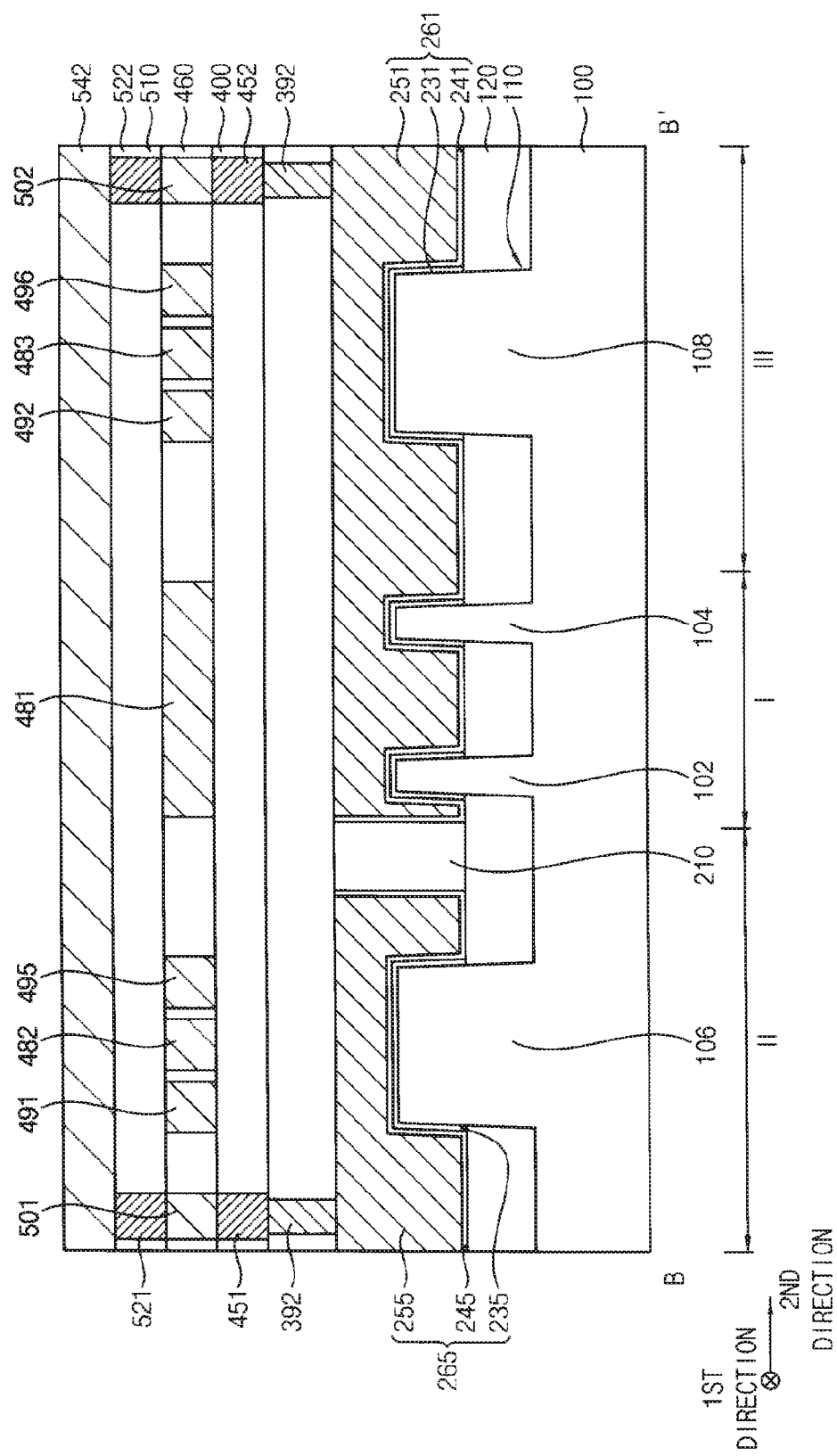
Figure 5:
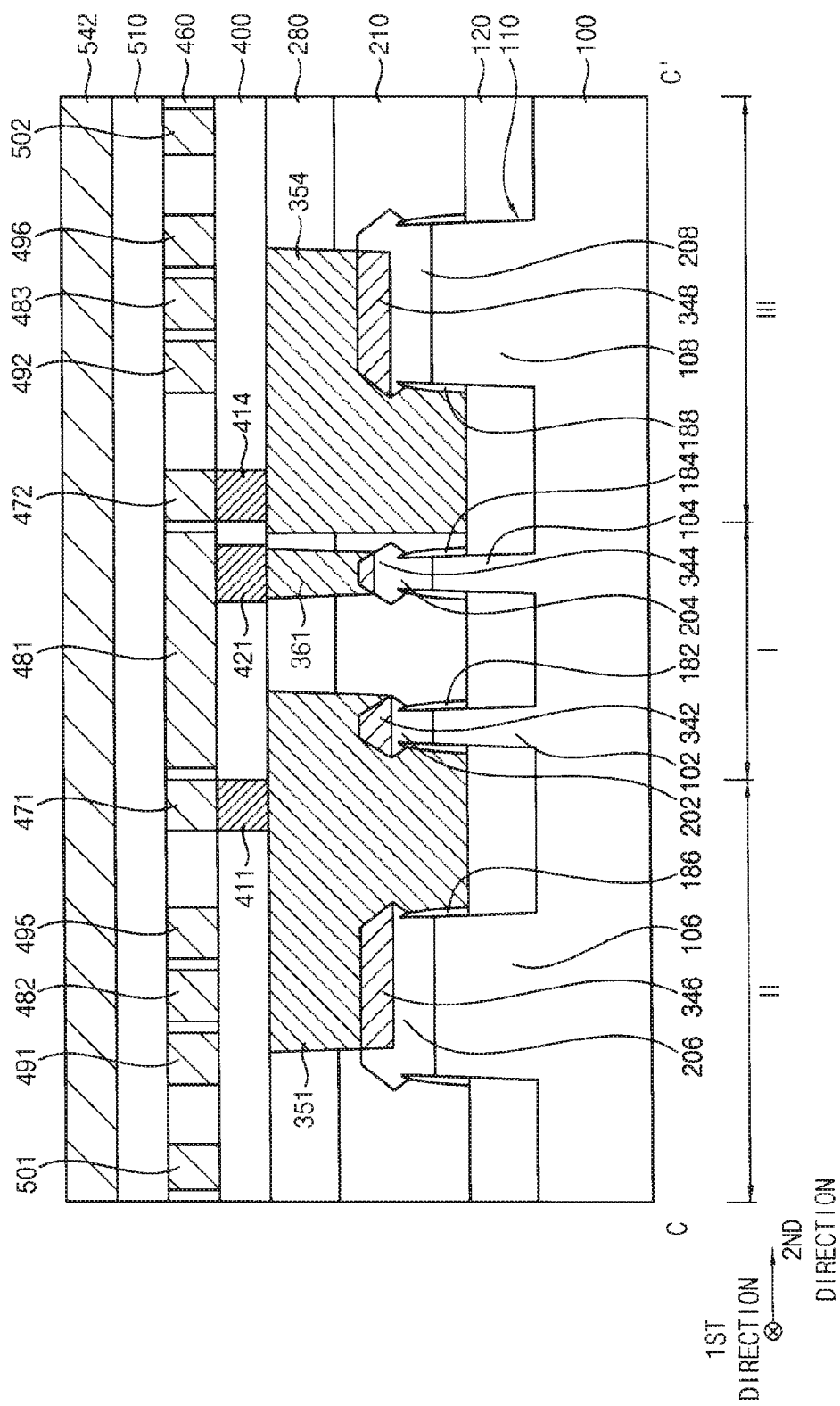
Figure 6:
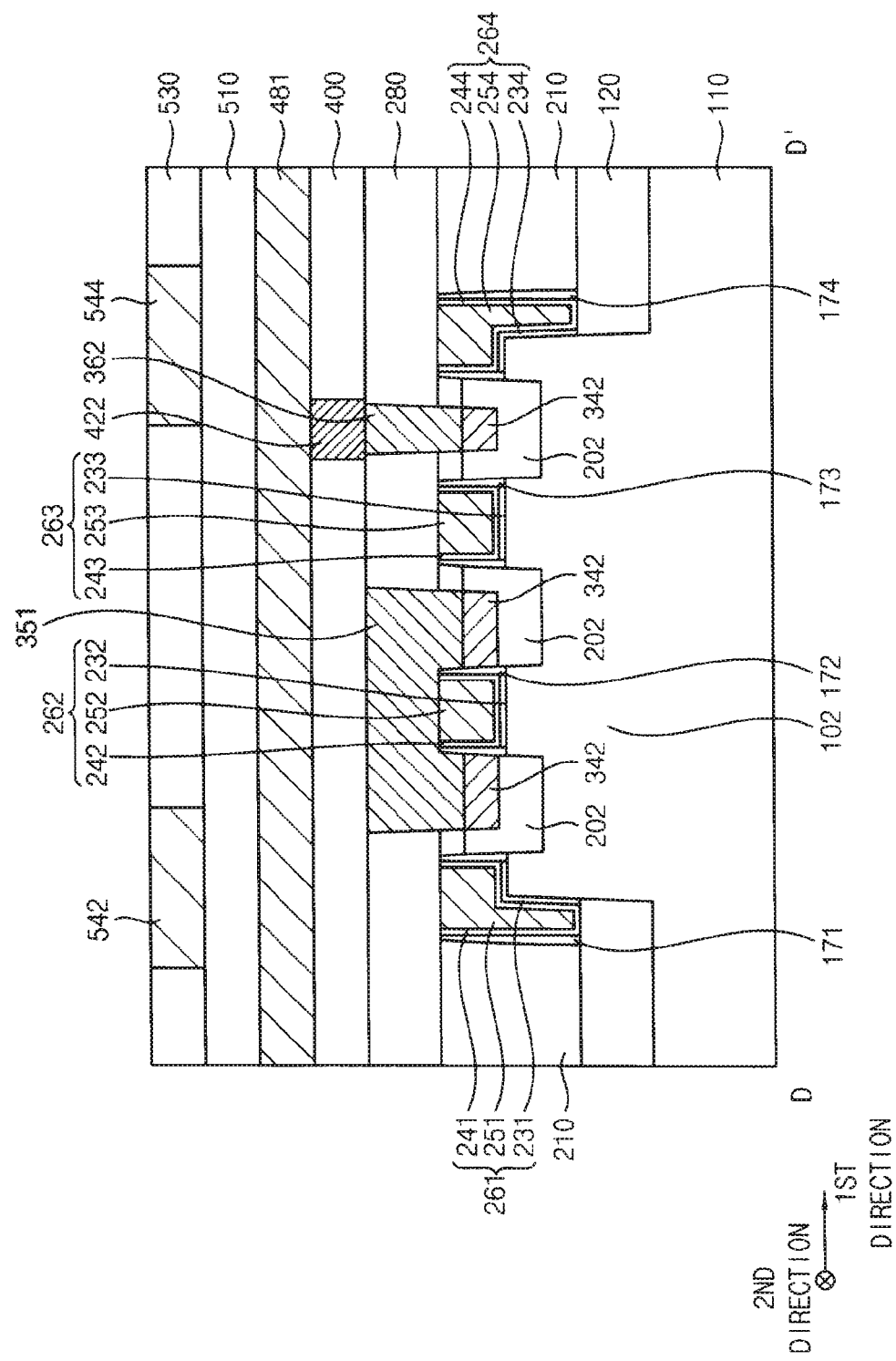
Figure 7:
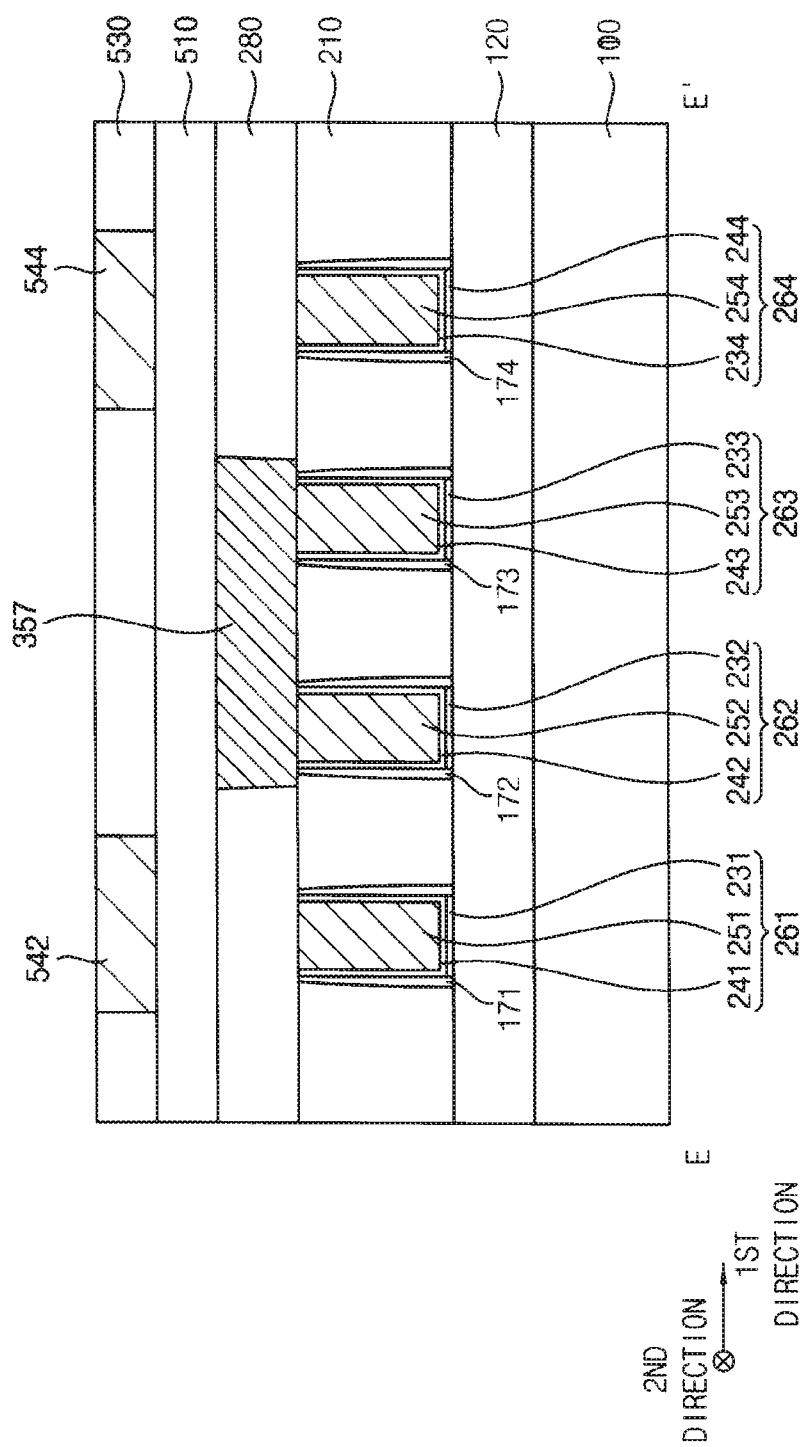
Figure 8:
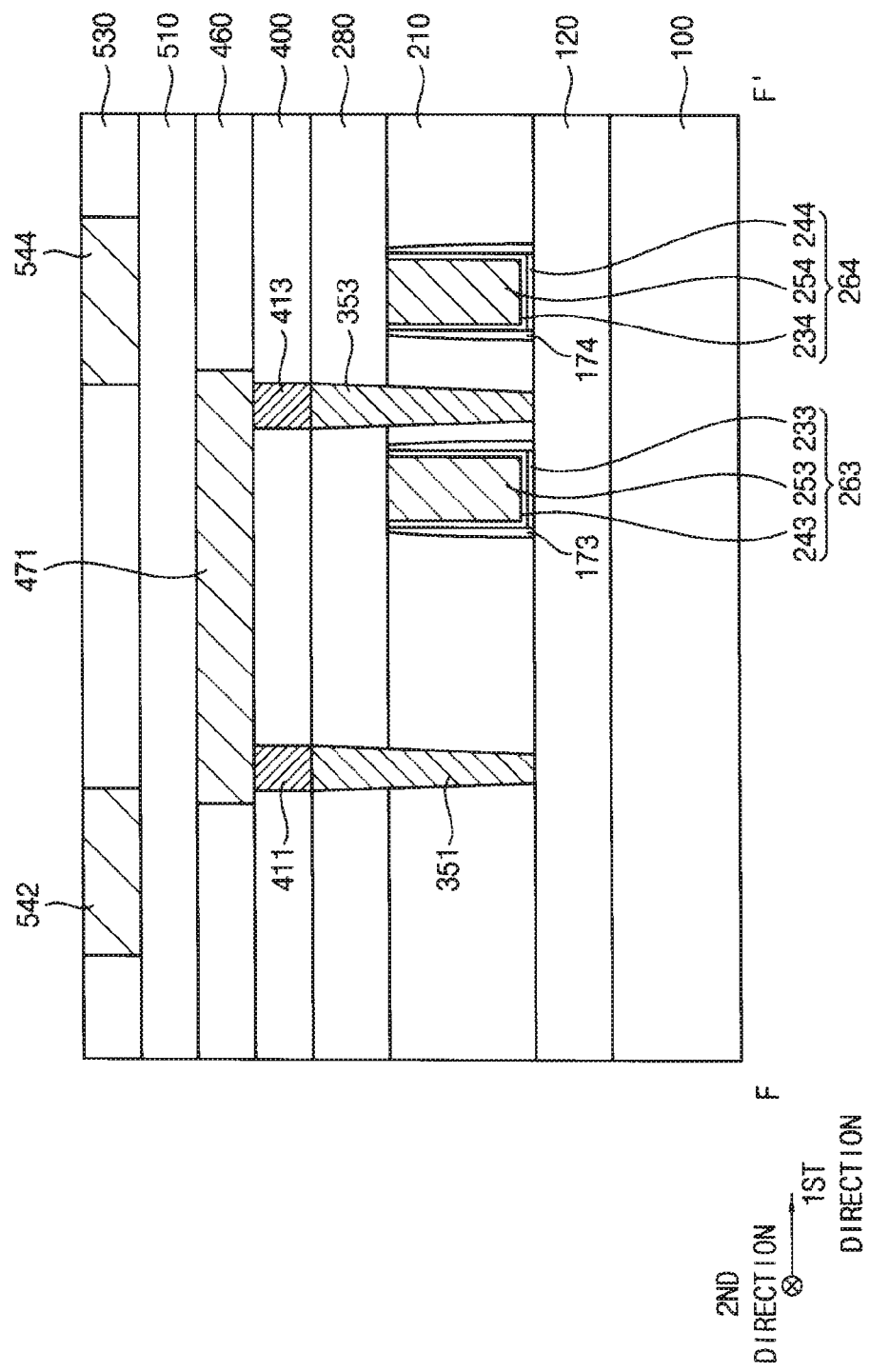
Figure 9:
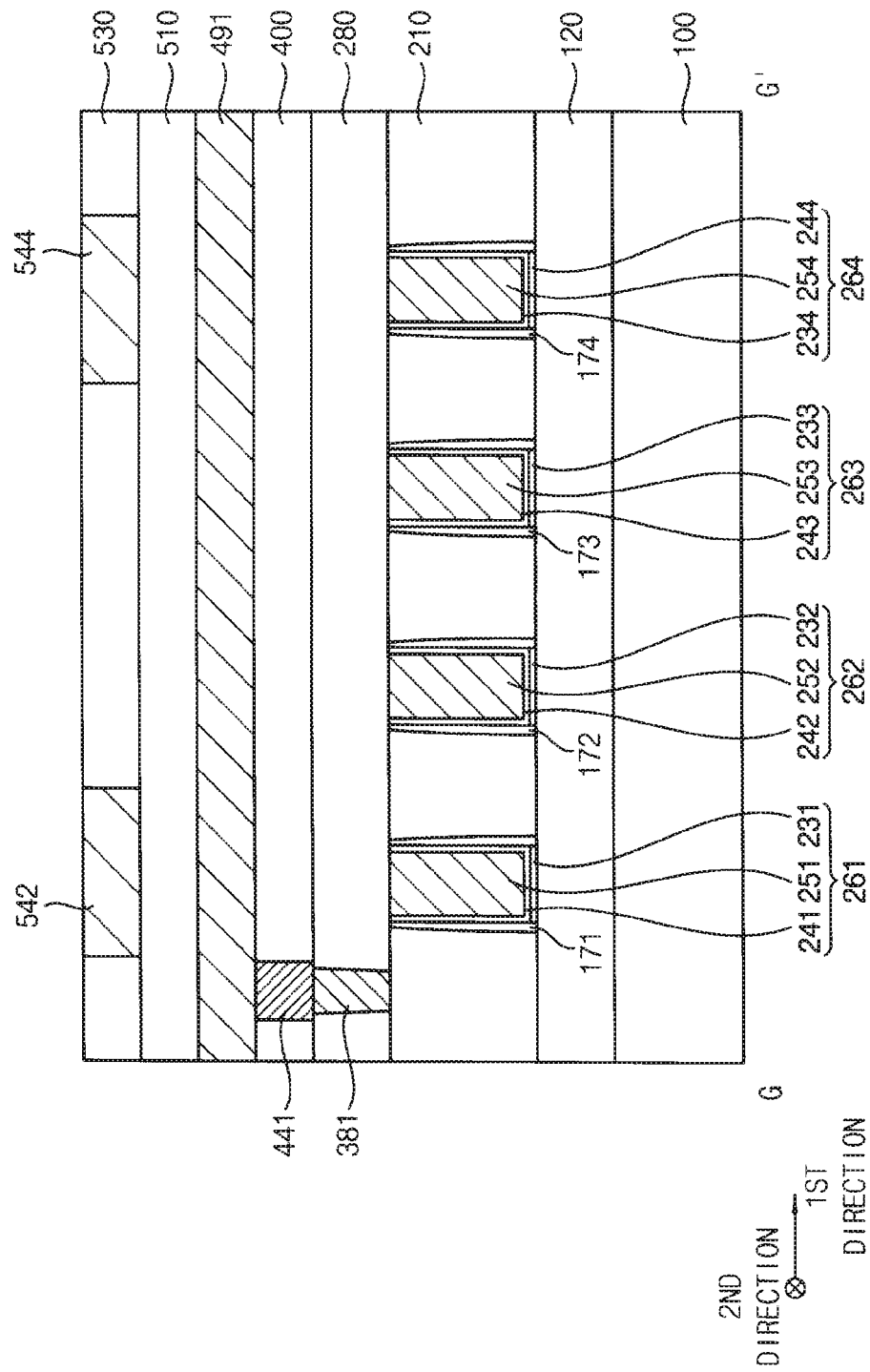
Figure 10:
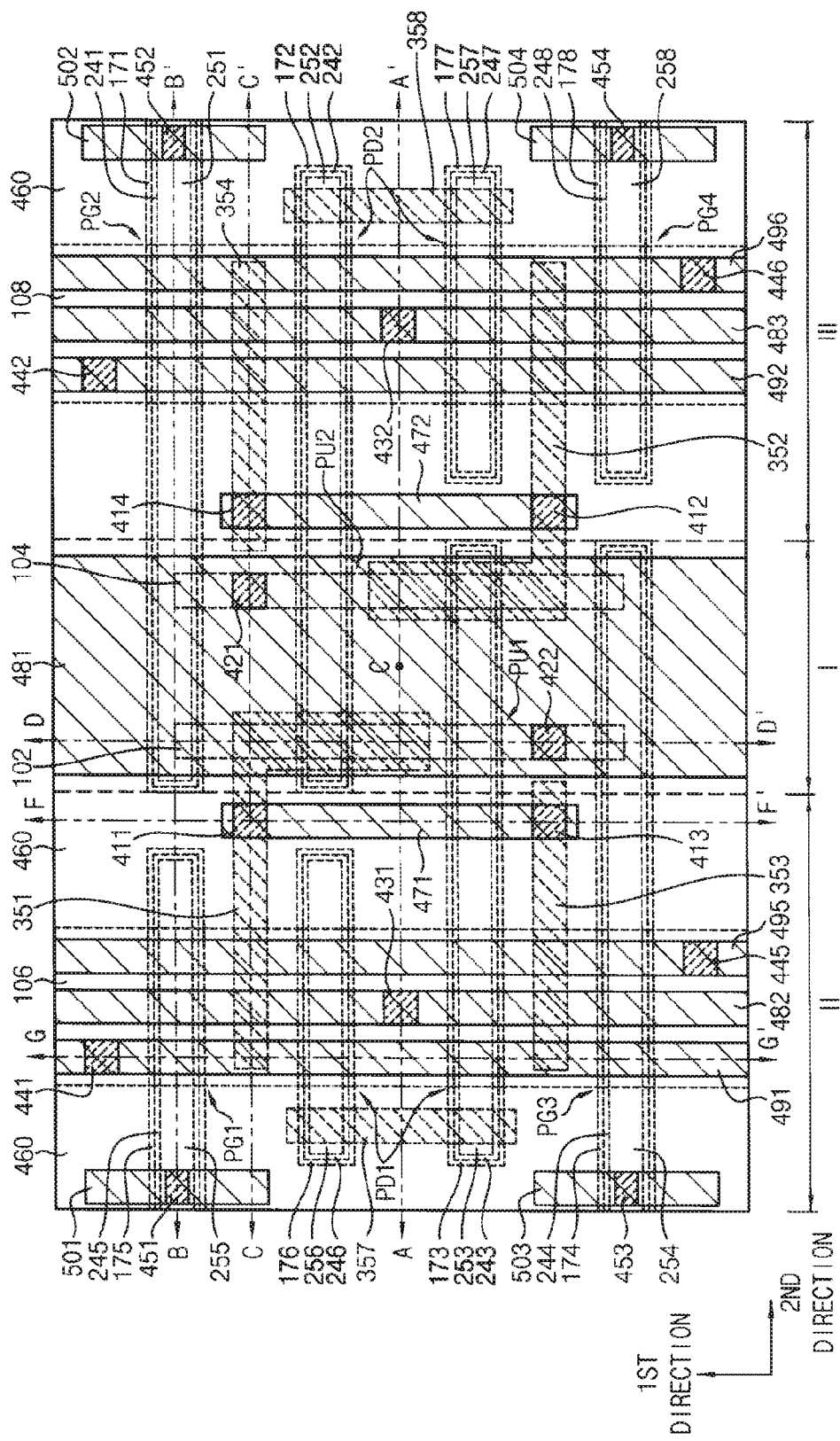

FIG. 1 is an equivalent circuit diagram of a dual-port SRAM device in accordance with example embodiments, FIG. 2 is a plan view illustrating a unit cell of the dual-port SRAM device, FIGS. 3 to 9 are cross-sectional views illustrating the unit cell of the dual-port SRAM device, and FIG. 10 is a plan view illustrating a portion of the unit cell of the dual-port SRAM device under a fourth insulating interlayer in which bit lines are formed. FIGS. 3 to 9 are cross-sectional views of the unit cell of the SRAM device taken along lines A-A', B-B', C-C', D-D', E-E', F-F' and G-G', respectively, in FIG. 1.

Referring to FIGS. 1 to 10, the unit cell of the SRAM device may include first to fourth active regions 102, 104, 106 and 108, and first to eighth gate structures 261, 262, 263, 264, 265, 266, 267 and 268 on a substrate 100. The unit cell of the SRAM device may further include first to fourth source/drain layers 202, 204, 206 and 208, first to eighteenth contact plugs 351, 352, 353, 354, 357, 358, 361, 362, 371, 372, 381, 382, 385, 386, 391, 392, 393 and 394, first to sixteenth vias 411, 412, 413, 414, 421, 422, 431, 432, 441, 442, 445, 446, 451, 452, 453 and 454, first to thirteenth conductive lines 471, 472, 481, 482, 483, 491, 492, 495, 496, 501, 502, 503 and 504, seventeenth to twentieth vias 521, 522, 523 and 524, and fourteenth to fifteenth conductive lines 542 and 544.

The substrate 100 may include a semiconductor material, e.g., silicon and/or germanium, or a Group III-V compound semiconductor material, e.g., GaP, GaAs and/or GaSb. In example embodiments, the substrate 100 may be a silicon-on-insulator (SOI) substrate, or a germanium-on-insulator (GOI) substrate.

The substrate 100 may include first to third regions I, II and III. In example embodiments, the first region I may be formed at a central portion of the unit cell, and may serve as a positive-channel metal oxide semiconductor (PMOS) region in which PMOS transistors may be formed. The second and third regions II and III may be formed at both sides of the first region I in the unit cell, and may serve as negative-channel metal oxide semiconductor (NMOS) regions in which NMOS transistors may be formed.

An isolation layer pattern 120 may be formed on the substrate 100, and thus a field region of which a top surface may be covered by the isolation layer pattern 120 and an active region of which a top surface may not be covered by the isolation layer pattern 120 may be defined in the substrate 100. The active region may protrude from the isolation layer pattern 120 and have a fin-like shape so as to be referred to as an active fin. The isolation layer pattern 120 may include an oxide, e.g., silicon oxide.

In example embodiments, the active region may extend in a first direction substantially parallel to a top surface of the substrate 100, and a plurality of active regions may be formed in a second direction substantially parallel to the top surface of the substrate 100 and substantially perpendicular to the first direction. Thus, one or more than one active region may be formed in each of the first to third regions I, II and III. FIGS. 2 to 10 show two active regions in the first region I, and one active region in each of the second and third regions II and III. The two active regions in the first region I may be referred to as first and second active regions 102 and 104, respectively, and the active regions in the second and third regions II and III may be referred to as third and fourth active regions 106 and 108, respectively.

In example embodiments, widths in the second direction of the first and second active regions 102 and 104 may be substantially the same as each other, and widths in the second direction of the third and fourth active regions 106 and 108 may be substantially the same as each other. The widths of the first and second active regions 102 and 104 may be less than the widths of the third and fourth active regions 106 and 108.

In example embodiments, the first and second active regions 102 and 104 may be in point symmetry with respect to a center C of the unit cell, and the third and fourth active regions 106 and 108 may be also in point symmetry with respect to the center C of the unit cell. Each of the first to fourth active regions 102, 104, 106 and 108 may extend in the first direction, and thus the first and second active regions 102 and 104 may be also in line symmetry with respect to an imaginary line extending in the first direction and crossing over the center C of the unit cell, and the third and fourth active regions 106 and 108 may be also in line symmetry.

First to fourth fin spacers 182, 184, 186 and 188 may be formed on both sidewalls in the second direction of the first to fourth active regions 102, 104, 106 and 108, respectively. Top surfaces of the first to fourth fin spacers 182, 184, 186 and 188 may be higher than top surfaces of the first to fourth active regions 102, 104, 106 and 108, respectively, and thus first to fourth recesses (not shown) may be defined on the first to fourth active regions 102, 104, 106 and 108, respectively, by the first to fourth fin spacers 182, 184, 186 and 188. The first to fourth fin spacers 182, 184, 186 and 188 may include a nitride, e.g., silicon nitride.

The first to fourth source/drain layers 202, 204, 206 and 208 may fill the first to fourth recesses, respectively, on the first to fourth active regions 102, 104, 106 and 108, and may protrude from the first to fourth fin spacers 182, 184, 186 and 188, respectively, on the sidewalls of the first to fourth active regions 102, 104, 106 and 108. The first to fourth source/drain layers 202, 204, 206 and 208 may be grown not only in a vertical direction but also in a horizontal direction, and may have a cross-section taken along the second direction of which a shape may be pentagon or hexagon.

In example embodiments, each of the first and second source/drain layers 202 and 204 may be a single crystalline silicon-germanium layer doped with p-type impurities, and may serve as a source/drain region of a PMOS transistor. Each of the third and fourth source/drain layers 206 and 208 may be a single crystalline silicon carbide layer doped with n-type impurities or a single crystalline silicon layer doped with n-type impurities, and may serve as a source/drain region of an NMOS transistor.

In example embodiments, each of the first to eighth gate structures 261, 262, 263, 264, 265, 266, 267 and 268 may extend in the second direction. First to eighth gate spacers 171, 172, 173, 174, 175, 176, 177 and 178 may be formed on both sidewalls of the first to eighth gate structures 261, 262, 263, 264, 265, 266, 267 and 268, respectively. The first to eighth gate spacers 171, 172, 173, 174, 175, 176, 177 and 178 may include a nitride, e.g., silicon nitride.

Each of the first to eighth gate structures 261, 262, 263, 264, 265, 266, 267 and 268 may include an interface layer pattern, a gate insulation layer pattern and a gate electrode sequentially stacked. The interface layer pattern may include an oxide, e.g., silicon oxide, the gate insulation layer pattern may include a metal oxide having a relatively high dielectric constant, e.g., hafnium oxide, tantalum oxide and/or zirconium oxide, and the gate electrode may include a metal having a relatively low resistance, e.g., aluminum, copper, tantalum, or a metal nitride thereof.

The interface layer pattern may be formed only on the first to fourth active regions 102, 104, 106 and 108, or may be also formed on the isolation layer pattern 120 adjacent thereto. In example embodiments, the interface layer pattern may not be formed, and in this case, each of the first to eighth gate structures 261, 262, 263, 264, 265, 266, 267 and 268 may include only the gate insulation layer pattern and the gate electrode.

Particularly, the first gate structure 261 may include a first interface layer pattern 231, a first gate insulation layer pattern 241 and a first gate electrode 251 sequentially stacked, the second gate structure 262 may include a second interface layer pattern 232, a second gate insulation layer pattern 242 and a second gate electrode 252 sequentially stacked, the third gate structure 263 may include a third interface layer pattern 233, a third gate insulation layer pattern 243 and a third gate electrode 253 sequentially stacked, the fourth gate structure 264 may include a fourth interface layer pattern 234, a fourth gate insulation layer pattern 244 and a fourth gate electrode 254 sequentially stacked, the fifth gate structure 265 may include a fifth interface layer pattern 235, a fifth gate insulation layer pattern 245 and a fifth gate electrode 255 sequentially stacked, and the sixth gate structure 266 may include a sixth interface layer pattern 236, a sixth gate insulation layer pattern 246 and a sixth gate electrode 256 sequentially stacked.

Additionally, the seventh gate structure 267 may include a seventh interface layer pattern (not shown), a seventh gate insulation layer pattern 247 and a seventh gate electrode 257 sequentially stacked, and the eighth gate structure 268 may include an eighth interface layer pattern (not shown), an eighth gate insulation layer pattern 248 and an eighth gate electrode 258 sequentially stacked.

The first gate structure 261 may be formed on the first, second and fourth active regions 102, 104 and 108, and a portion of the isolation layer pattern 120 adjacent thereto, the second gate structure 262 may be formed on the first, second and fourth active regions 102, 104 and 108, and a portion of the isolation layer pattern 120 adjacent thereto, the third gate structure 263 may be formed on the first, second and third active regions 102, 104 and 106, and a portion of the isolation layer pattern 120 adjacent thereto, and the fourth gate structure 264 may be formed on the first, second and third active regions 102, 104 and 106, and a portion of the isolation layer pattern 120 adjacent thereto.

The fifth gate structure 265 may be formed on the third active region 106 and a portion of the isolation layer pattern 120 adjacent thereto, the sixth gate structure 266 may be formed on the third active region 106 and a portion of the isolation layer pattern 120 adjacent thereto, the seventh gate structure 267 may be formed on the fourth active region 108 and a portion of the isolation layer pattern 120 adjacent thereto, and the eighth gate structure 268 may be formed on the fourth active region 108, and a portion of the isolation layer pattern 120 adjacent thereto.

In example embodiments, with respect to the center C of the unit cell, the second and third gate structures 262 and 263 may be in point symmetry, the first and fourth gate structures 261 and 264 may be in point symmetry, the sixth and seventh gate structures 266 and 267 may be in point symmetry, and the fifth and eighth gate structures 265 and 268 may be in point symmetry. That is, the first, second, seventh and eighth gate structures 261, 262, 267 and 268 may be in point symmetry with the fourth, third, sixth and fifth gate structures 264, 263, 266 and 265, respectively.

The third gate structure 263 and the first source/drain layer 202 adjacent thereto may form a first pull-up transistor PU1, the second gate structure 262 and the second source/drain layer 204 adjacent thereto may form a second pull-up transistor PU2, the third and sixth gate structures 263 and 266 and the third source/drain layer 206 adjacent thereto may form a first pull-down transistor PD1, and the second and seventh gate structures 262 and 267 and the fourth source/drain layer 208 adjacent thereto may form a second pull-down transistor PD2.

The fifth gate structure 265 and the third source/drain layer 206 adjacent thereto may form a first pass-gate transistor PG1, the first gate structure 261 and the fourth source/drain layer 208 adjacent thereto may form a second pass-gate transistor PG2, the fourth gate structure 264 and the third source/drain layer 206 adjacent thereto may form a third pass-gate transistor PG3, and the eighth gate structure 268 and the fourth source/drain layer 208 adjacent thereto may form a fourth pass-gate transistor PG4.

The first and second pull-up transistors PU1 and PU2 may be PMOS transistors, and the first and second pull-down transistors PD1 and PD2, and the first to fourth pass-gate transistors PG1, PG2, PG3 and PG4 may be NMOS transistors.

In example embodiments, owing to the symmetries of the first to fourth active regions 102, 104, 106 and 108 and the first to eighth gate structures 261, 262, 263, 264, 265, 266, 267 and 268, with respect to the center C of the unit cell, the first and second pull-up transistors PU1 and PU2 may be in point symmetry, the first and second pull-down transistors PD1 and PD2 may be in point symmetry, the first and fourth pass-gate transistors PG1 and PG2 may be in point symmetry, and the second and third pass-gate transistors PG1 and PG2 may be in point symmetry.

A first insulating interlayer 210 covering sidewalls of the first to eighth gate structures 261, 262, 263, 264, 265, 266, 267 and 268, and the first to eighth gate spacers 171, 172, 173, 174, 175, 176, 177 and 178, the first to fourth fin spacers 182, 184, 186 and 188, and the first to fourth source/drain layers 202, 204, 206 and 208 may be formed on the substrate 100 and the isolation layer pattern 120. The first insulating interlayer 210 may include an oxide, e.g., silicon oxide.

A second insulating interlayer 280 may be formed on the first insulating interlayer 210, 210, the first to eighth gate structures 261, 262, 263, 264, 265, 266, 267 and 268, and the first to eighth gate spacers 171, 172, 173, 174, 175, 176, 177 and 178. The second insulating interlayer 280 may include an oxide, e.g., silicon oxide.

The first to eighteenth contact plugs 351, 352, 353, 354, 357, 358, 361, 362, 371, 372, 381, 382, 385, 386, 391, 392, 393 and 394 may be formed through the second insulating interlayer 280 and/or the first insulating interlayer 210, and may contact underlying structures.

Particularly, the first contact plug 351 may include a first portion extending in the first direction, and a second portion being connected to the first portion and extending in the second direction. The first contact plug 351 may contact a top surface of the second gate structure 262, a top surface of the second gate spacer 172, a portion of the first source/drain layer 202 adjacent to the second gate structure 262 and the second gate spacer 172 in the first direction, a portion of the third source/drain layer 206 between the fifth and sixth gate structures 265 and 266, and a portion of the isolation layer pattern 120 adjacent to the portion of the third source/drain layer 206 in the second direction. First and third metal silicide patterns 342 and 346 may be formed on the portions of the first and third source/drain layers 202 and 206, respectively.

The second contact plug 352 may include a first portion extending in the first direction, and a second portion being connected to the first portion and extending in the second direction. The second contact plug 352 may contact a top surface of the third gate structure 263, a top surface of the third gate spacer 173, a portion of the second source/drain layer 204 adjacent to the third gate structure 263 and the third gate spacer 173 in the first direction, a portion of the fourth source/drain layer 208 between the seventh and eighth gate structures 267 and 268, and a portion of the isolation layer pattern 120 adjacent to the portion of the fourth source/drain layer 208 in the second direction. Second and fourth metal silicide patterns 344 and 348 may be formed on the portions of the second and fourth source/drain layers 204 and 208, respectively.

The third contact plug 353 may extend in the second direction, and may contact a portion of the third source/drain layer 206 between the third and fourth gate structures 263 and 264, and a portion of the isolation layer pattern 120 adjacent to the portion of the third source/drain layer 206 in the second direction. The fourth contact plug 354 may extend in the second direction, and may contact a portion of the fourth source/drain layer 208 between the first and second gate structures 261 and 262, and a portion of the isolation layer pattern 120 adjacent to the portion of the fourth source/drain layer 208 in the second direction. The third and fourth metal silicide patterns 346 and 348 may be formed on the portions of the third and fourth source/drain layers 206 and 208, respectively.

As the first and third contact plugs 351 and 353 may be formed, the source/drain regions of the first pull-up transistor PU1, the first pull-down transistor PD1, the first pass-gate transistor PG1, and the third pass-gate transistor PG3 may be electrically connected to form a first node NODE1. As the second and fourth contact plugs 352 and 354 may be formed, source/drain regions of the second pull-up transistor PU2, the second pull-down transistor PD2, the second pass-gate transistor PG2, and the fourth pass-gate transistor PG4 may be electrically connected to form a second node NODE2.

The fifth contact plug 357 may extend in the first direction, and may contact top surfaces of the third and sixth gate structures 263 and 266, top surfaces of the third and sixth gate spacers 173 and 176, and a portion of the isolation layer pattern 120 adjacent to the third and sixth gate structures 263 and 266 and the third and sixth gate spacers 173 and 176 in the first direction. The sixth contact plug 358 may extend in the first direction, and may contact top surfaces of the second and seventh gate structures 262 and 267, top surfaces of the second and seventh gate spacers 172 and 177, and a portion of the isolation layer pattern 120 adjacent to the second and seventh gate structures 262 and 267 and the second and seventh gate spacers 172 and 177 in the first direction.

As the fifth contact plug 357 may be formed, the third and sixth gate structures 263 and 266 may be electrically connected to each other to serve as a single gate structure, and as the sixth contact plug 358 may be formed, the second and seventh gate structures 262 and 267 may be electrically connected to each other to serve as a single gate structure.

The seventh contact plug 361 may contact a portion of the second source/drain layer 204 between the first and second gate structures 261 and 262, and the eighth contact plug 362 may contact a portion of the second source/drain layer 204 between the third and fourth gate structures 263 and 264. The second metal silicide pattern 344 may be formed on the portions of the second source/drain layer 204.

The ninth contact plug 371 may contact a portion of the third source/drain layer 206 between the third and sixth gate structures 263 and 266, and the tenth contact plug 372 may contact a portion of the fourth source/drain layer 208 between the second and seventh gate structures 262 and 267. The third and fourth metal silicide patterns 346 and 348 may be formed on the portions of the third and fourth source/drain layers 206 and 208, respectively.

The eleventh contact plug 381 may contact a portion of the third source/drain layer 206 adjacent to the fifth gate structure 265 in the first direction, and the twelfth contact plug 382 may contact a portion of the fourth source/drain layer 208 adjacent to the first gate structure 261 in the first direction. The thirteenth contact plug 385 may contact a portion of the third source/drain layer 206 adjacent to the fourth gate structure 264 in the first direction, and the fourteenth contact plug 386 may contact a portion of the fourth source/drain layer 208 adjacent to the eighth gate structure 268 in the first direction. The third and fourth metal silicide patterns 346 and 348 may be formed on the portions of the third and fourth source/drain layers 206 and 208, respectively.

The fifteenth to eighteenth contact plugs 391, 392, 393 and 394 may contact top surfaces of the fifth, first, fourth and eighth gate structures 265, 261, 264 and 268, respectively.

In example embodiments, with respect to the center C of the unit cell, the first and second contact plugs 351 and 352, the third and fourth contact plugs 353 and 354, the fifth and sixth contact plugs 357 and 358, the seventh and eighth contact plugs 361 and 362, the ninth and tenth contact plugs 371 and 372, the eleventh and fourteenth contact plugs 381 and 386, the twelfth and thirteenth contact plugs 322 and 325, the fifteenth and eighteenth contact plugs 331 and 334, and the sixteenth and seventeenth contact plugs 332 and 333 may be in point symmetry, respectively.

Each of the first to eighteenth contact plugs 351, 352, 353, 354, 357, 358, 361, 362, 371, 372, 381, 382, 385, 386, 391, 392, 393 and 394 may include a metal, e.g., tungsten, titanium, tantalum, copper and/or aluminum, or a metal nitride, e.g., tungsten nitride, titanium nitride and/or tantalum nitride, and in example embodiments, may include a metal pattern (not shown) and a barrier layer pattern (not shown) surrounding a sidewall and a bottom of the metal pattern.

A third insulating interlayer 400 may be formed on the second insulating interlayer 280, and the first to eighteenth contact plugs 351, 352, 353, 354, 357, 358, 361, 362, 371, 372, 381, 382, 385, 386, 391, 392, 393 and 394. The first to sixteenth vias 411, 412, 413, 414, 421, 422, 431, 432, 441, 442, 445, 446, 451, 452, 453 and 454 may be formed through the third insulating interlayer 400, and may contact underlying contact plugs.

Particularly, the first to fourth vias 411, 412, 413 and 414 may contact top surfaces of the first to fourth contact plugs 351, 352, 353 and 354, respectively, and the fifth to sixteenth vias 421, 422, 431, 432, 441, 442, 445, 446, 451, 452, 453 and 454 may contact top surfaces of the seventh to eighteenth contact plugs 357, 358, 361, 362, 371, 372, 381, 382, 385, 386, 391, 392, 393 and 394, respectively.

The first to sixteenth vias 411, 412, 413, 414, 421, 422, 431, 432, 441, 442, 445, 446, 451, 452, 453 and 454 may also have symmetry. Particularly, the first and second vias 411 and 412, the third and fourth vias 413 and 414, the fifth and sixth vias 421 and 422, the seventh and eighth vias 431 and 432, the ninth and twelfth vias 441 and 446, the tenth and eleventh vias 442 and 445, the thirteenth and sixteenth vias 451 and 454, and the fourteenth and fifteenth vias 452 and 453 may be in point symmetry, respectively, with respect to the center C of the unit cell.

Each of the first to sixteenth vias 411, 412, 413, 414, 421, 422, 431, 432, 441, 442, 445, 446, 451, 452, 453 and 454 may include a metal, e.g., tungsten, titanium, tantalum, copper, and/or aluminum, or a metal nitride, e.g., tungsten nitride, titanium nitride and/or tantalum nitride, and in example embodiments, may include a metal pattern (not shown) and a barrier layer pattern (not shown) surrounding a sidewall and a bottom of the metal pattern.

A fourth insulating interlayer 460 may be formed on the third insulating interlayer 400, and the first to sixteenth vias 411, 412, 413, 414, 421, 422, 431, 432, 441, 442, 445, 446, 451, 452, 453 and 454. The first to thirteenth conductive lines 471, 472, 481, 482, 483, 491, 492, 495, 496, 501, 502, 503 and 504 may be formed through the fourth insulating interlayer 460, and may contact underlying vias.

Particularly, the first conductive line 471 may extend in the first direction, and may contact top surfaces of the first and third vias 411 and 413, and the second conductive line 472 may extend in the first direction, and may contact top surfaces of the second and fourth vias 412 and 414. The third conductive line 481 may extend in the first direction, and may contact top surfaces of the fifth and sixth vias 421 and 422, the fourth conductive line 482 may extend in the first direction, and may contact a top surface of the seventh via 431, and the fifth conductive line 483 may extend in the first direction, and may contact a top surface of the eighth via 432.

The sixth conductive line 491 may extend in the first direction, and may contact a top surface of the ninth via 441, and the seventh conductive line 492 may extend in the first direction, and may contact a top surface of the tenth via 442. The eighth conductive line 495 may extend in the first direction, and may contact a top surface of the eleventh via 445, and the ninth conductive line 496 may extend in the first direction, and may contact a top surface of the twelfth via 446.

The tenth to thirteenth conductive lines 501, 502, 503 and 504 may extend in the first direction, and may contact top surfaces of the thirteenth to sixteenth vias 451, 452, 453 and 454, respectively.

Each of the first to thirteenth conductive lines 471, 472, 481, 482, 483, 491, 492, 495, 496, 501, 502, 503 and 504 may include a metal, e.g., tungsten, titanium, tantalum, copper and/or aluminum, or a metal nitride, e.g., tungsten nitride, titanium nitride and/or tantalum nitride, and in example embodiments, may include a metal pattern (not shown) and a barrier layer pattern (not shown) surrounding a sidewall and a bottom of the metal pattern.

As illustrated above, all of the first to thirteenth conductive lines 471, 472, 481, 482, 483, 491, 492, 495, 496, 501, 502, 503 and 504 may extend in the first direction, and thus may be easily formed in the fourth insulating interlayer 460.

The first to thirteenth conductive lines 471, 472, 481, 482, 483, 491, 492, 495, 496, 501, 502, 503 and 504 may also have symmetry. Particularly, the first and second conductive lines 471 and 472, the fourth and fifth conductive lines 482 and 483, the sixth and ninth conductive lines 491 and 496, the seventh and eighth conductive lines 492 and 495, the tenth and thirteenth conductive lines 501 and 504, and the eleventh and twelfth conductive lines 502 and 503 may be in point symmetry, respectively, with respect to the center C of the unit cell. All of the first to thirteenth conductive lines 471, 472, 481, 482, 483, 491, 492, 495, 496, 501, 502, 503 and 504 may extend in the first direction, and thus some of the first to thirteenth conductive lines 471, 472, 481, 482, 483, 491, 492, 495, 496, 501, 502, 503 and 504 may be in line symmetry with each other.

The first conductive line 471 may serve as a first connection line for connecting the first and third contact plugs 351 and 353 with each other through the first and third vias 411 and 413, and the second conductive line 472 may serve as a second connection line for connecting the second and fourth contact plugs 352 and 354 with each other through the second and fourth vias 412 and 414.

The third conductive line 481 may serve as a power line VDD of the dual-port SRAM device, and each of the fourth and fifth conductive lines 482 and 483 may serve as a ground line VSS thereof. The sixth and seventh conductive lines 491 and 492 may serve as a first bit line BLT1 and a first complementary bit line BLC1, respectively, and the eighth and ninth conductive lines 495 and 496 may serve as a second bit line BLT2 and a second complementary bit line BLC2, respectively.

A fifth insulating interlayer 510 may be formed on the fourth insulating interlayer 460, and the first to thirteenth conductive lines 471, 472, 481, 482, 483, 491, 492, 495, 496, 501, 502, 503 and 504. The seventeenth to twentieth vias 521, 522, 523 and 524 may be formed through the fifth insulating interlayer 510, and may contact underlying conductive lines.

Particularly, the seventeenth to twentieth vias 521, 522, 523 and 524 may contact top surfaces of the tenth to thirteenth conductive lines 501, 502, 503 and 504, respectively, and may also have symmetry. Particularly, the seventeenth and twentieth vias 521 and 524, and the eighteenth and nineteenth vias 522 and 523 may be in point symmetry, respectively, with respect to the center C of the unit cell.

Each of the seventeenth to twentieth vias 521, 522, 523 and 524 may include a metal, e.g., tungsten, titanium, tantalum, copper and/or aluminum, or a metal nitride, e.g., tungsten nitride, titanium nitride and/or tantalum nitride, and in example embodiments, may include a metal pattern (not shown) and a barrier layer pattern (not shown) surrounding a sidewall and a bottom of the metal pattern.

A sixth insulating interlayer 530 may be formed on the fifth insulating interlayer 510, and top surfaces of the seventeenth to twentieth vias 521, 522, 523 and 524. The fourteenth and fifteenth conductive lines 542 and 544 may be formed through the sixth insulating interlayer 530, and may contact underlying vias.

Particularly, the fourteenth conductive line 542 may extend in the second direction, and may contact top surfaces of the seventeenth and eighteenth vias 521 and 522, and the fifteenth conductive line 544 may extend in the second direction, and may contact top surfaces of the nineteenth and twentieth vias 523 and 524.

The fourteenth and fifteenth conductive lines 542 and 544 may be in line symmetry with respect to an imaginary line extending in the second direction and crossing the center C of the unit cell.

Each of the fourteenth and fifteenth conductive lines 542 and 544 may include a metal, e.g., tungsten, titanium, tantalum, copper and/or aluminum, or a metal nitride, e.g., tungsten nitride, titanium nitride and/or tantalum nitride, and in example embodiments, may include a metal pattern (not shown) and a barrier layer pattern (not shown) surrounding a sidewall and a bottom of the metal pattern.

The fourteenth and fifteenth conductive lines 542 and 544 may serve as first and second word lines WL1 and WL2, respectively, of the dual-port SRAM device. That is, the fourteenth conductive line 542 serving as the first word line WL1 may contact a top surface of the fifth gate structure 265 of the first pass-gate transistor PG1 and a top surface of the first gate structure 261 of the second pass-gate transistor PG2, and thus the first and second pass-gate transistors PG1 and PG2 may form a first pair. Additionally, the fifteenth conductive line 544 serving as the second word line WL2 may contact a top surface of the fourth gate structure 264 of the third pass-gate transistor PG3 and a top surface of the eighth gate structure 268 of the fourth pass-gate transistor PG4, and thus the third and fourth pass-gate transistors PG3 and PG4 may form a second pair.

All of the first to thirteenth conductive lines 471, 472, 481, 482, 483, 491, 492, 495, 496, 501, 502, 503 and 504 serving as the power line, the ground line and the bit line of the dual-port SRAM device may be formed in the fourth insulating interlayer 460, and thus only the fourteenth and fifteenth conductive lines 542 and 544 serving as the word line may be formed in the sixth insulating interlayer 530. Accordingly, each of the fourteenth and fifteenth conductive lines 542 and 544 may have a large width in the first direction so as to have a low resistance. Particularly, only four active regions 102, 104, 106 and 108 may be formed in the unit cell in the first direction, and thus each of the fourteenth and fifteenth conductive lines 542 and 544 extending in the first direction may have a short length so as to have a lower resistance.

In the dual-port SRAM device, a current flowing from the first pass-gate transistor PG1 to the first node NODE1 may pass through the third source/drain layer 206 and the first contact plug 351, and a current flowing from the second pass-gate transistor PG2 to the second node NODE2 may pass through the fourth source/drain layer 208, the fourth contact plug 354, the fourth via 414 and the second conductive line 472. Thus, currents flowing from the first pair of pass-gate transistors PG1 and PG2 to the first and second nodes NODE1 and NODE 2, respectively, may pass through the contact plug, via and/or the conductive line instead of the gate structure, so as to have a value substantially the same as or similar to each other.

Likewise, a current flowing from the third pass-gate transistor PG3 to the first node NODE1 may pass through the third source/drain layer 206, the third contact plug 353, the first via 411 and the first conductive line 417, and a current flowing from the fourth pass-gate transistor PG4 to the second node NODE2 may pass through the fourth source/drain layer 208 and the fourth contact plug 354. Thus, currents flowing from the second pair of pass-gate transistors PG3 and PG4 to the first and second nodes NODE1 and NODE 2, respectively, may pass through the contact plug, via and/or the conductive line instead of the gate structure, so as to have a value substantially the same as or similar to each other.

FIGS. 11 to 48 are plan views and cross-sectional views illustrate stages of a method of manufacturing a dual-port SRAM device in accordance with example embodiments. Particularly, FIGS. 11, 14, 18, 21, 24, 27, 30, 32, 36 and 42 are plan views, and FIGS. 12-13, 15-17, 19-20, 22-23, 25-26, 28-29, 31, 33-35, 37-41 and 43-48 are cross-sectional views.

Figure 16:
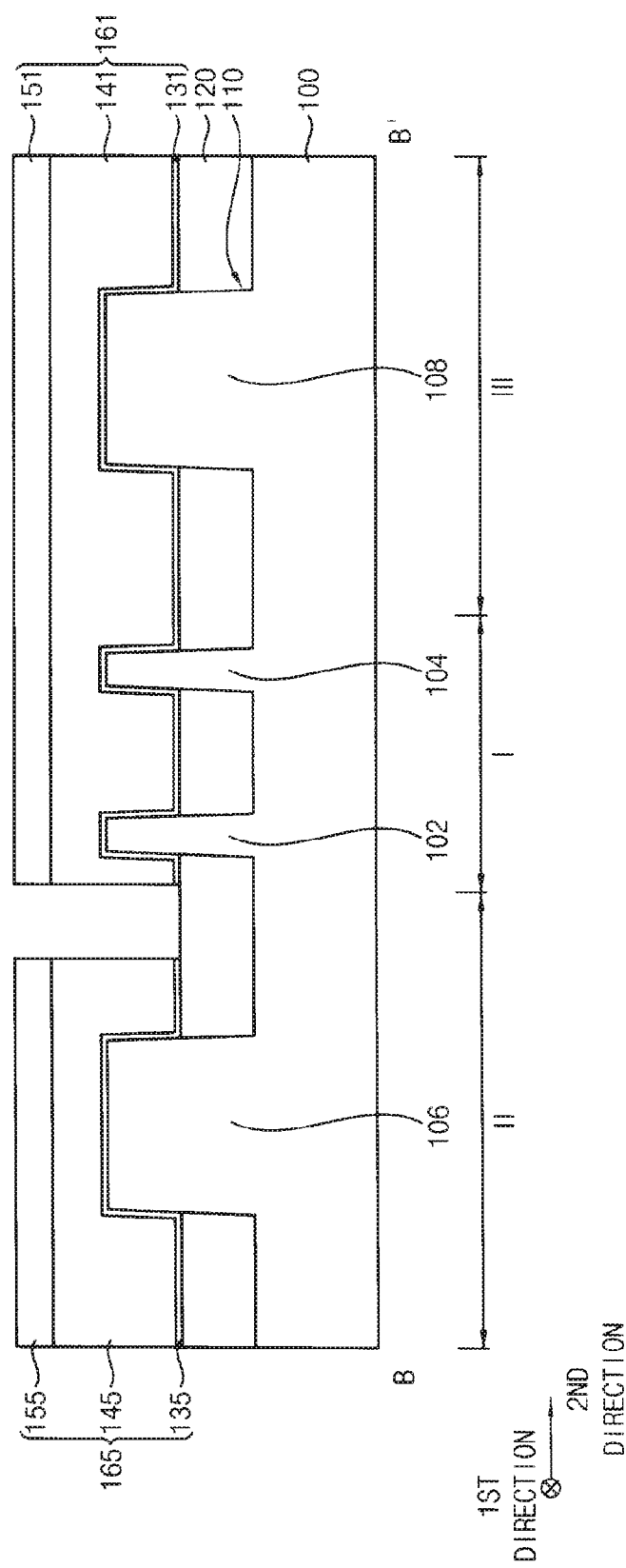
Figure 17:
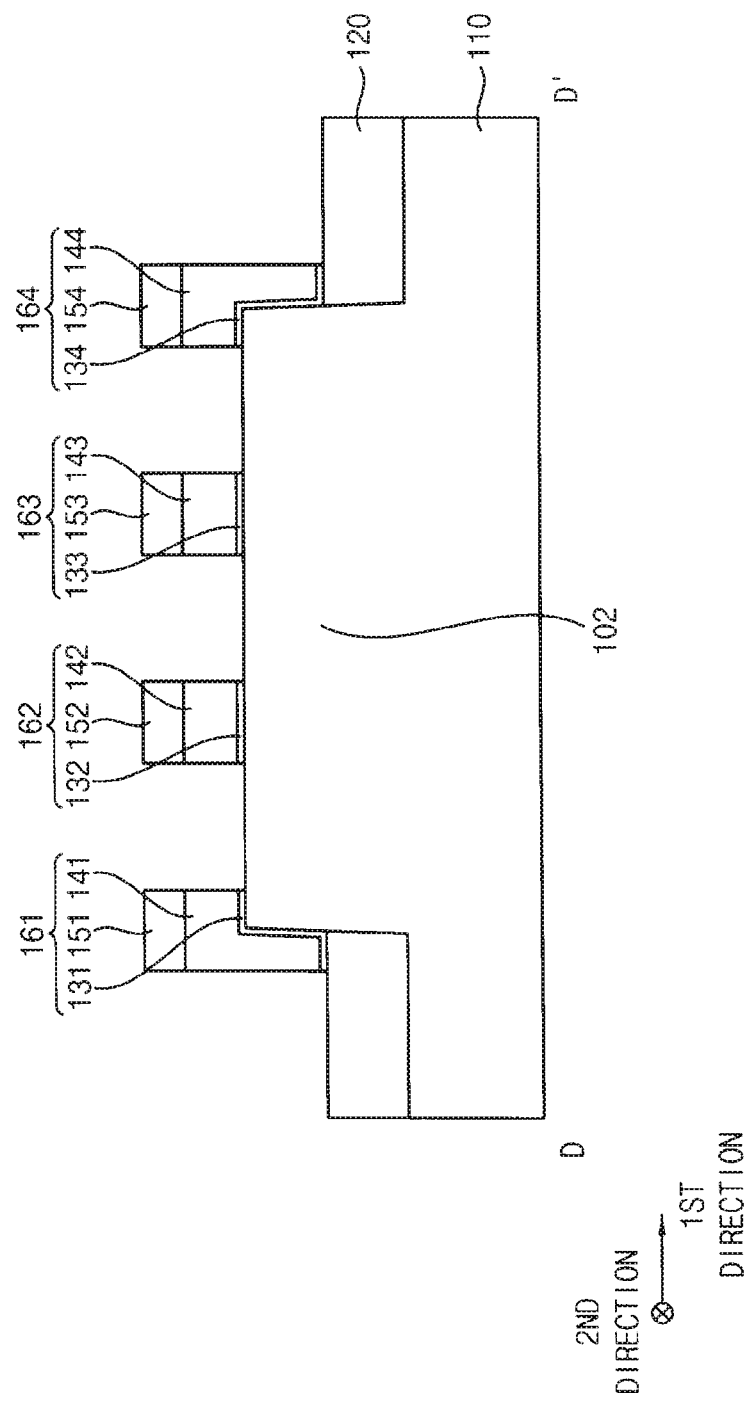
Figure 34:
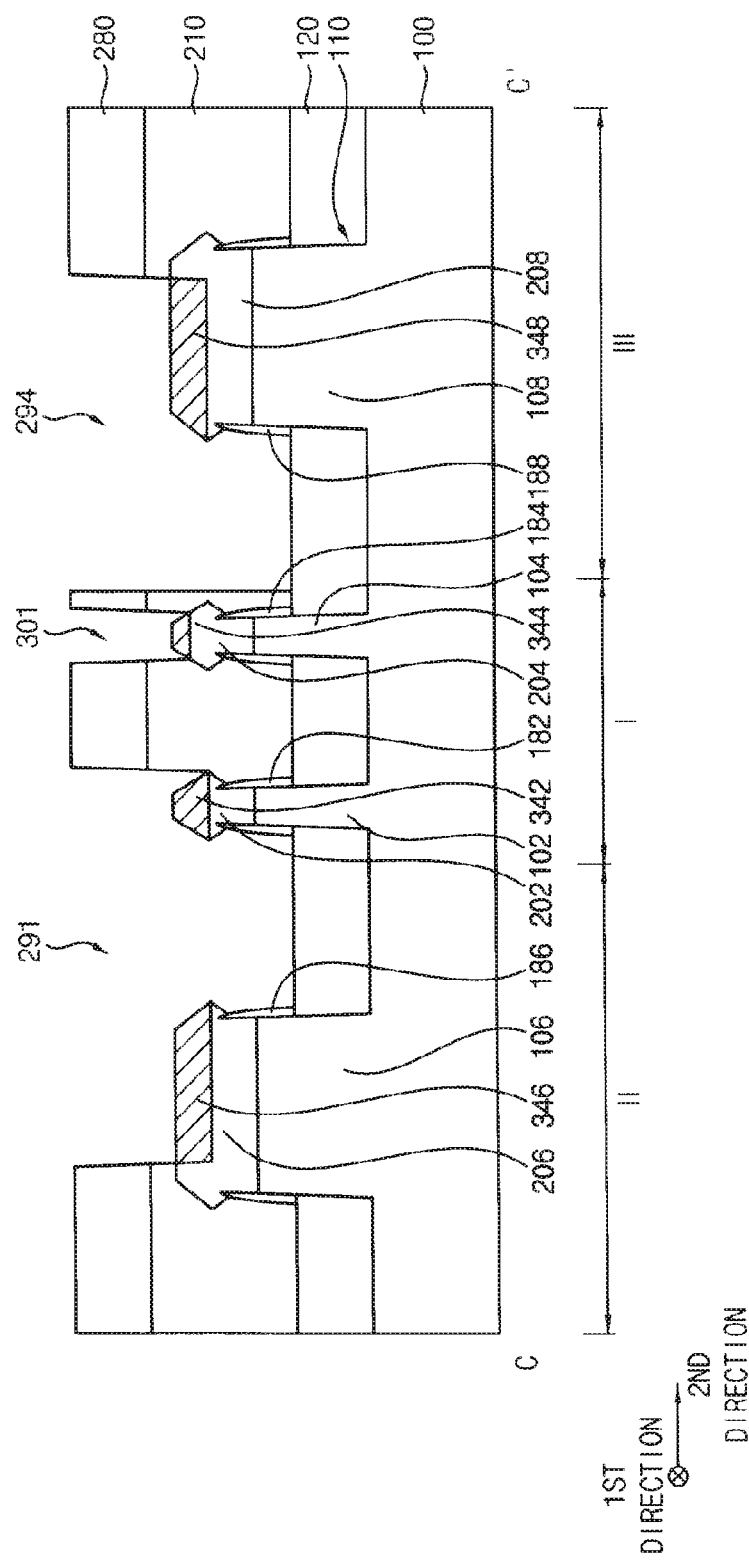
Figure 35:
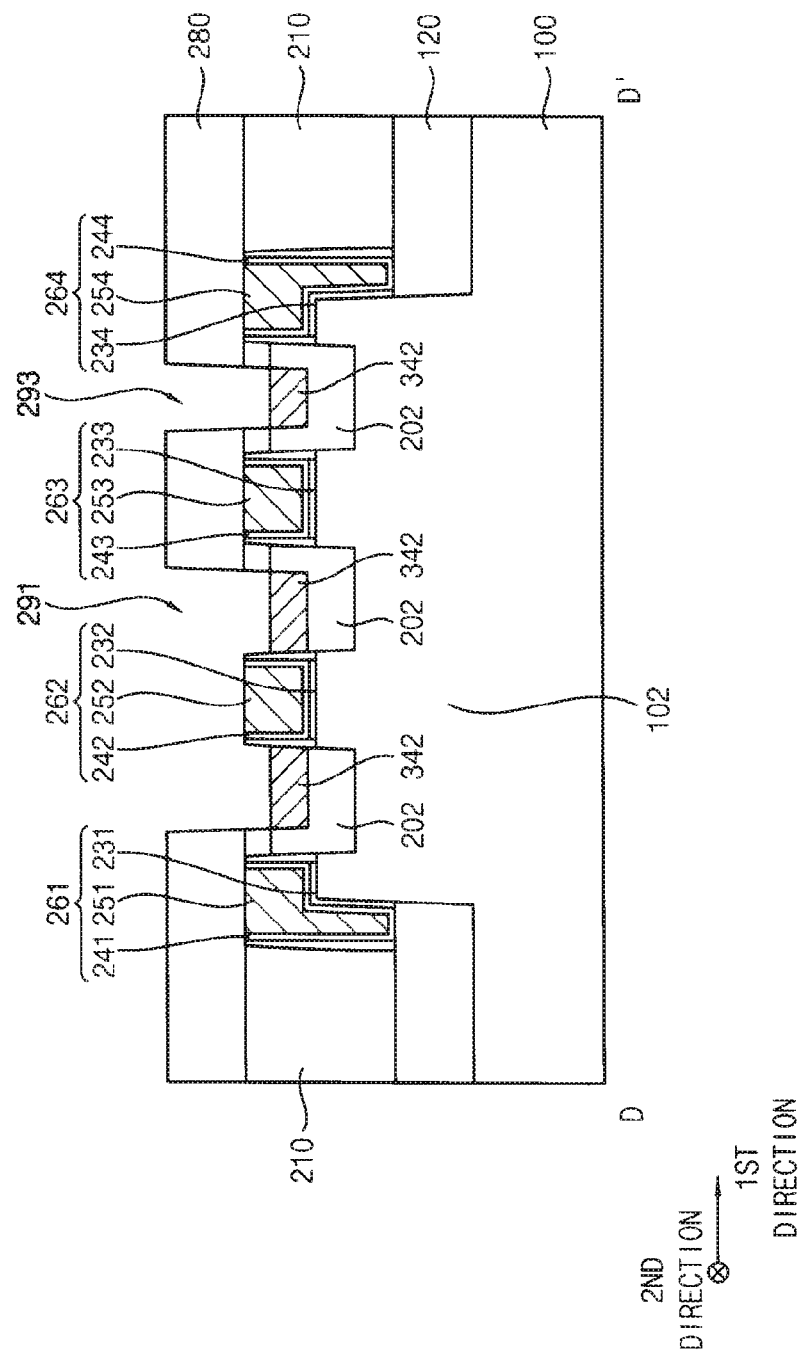
Figure 36:
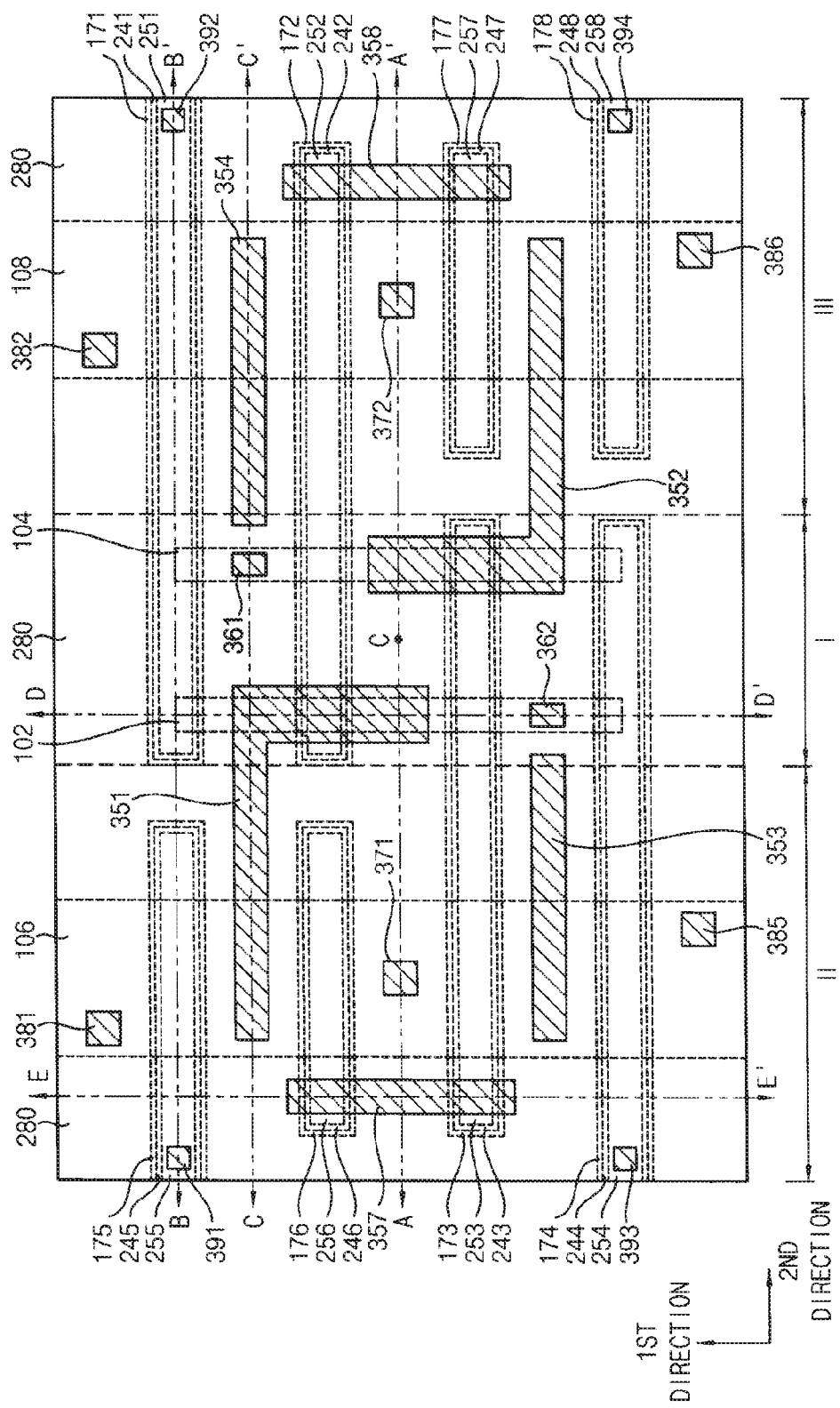
Figure 37:
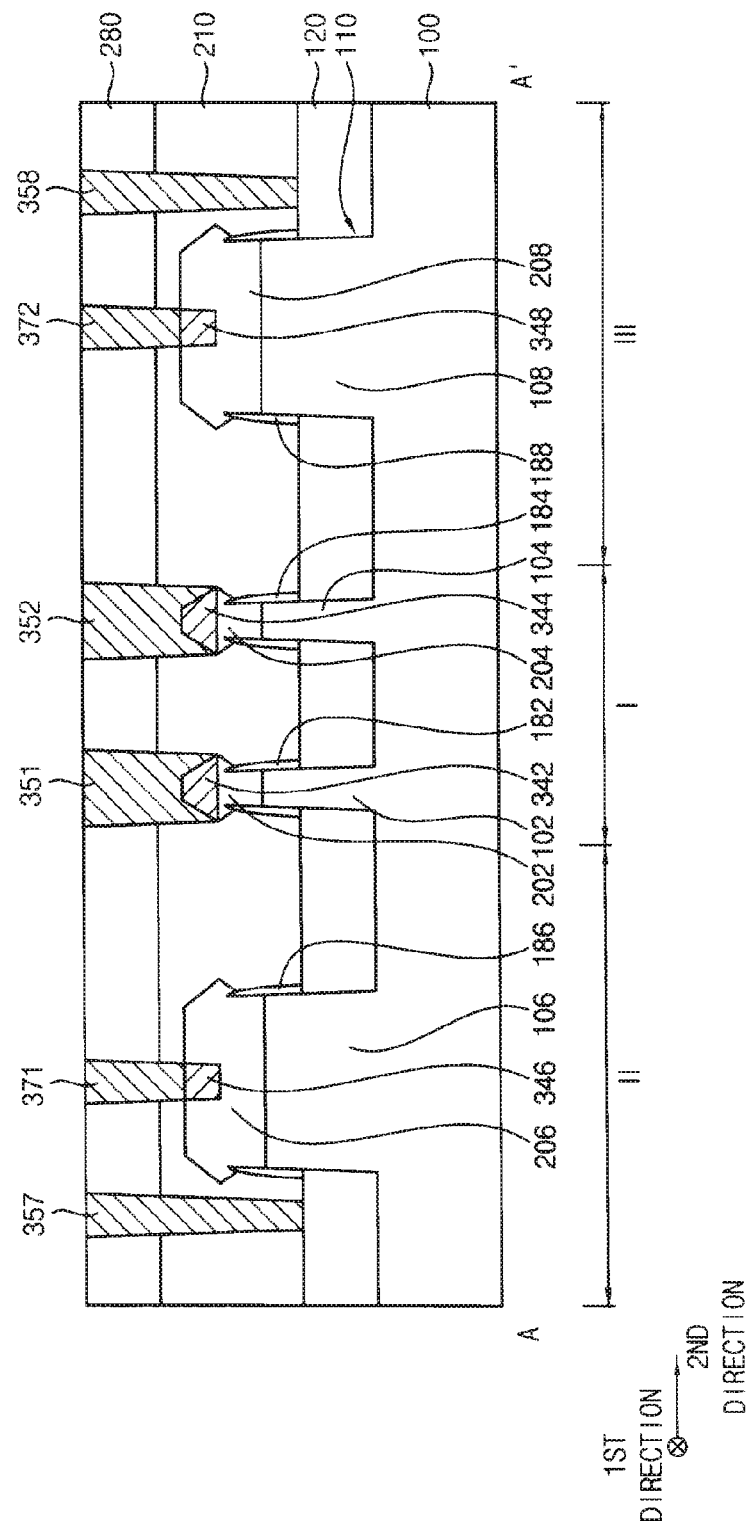
Figure 38:
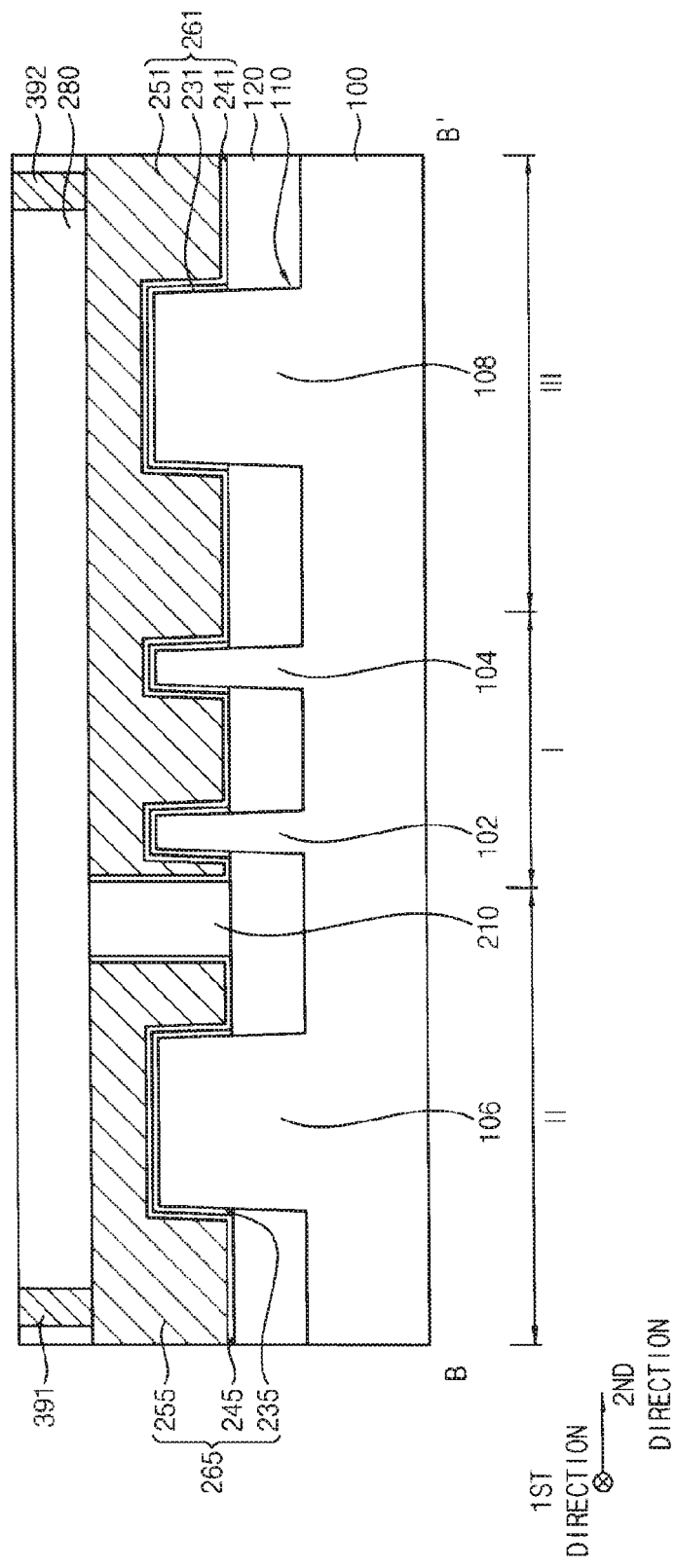
Figure 39:
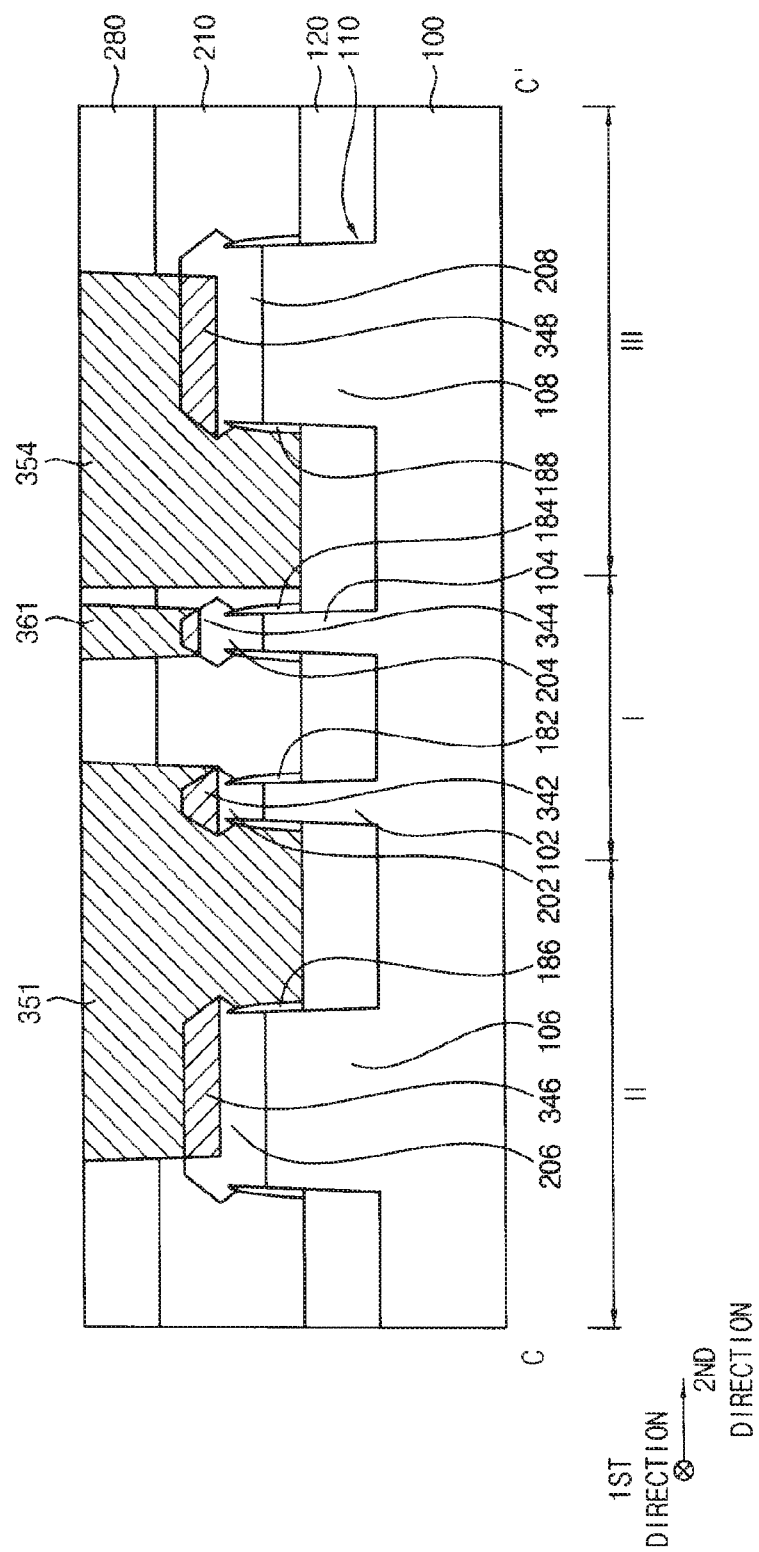
Figure 40:
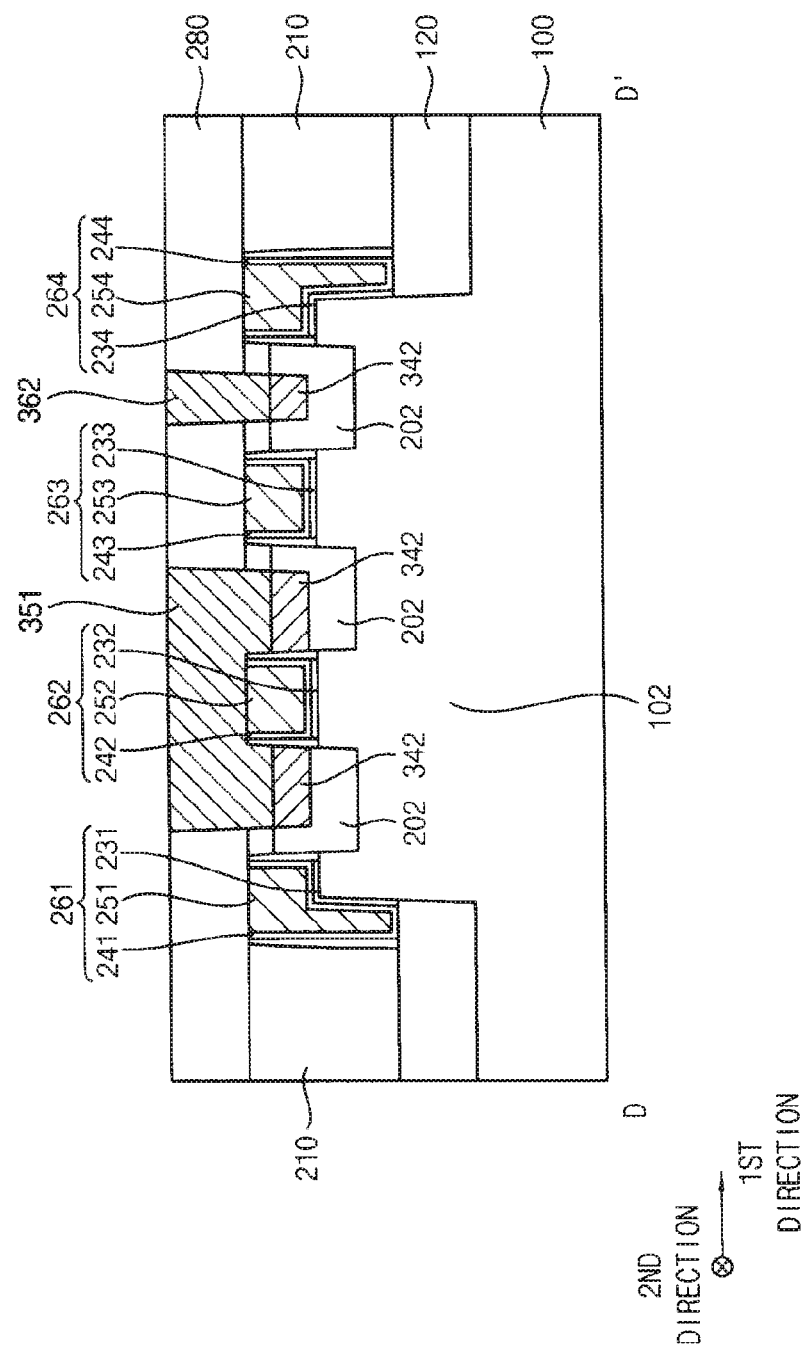
Figure 41:
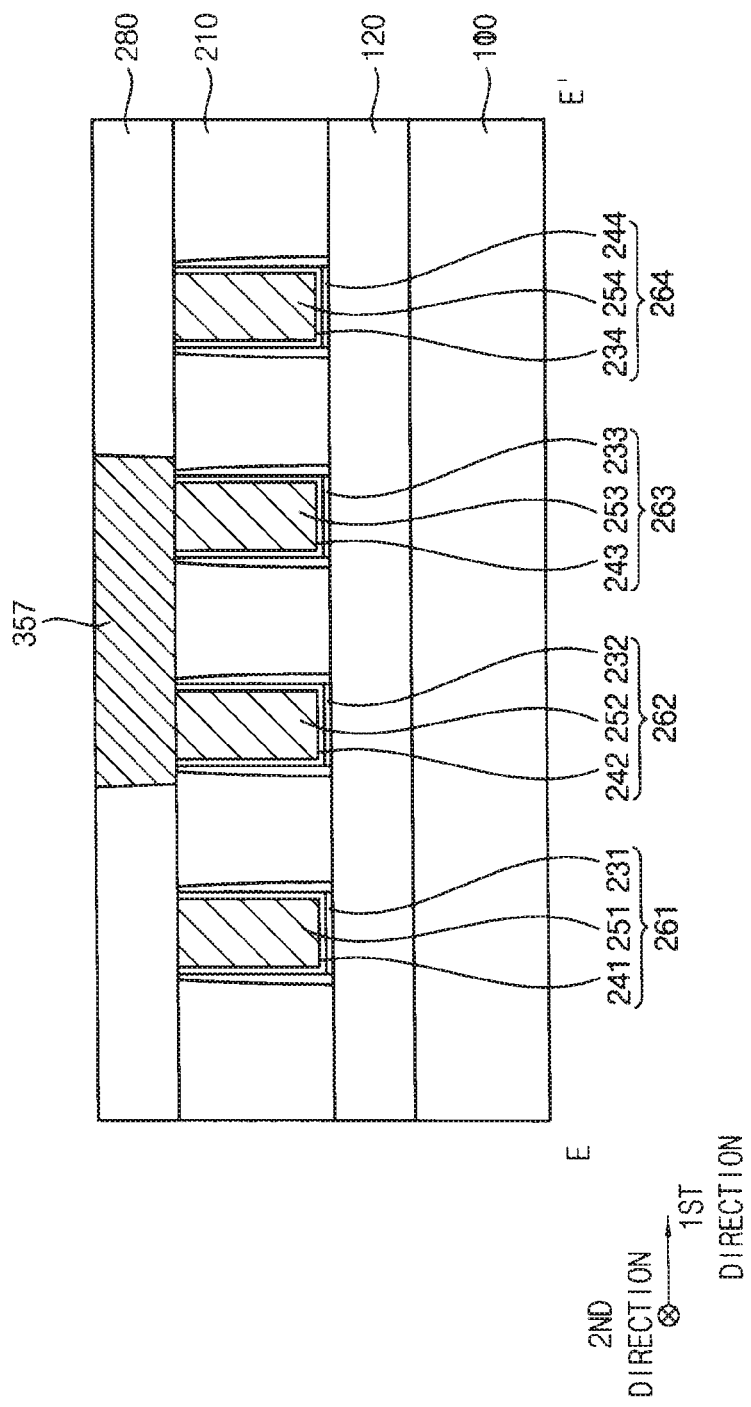
Figure 42:
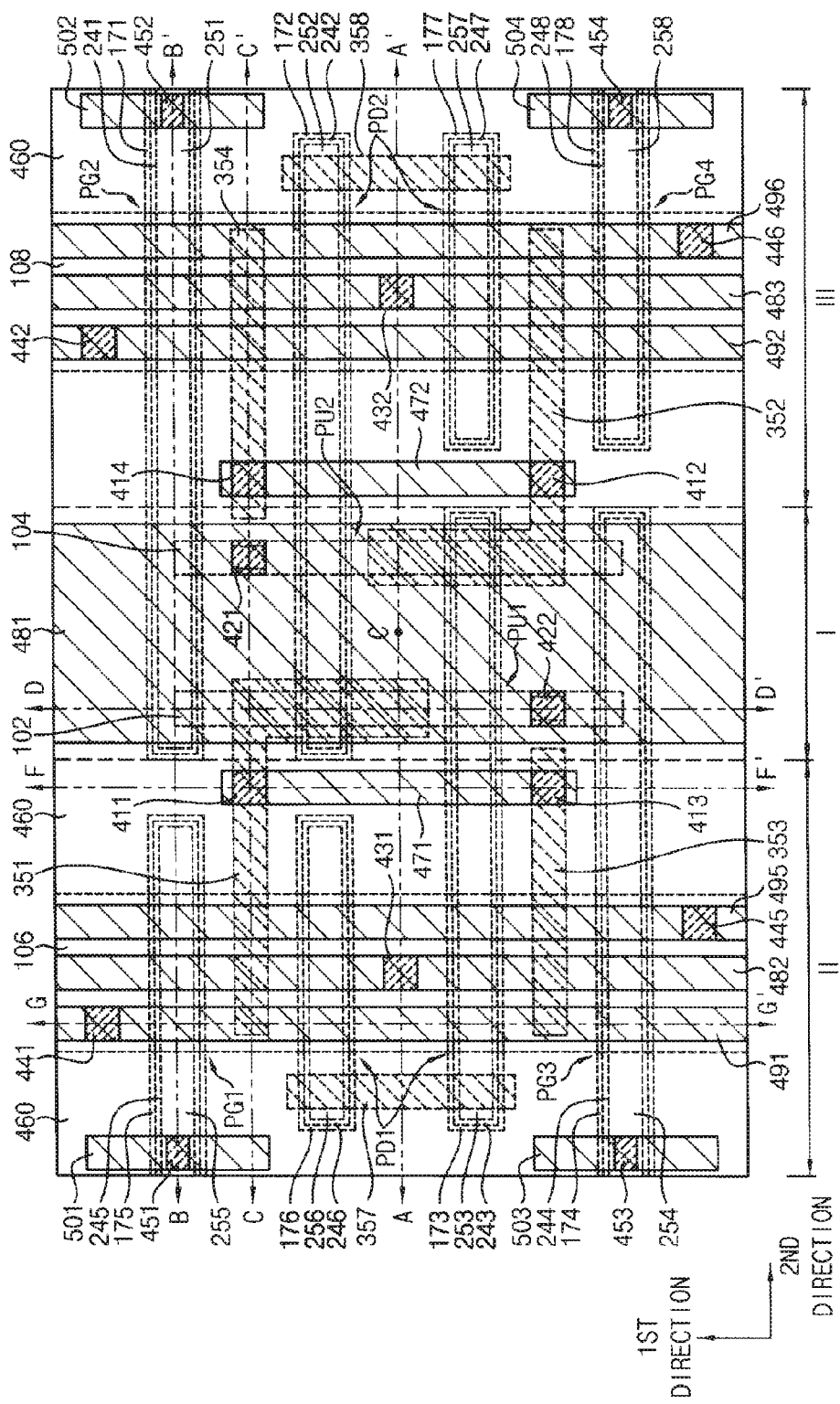
Figure 43:
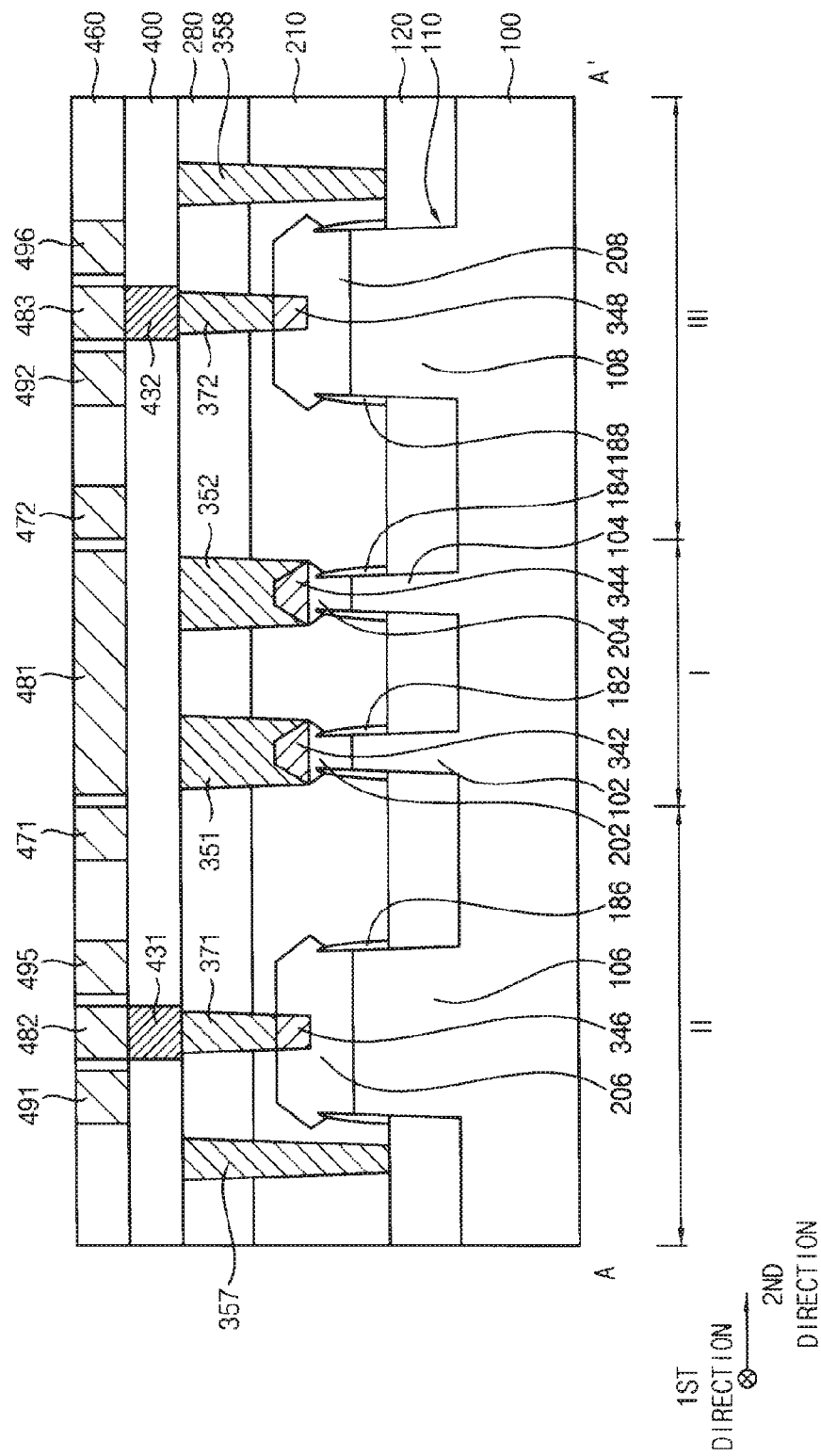
Figure 44:
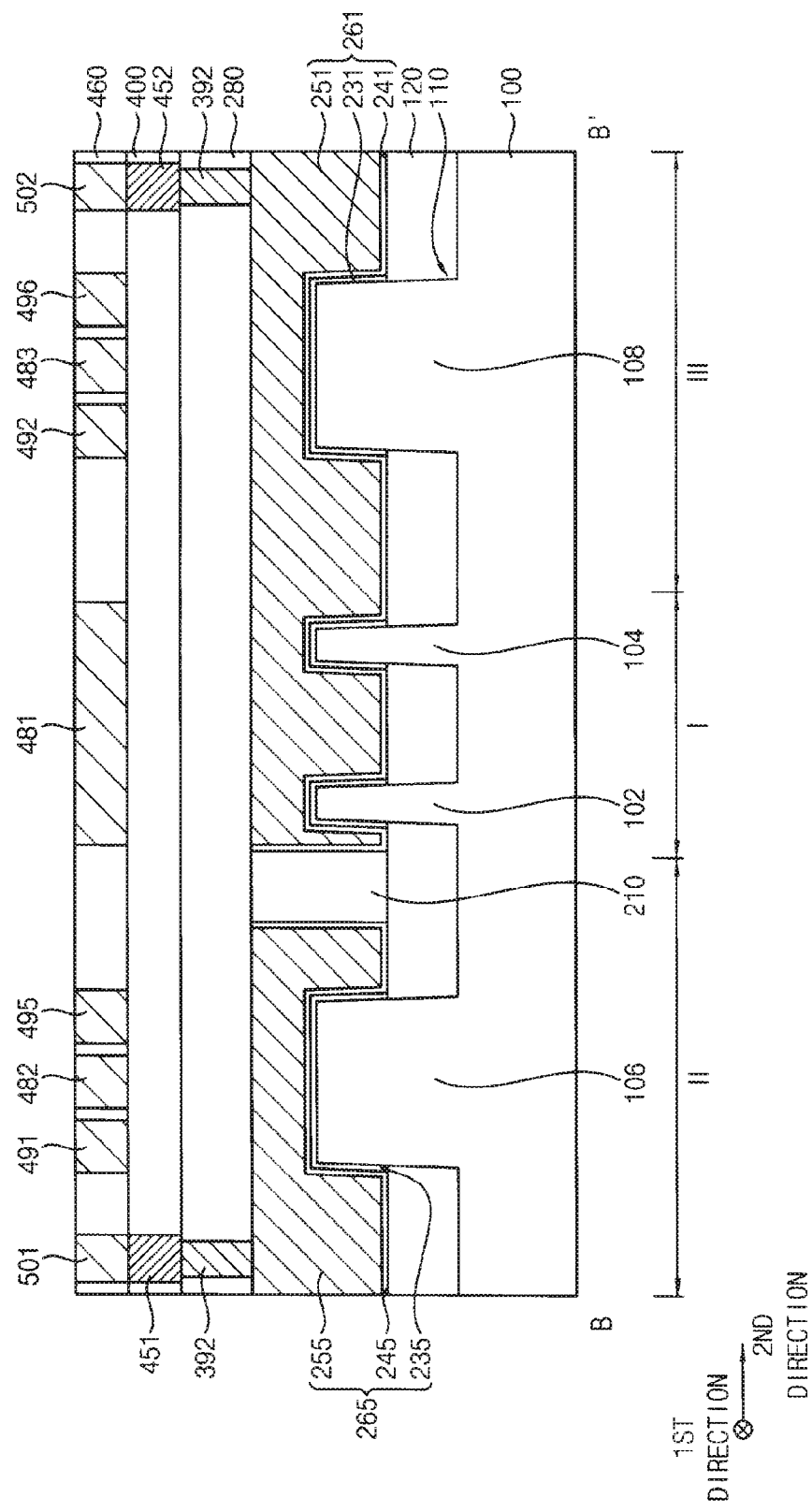
Figure 45:
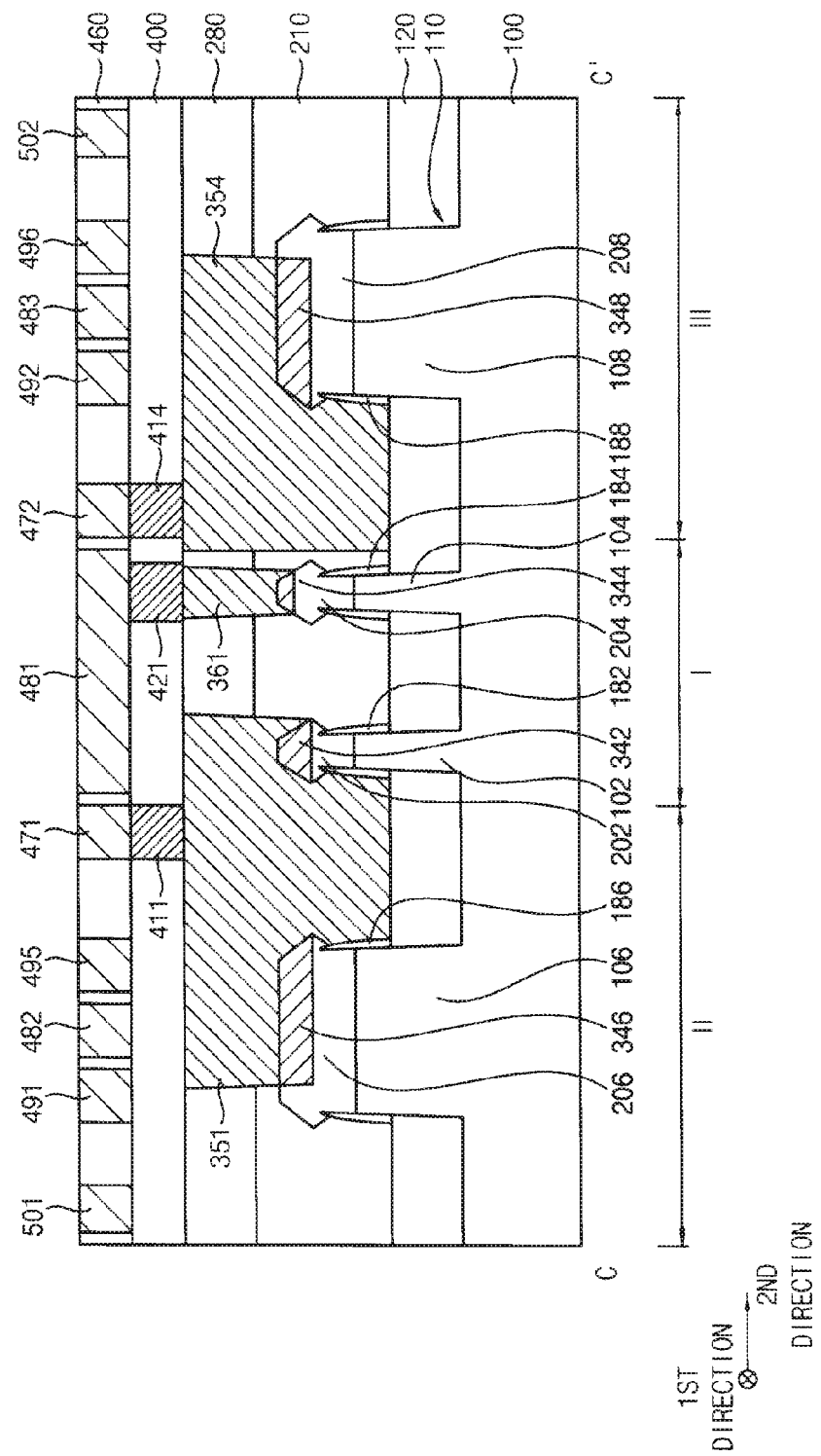
Figure 46:
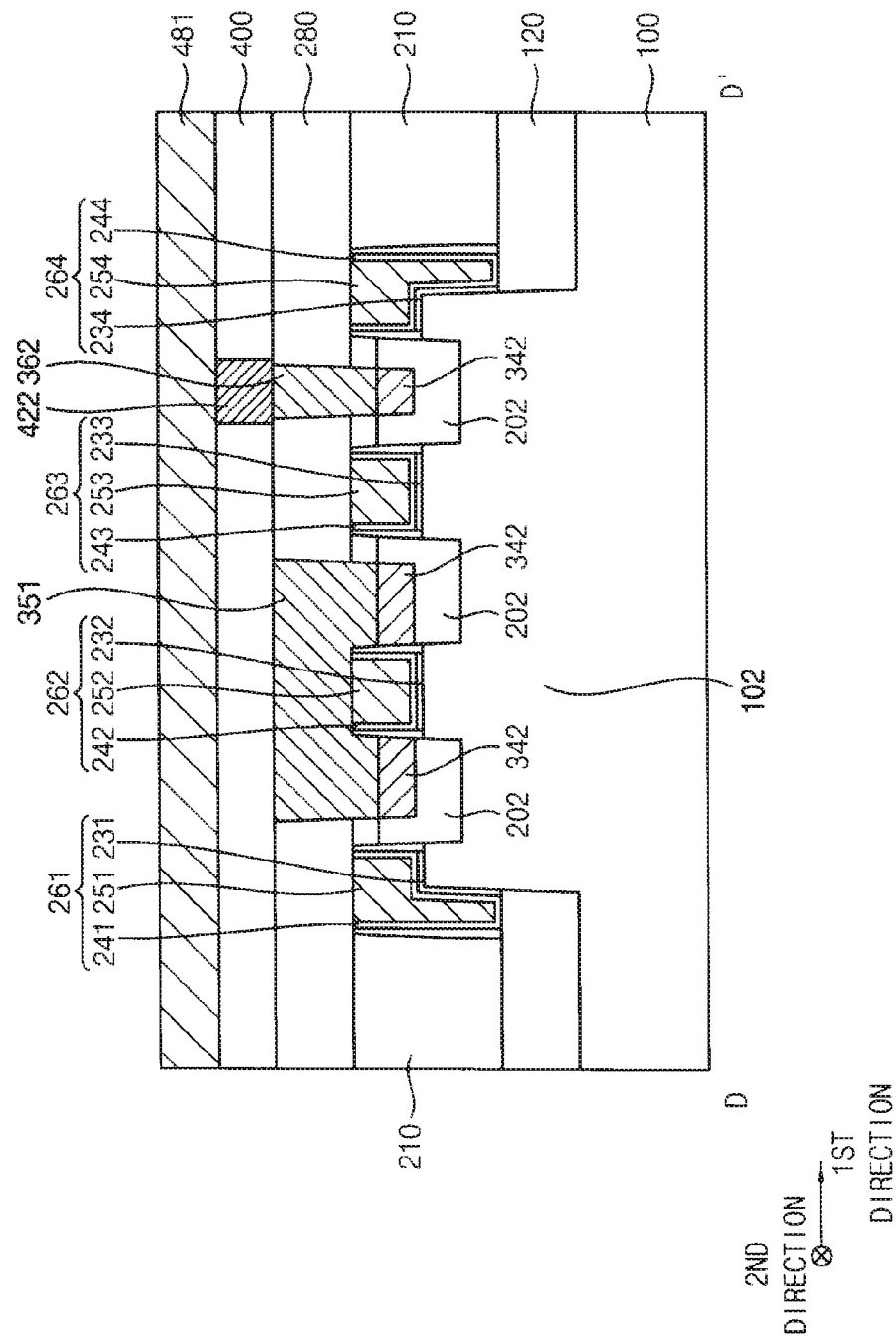
Figure 47:
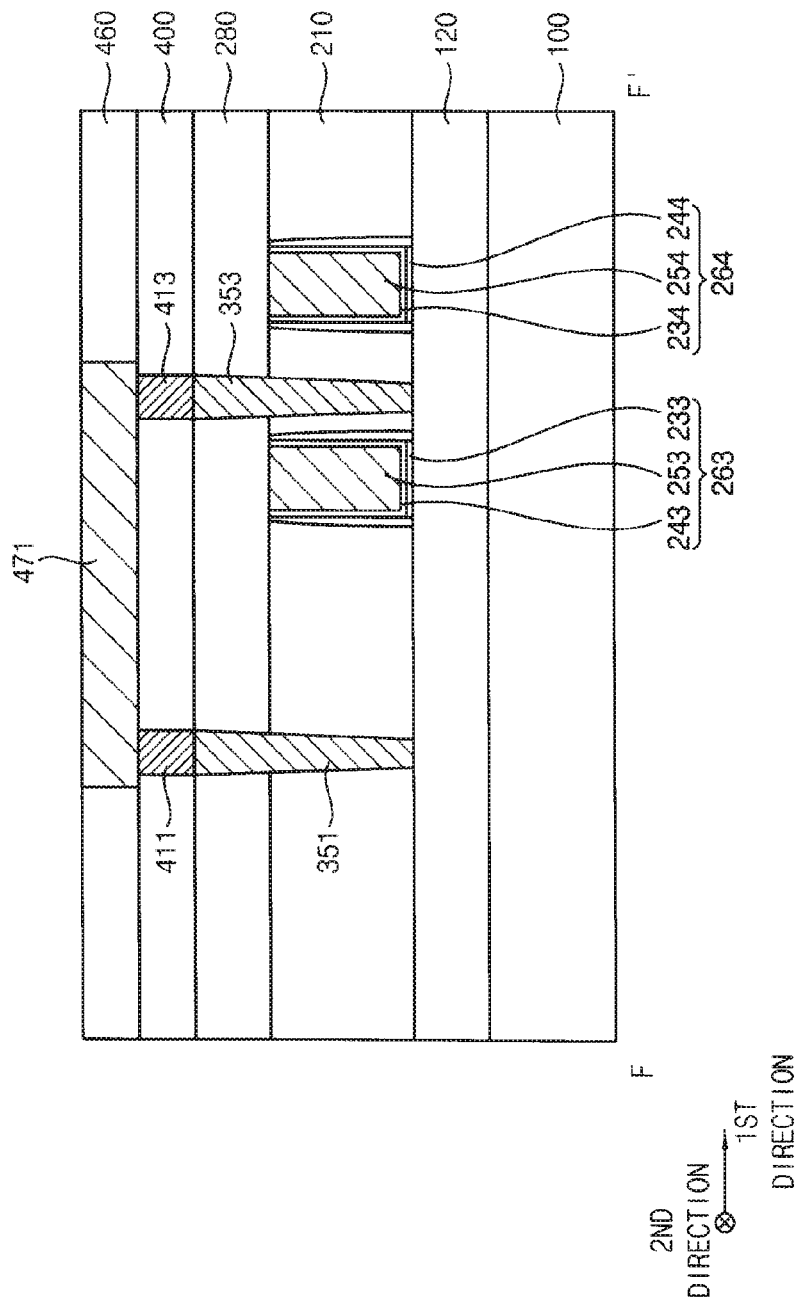
Figure 48:
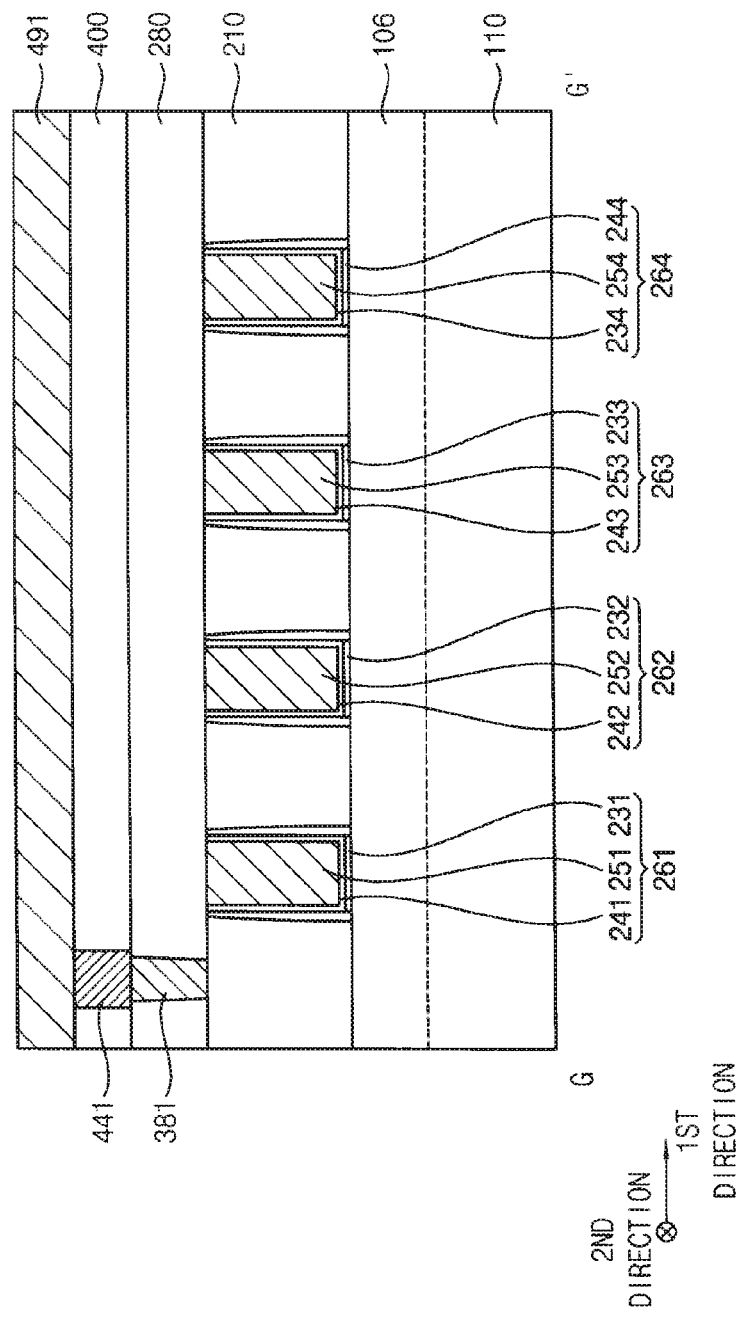

FIGS. 12, 13, 15, 19, 22, 25, 28, 33, 37 and 43 are cross-sectional views taken along a line A-A' of corresponding plan views, FIGS. 16, 38 and 44 are cross-sectional views taken along a line B-B' of corresponding plan views, FIGS. 34, 39 and 45 are cross-sectional views taken along a line C-C' of corresponding plan views, FIGS. 17, 20, 23, 26, 29, 31, 35, 40 and 46 are cross-sectional views taken along a line D-D' of corresponding plan views, FIG. 41 is a cross-sectional view taken along a line E-E' of a corresponding plan view, FIG. 47 is a cross-sectional view taken along a line F-F' of a corresponding plan view, and FIG. 48 is a cross-sectional view taken along a line G-G' of a corresponding plan view.

For the convenience of explanation, FIGS. 11 to 48 illustrate only one unit cell of the dual-port SRAM device.

Figure 11:
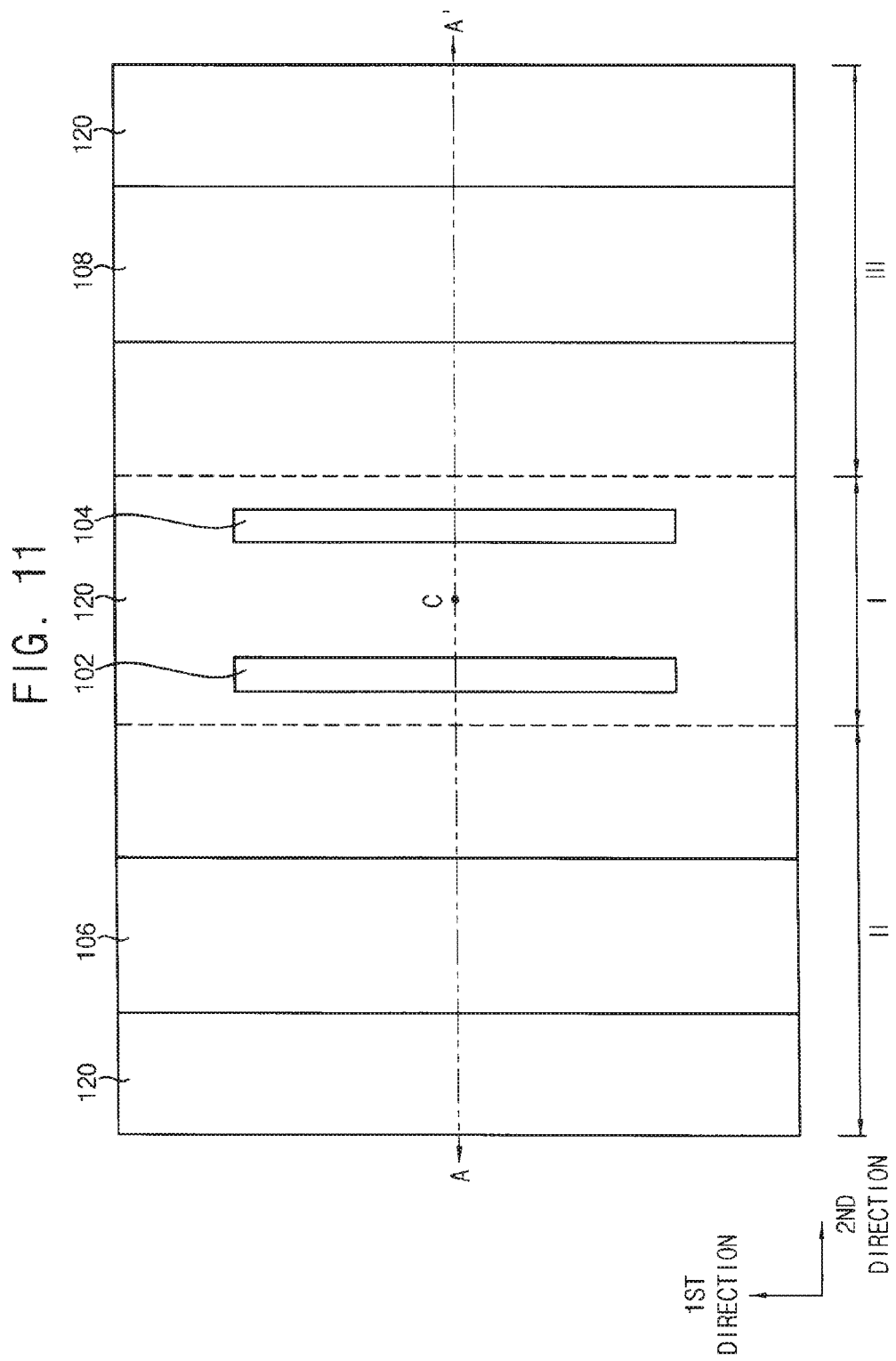
Figure 12:
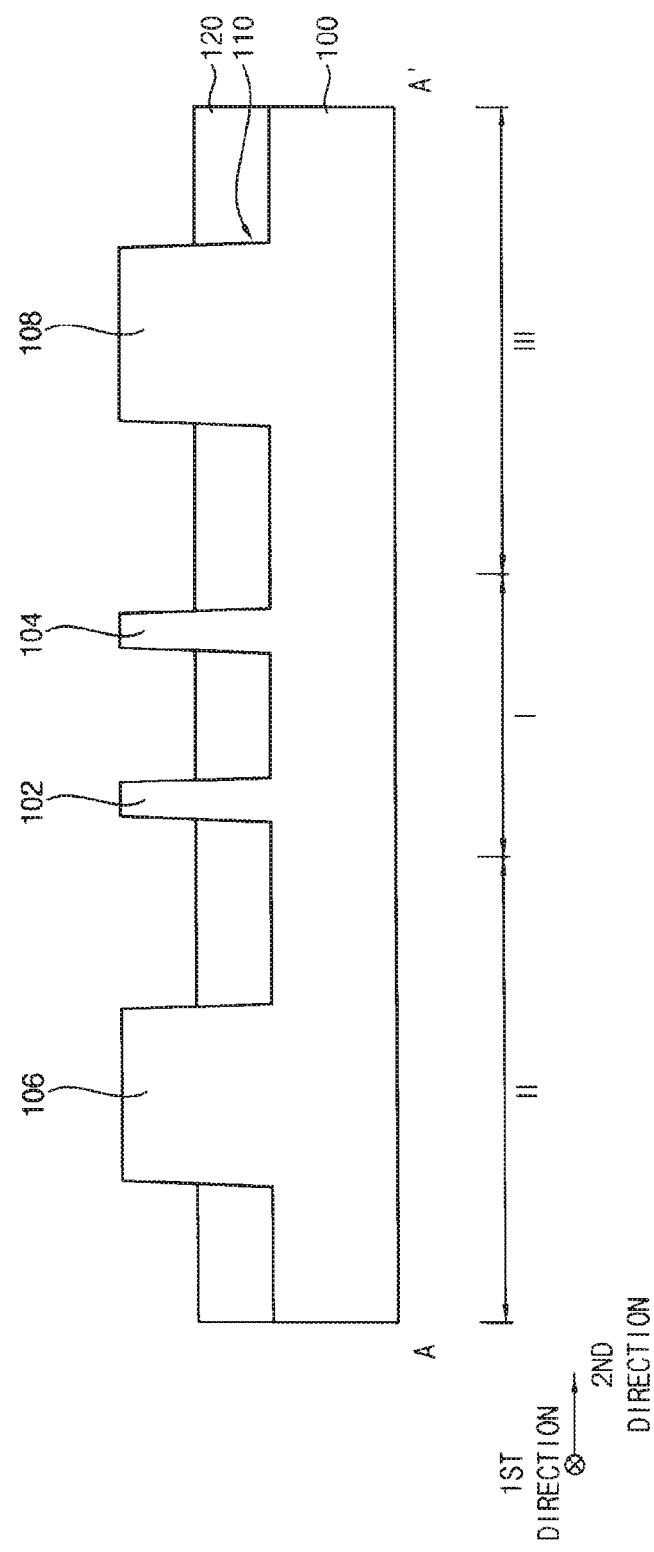

Referring to FIGS. 11 and 12, an upper portion of the substrate 100 may be partially etched to form a trench 110, and an isolation layer pattern 120 may be formed to fill a lower portion of the trench 110.

The substrate 100 may include a semiconductor material, e.g., silicon and/or germanium, or a Group III-V compound semiconductor material, e.g., GaP, GaAs and/or GaSb. In example embodiments, the substrate 100 may be a silicon-on-insulator (SOI) substrate, or a germanium-on-insulator (GOI) substrate.

The substrate 100 may include first to third regions I, II and III. In example embodiments, the first region I may be formed at a central portion of the unit cell, and may serve as a PMOS region in which PMOS transistors may be formed. The second and third regions II and III may be formed at both sides of the first region I in the unit cell, and may serve as NMOS regions in which NMOS transistors may be formed.

The isolation layer pattern 120 may be formed by forming an isolation layer on the substrate 100 to sufficiently fill the trench 110, planarizing the isolation layer until a top surface of the substrate 100 may be exposed, and removing an upper portion of the isolation layer to expose an upper portion of the trench 110. The isolation layer may be formed to include an oxide, e.g., silicon oxide.

As the isolation layer pattern 120 may be formed on the substrate 100, a field region of which a top surface may be covered by the isolation layer pattern 120 and an active region of which a top surface may not be covered by the isolation layer pattern 120 may be defined in the substrate 100. The active region may protrude from the isolation layer pattern 120 and have a fin-like shape so as to be referred to as an active fin.

When the upper portion of the isolation layer may be removed, an upper portion of the substrate 100 may be also partially removed. Thus, the active fin may have an upper portion not covered by the isolation layer pattern 120 that may have a width less than that of a lower portion thereof covered by the isolation layer pattern 120.

In example embodiments, the active region may extend in a first direction substantially parallel to a top surface of the substrate 100, and a plurality of active regions may be formed in a second direction substantially parallel to the top surface of the substrate 100 and substantially perpendicular to the first direction. Thus, one or more than one active region may be formed in each of the first to third regions I, II and III. FIGS. 11 and 1 show two active regions in the first region I, and one active region in each of the second and third regions II and III. The two active regions in the first region I may be referred to as first and second active regions 102 and 104, respectively, and the active regions in the second and third regions II and III may be referred to as third and fourth active regions 106 and 108, respectively.

In example embodiments, widths in the second direction of the first and second active regions 102 and 104 may be substantially the same as each other, and widths in the second direction of the third and fourth active regions 106 and 108 may be substantially the same as each other. The widths of the first and second active regions 102 and 104 may be less than the widths of the third and fourth active regions 106 and 108.

In example embodiments, the first and second active regions 102 and 104 may be in point symmetry with respect to a center C of the unit cell, and the third and fourth active regions 106 and 108 may be also in point symmetry with respect to the center C of the unit cell. Each of the first to fourth active regions 102, 104, 106 and 108 may extend in the first direction, and thus the first and second active regions 102 and 104 may be in line symmetry with respect to an imaginary line extending in the first direction and crossing over the center C of the unit cell, and the third and fourth active regions 106 and 108 may be also in line symmetry.

As illustrated above, the first to fourth active regions 102, 104, 106 and 108 may be formed to have symmetry, and thus may be easily formed.

Figure 13:
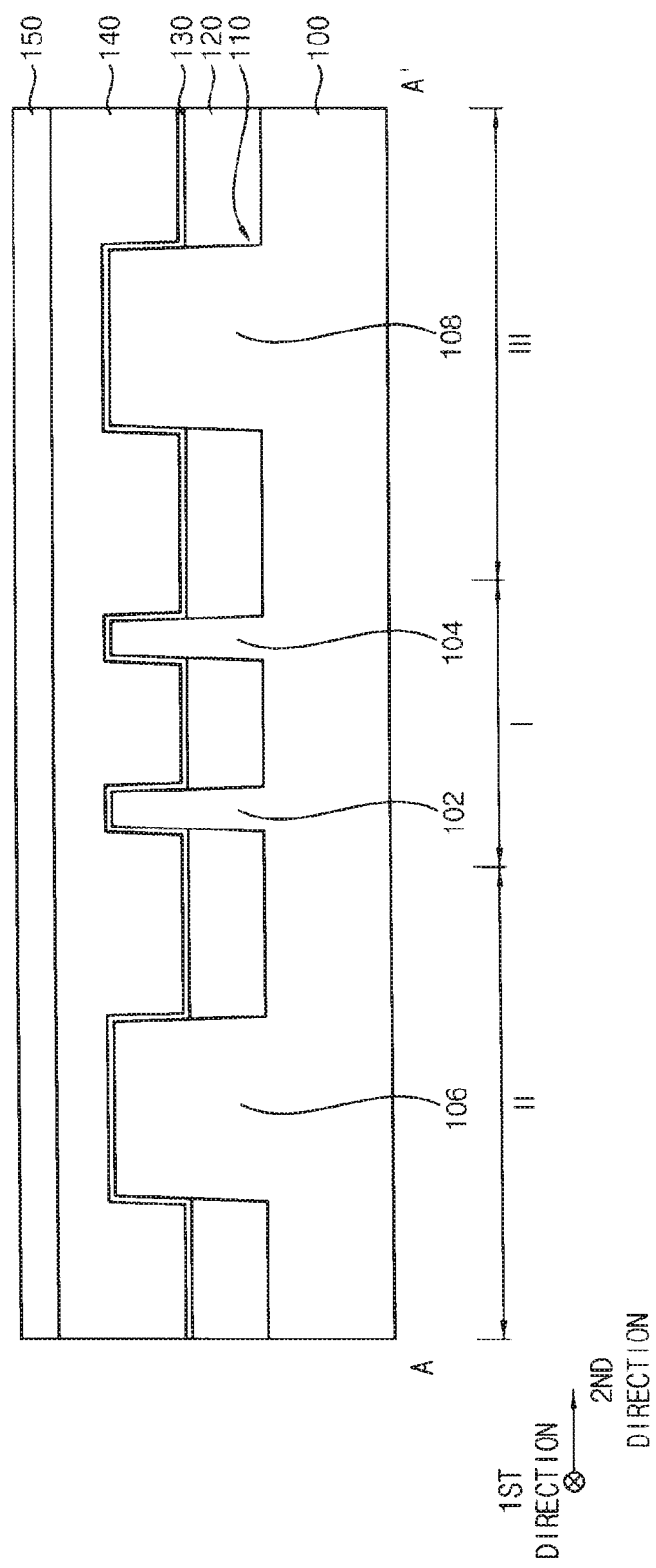
Figure 14:
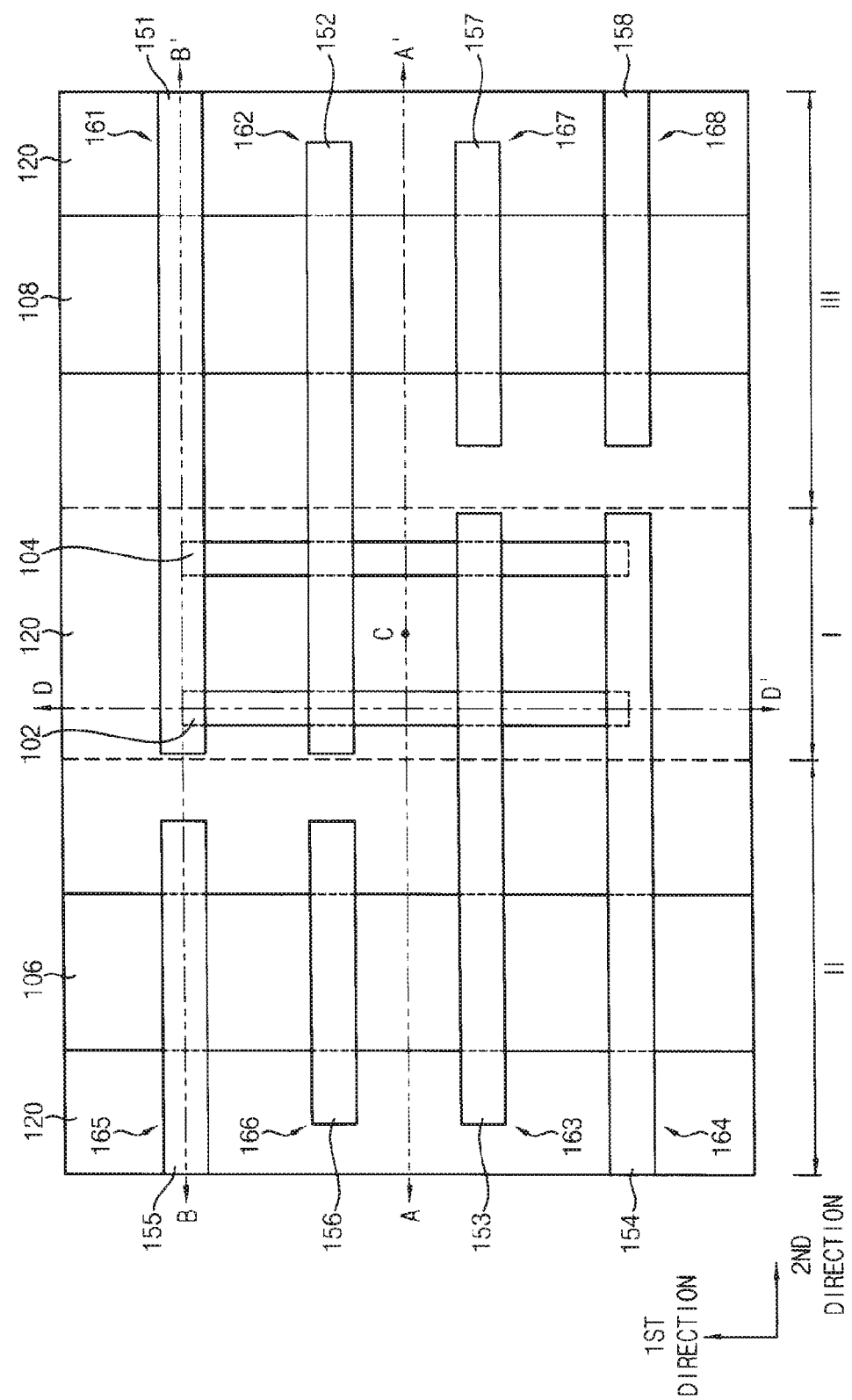
Figure 15:
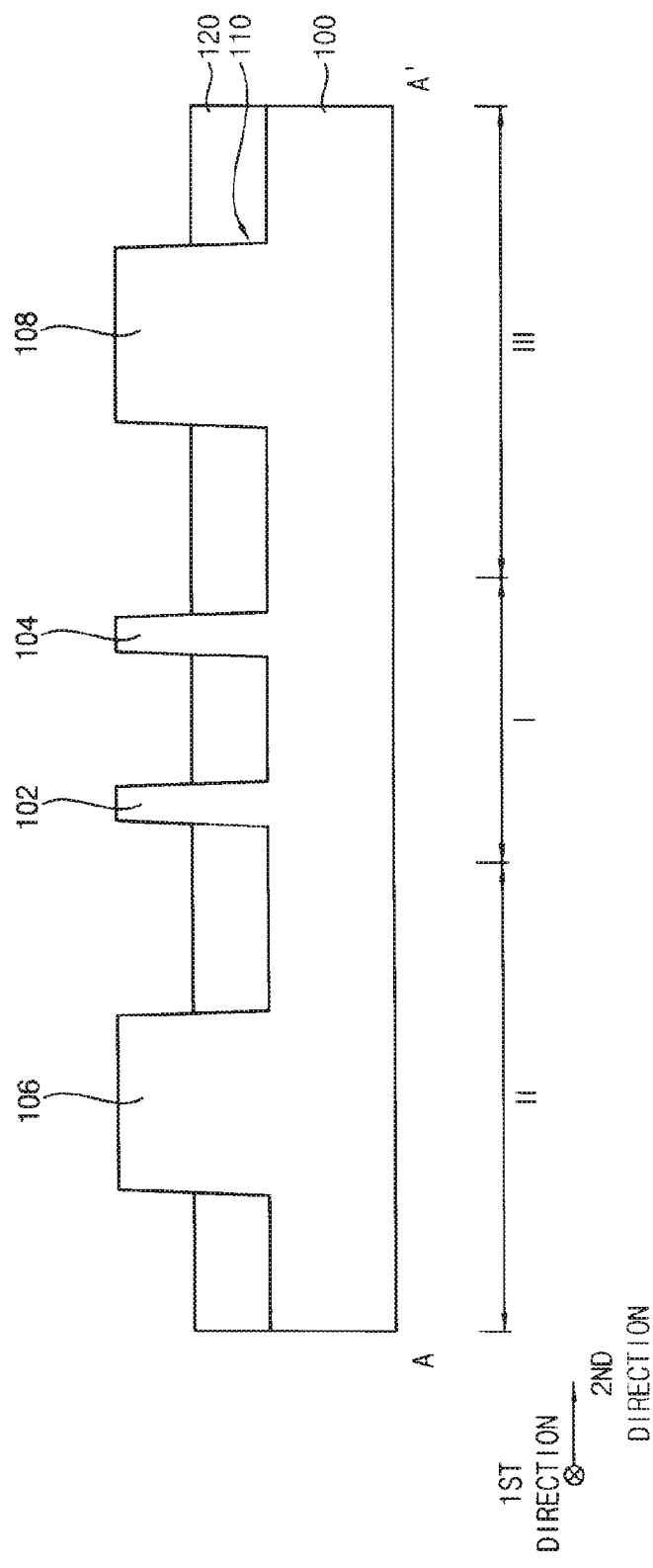

Referring to FIG. 13, a dummy gate insulation layer 130, a dummy gate electrode layer 140 and a dummy gate mask layer 150 may be sequentially formed on the first to fourth active regions 102, 104, 106 and 108 of the substrate 100 and the isolation layer pattern 120.

The dummy gate insulation layer 130 may be formed to include an oxide, e.g., silicon oxide, the dummy gate electrode layer 140 may be formed to include, e.g., polysilicon, and the dummy gate mask layer 150 may be formed to include a nitride, e.g., silicon nitride. The dummy gate insulation layer 130 may be formed by a chemical vapor deposition (CVD) process and/or an atomic layer deposition (ALD) process. Alternatively, the dummy gate insulation layer 130 may be formed by a thermal oxidation process on an upper portion of the substrate 100. The dummy gate electrode layer 140 and the dummy gate mask layer 150 may be also formed by a CVD process and/or an ALD process.

Referring to FIGS. 14 to 17, first to eighth dummy gate structures 161, 162, 163, 164, 165, 166, 167 and 168 may be formed on the first to third regions I, II and III of the substrate 100.

The first to eighth dummy gate structures 161, 162, 163, 164, 165, 166, 167 and 168 may be formed by patterning the dummy gate mask layer 150 through a photolithography process using a photoresist pattern (not shown) to form first to eighth dummy gate masks 151, 152, 153, 154, 155, 156, 157 and 158, and sequentially etching the dummy gate electrode layer 140 and the dummy gate insulation layer 130 using the first to eighth dummy gate masks 151, 152, 153, 154, 155, 156, 157 and 158 as an etching mask.

In example embodiments, each of the first to eighth dummy gate structures 161, 162, 163, 164, 165, 166, 167 and 168 may be formed to extend in the second direction.

Thus, the first dummy gate structure 161 may be formed to include a first dummy gate insulation layer pattern 131, a first dummy gate electrode 141 and the first dummy gate mask 151 sequentially stacked on the first, second and fourth active regions 102, 104 and 108 of the substrate 100 and a portion of the isolation layer pattern 120 adjacent thereto, the second dummy gate structure 162 may be formed to include a second dummy gate insulation layer pattern 132, a second dummy gate electrode 142 and the second dummy gate mask 152 sequentially stacked on the first, second and fourth active regions 102, 104 and 108 of the substrate 100 and a portion of the isolation layer pattern 120 adjacent thereto, the third dummy gate structure 163 may be formed to include a third dummy gate insulation layer pattern 133, a third dummy gate electrode 143 and the third dummy gate mask 153 sequentially stacked on the first, second and third active regions 102, 104 and 106 of the substrate 100 and a portion of the isolation layer pattern 120 adjacent thereto, and the fourth dummy gate structure 164 may be formed to include a fourth dummy gate insulation layer pattern 134, a fourth dummy gate electrode 144 and the fourth dummy gate mask 154 sequentially stacked on the first, second and third active regions 102, 104 and 106 of the substrate 100 and a portion of the isolation layer pattern 120 adjacent thereto.

Additionally, the fifth dummy gate structure 165 may be formed to include a fifth dummy gate insulation layer pattern 135, a fifth dummy gate electrode 145 and the fifth dummy gate mask 155 sequentially stacked on the third active region 106 of the substrate 100 and a portion of the isolation layer pattern 120 adjacent thereto, the sixth dummy gate structure 166 may be formed to include a sixth dummy gate insulation layer pattern (not shown), a sixth dummy gate electrode (not shown) and the sixth dummy gate mask 156 sequentially stacked on the third active region 106 of the substrate 100 and a portion of the isolation layer pattern 120 adjacent thereto, the seventh dummy gate structure 167 may be formed to include a seventh dummy gate insulation layer pattern (not shown), a seventh dummy gate electrode (not shown) and the seventh dummy gate mask 157 sequentially stacked on the fourth active region 108 of the substrate 100 and a portion of the isolation layer pattern 120 adjacent thereto, and the eighth dummy gate structure 168 may be formed to include an eighth dummy gate insulation layer pattern (not shown), an eighth dummy gate electrode (not shown) and the eighth dummy gate mask 158 sequentially stacked on the fourth active region 108 of the substrate 100 and a portion of the isolation layer pattern 120 adjacent thereto.

In example embodiments, with respect to the center C of the unit cell, the second and third dummy gate structures 162 and 163 may be in point symmetry, the first and fourth dummy gate structures 161 and 164 may be in point symmetry, the sixth and seventh dummy gate structures 166 and 167 may be in point symmetry, and the fifth and eighth dummy gate structures 165 and 168 may be in point symmetry. That is, with respect to the center C of the unit cell, the first, second, seventh and eighth dummy gate structures 161, 162, 167 and 168 may be in point symmetry with the fourth, third, sixth and fifth dummy gate structures 164, 163, 166 and 165, respectively.

As illustrated above, the first to eighth dummy gate structures 161, 162, 163, 164, 165, 166, 167 and 168 may be formed to have symmetry, and thus may be easily formed.

Impurity regions (not shown) may be formed at upper portions of the first to fourth active regions 102, 104, 106 and 108 adjacent to the first to eighth dummy gate structures 161, 162, 163, 164, 165, 166, 167 and 168, by an ion implantation process.

Figure 18:
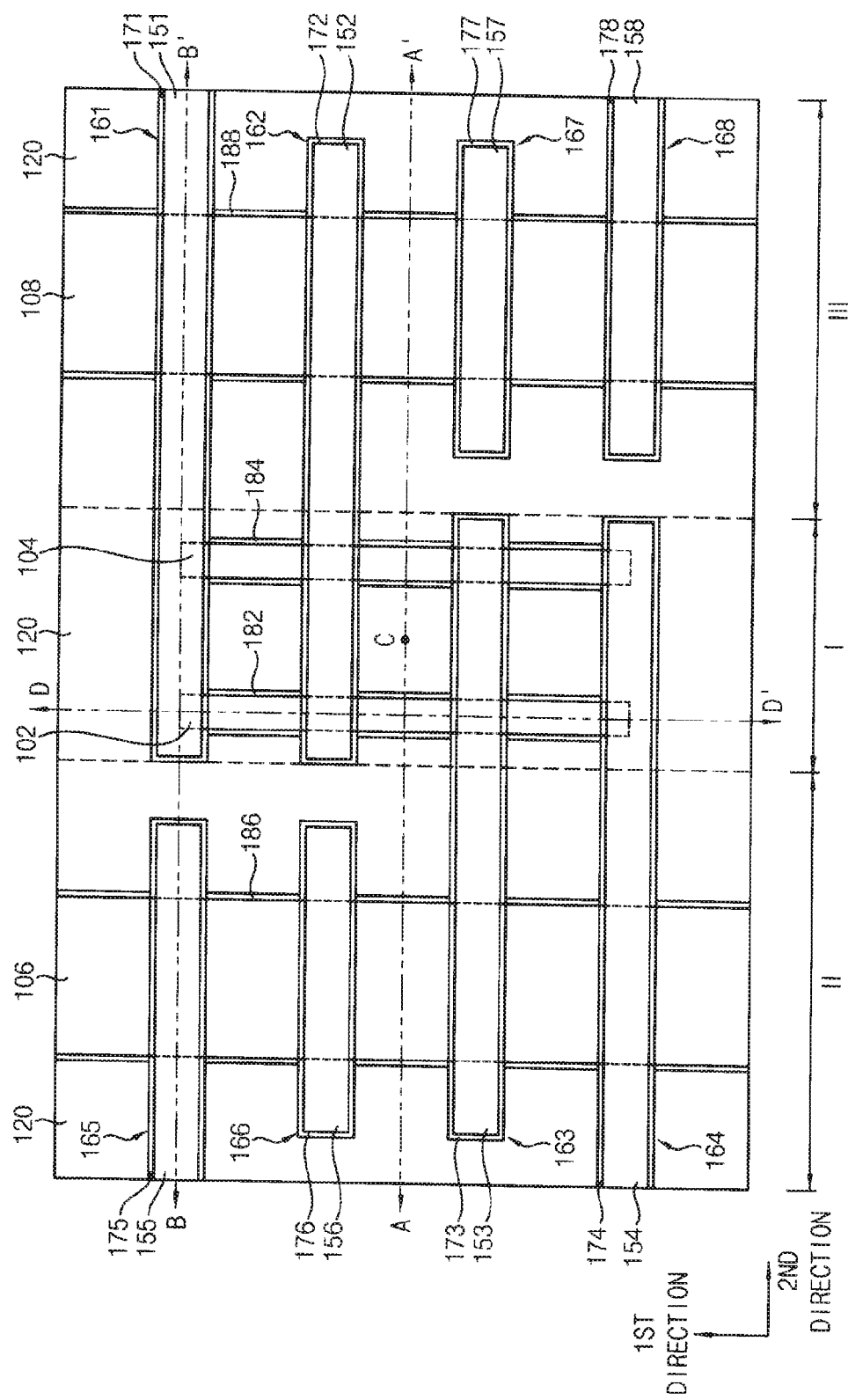
Figure 19:
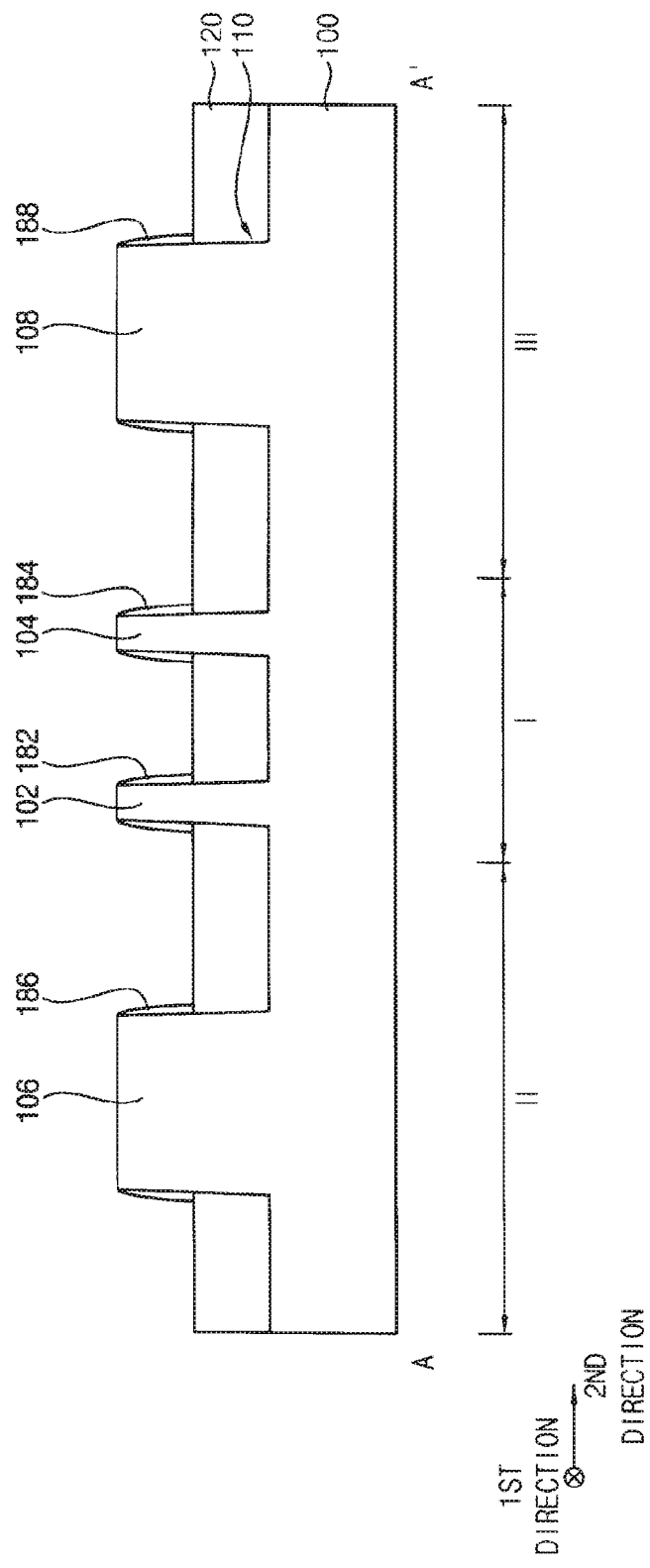
Figure 20:
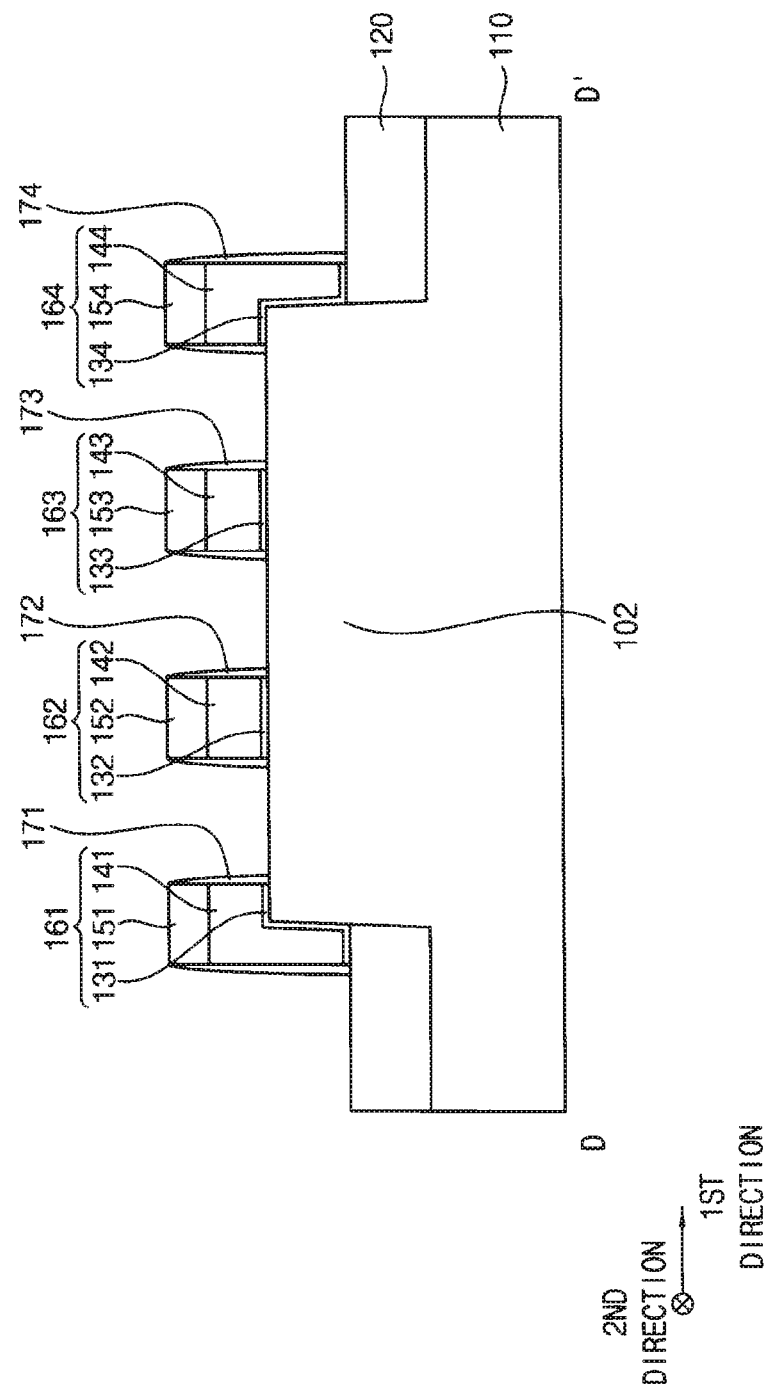

Referring to FIGS. 18 to 20, first to eighth gate spacers 171, 172, 173, 174, 175, 176, 177 and 178 may be formed on sidewalls of the first to eighth the dummy gate structures 161, 162, 163, 164, 165, 166, 167 and 168, respectively, and first to fourth fin spacers 182, 184, 186 and 188 may be formed on sidewalls of the first to fourth active regions 102, 104, 106 and 108, respectively.

In example embodiments, the first to eighth gate spacers 171, 172, 173, 174, 175, 176, 177 and 178, and the first to fourth fin spacers 182, 184, 186 and 188 may be formed by forming a spacer layer on the first to eighth the dummy gate structures 161, 162, 163, 164, 165, 166, 167 and 168, the first to fourth active regions 102, 104, 106 and 108, and the isolation layer pattern 120, and anisotropically etching the spacer layer.

The spacer layer may be formed to include a nitride, e.g., silicon nitride and/or silicon oxycarbonitride.

Figure 21:
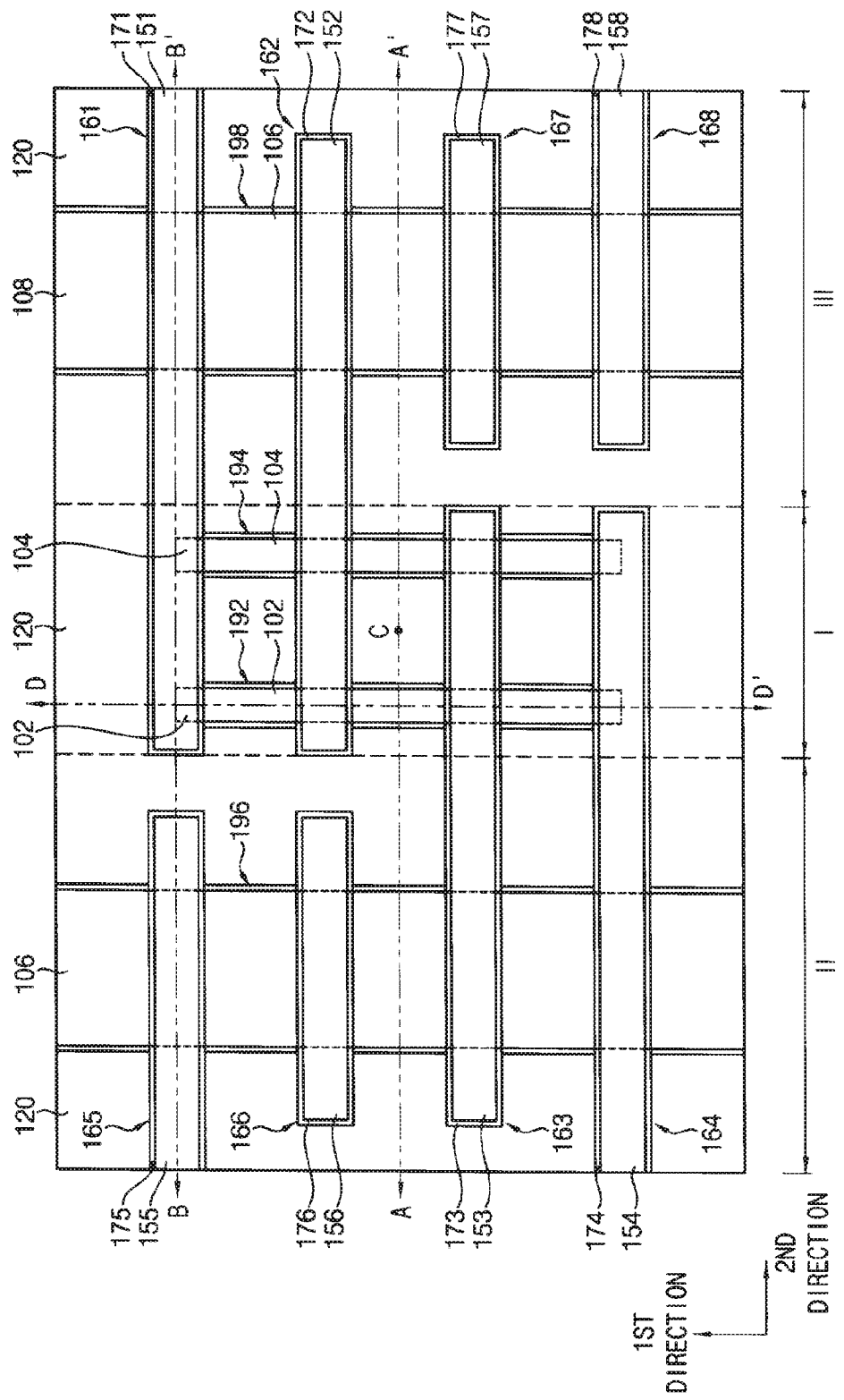
Figure 22:
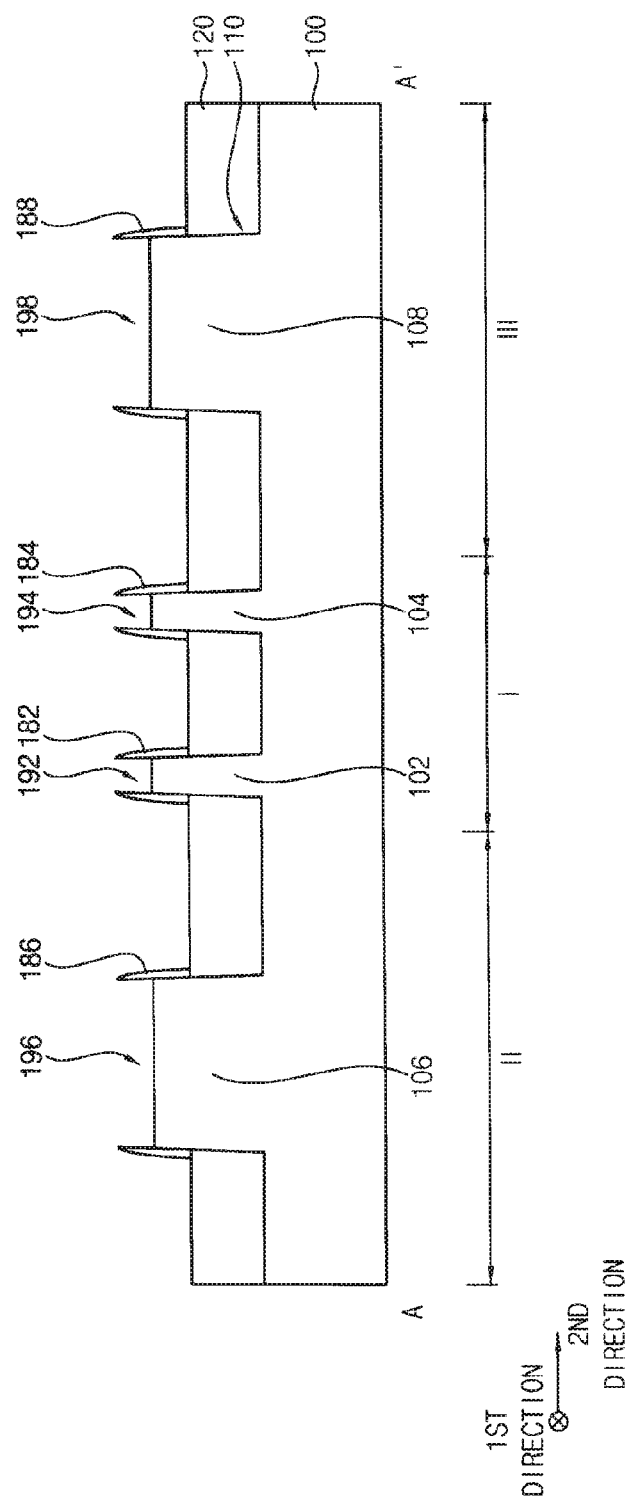
Figure 23:
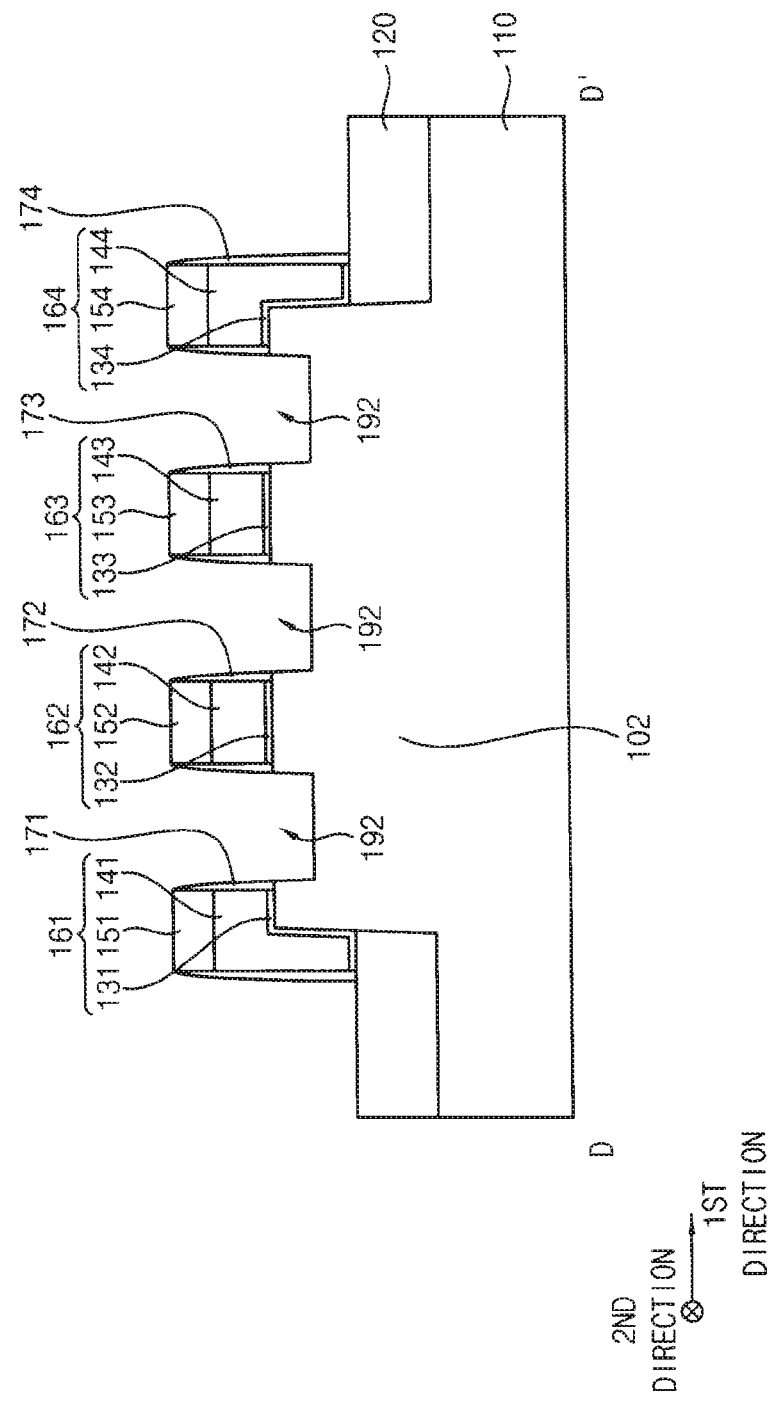

Referring to FIGS. 21 to 23, upper portions of the first to fourth active regions 102, 102, 106 and 108 may be etched using the first to eighth dummy gate structures 161, 162, 163, 164, 165, 166, 167 and 168, the first to eighth gate spacers 171, 172, 173, 174, 175, 176, 177 and 178, and the first to fourth fin spacers 182, 184, 186 and 188 as an etching mask to form first to fourth recesses 192, 194, 196 and 198, respectively.

In the etching process, upper portions of the first to fourth fin spacers 182, 184, 186 and 188 may be also removed so that top surfaces of the first to fourth fin spacers 182, 184, 186 and 188 may have a reduced height.

The etching process for forming the first to fourth recesses 192, 194, 196 and 198 may be performed in-situ with the anisotropic etching process on the spacer layer illustrated with reference to FIGS. 18 to 20.

Figure 24:
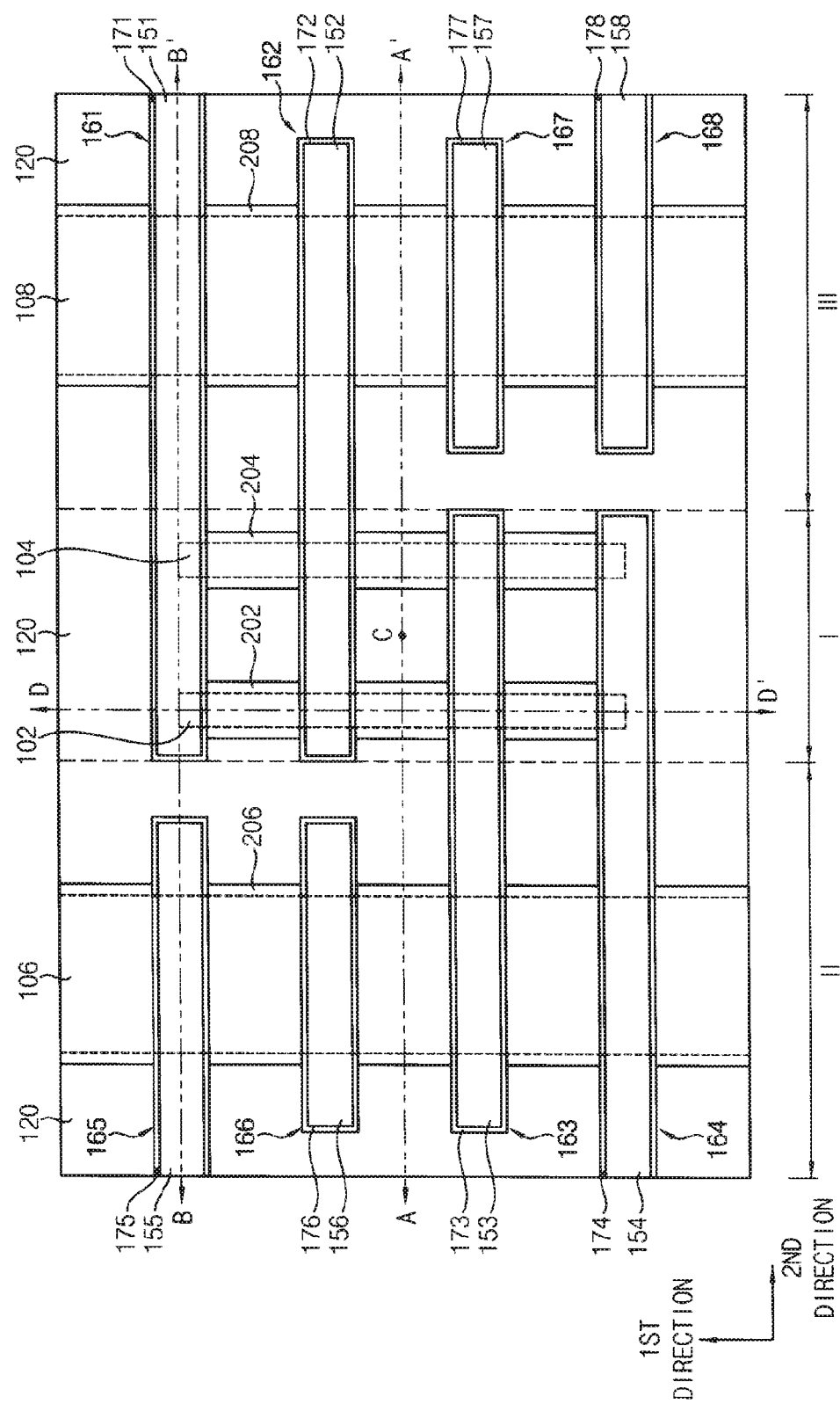
Figure 25:
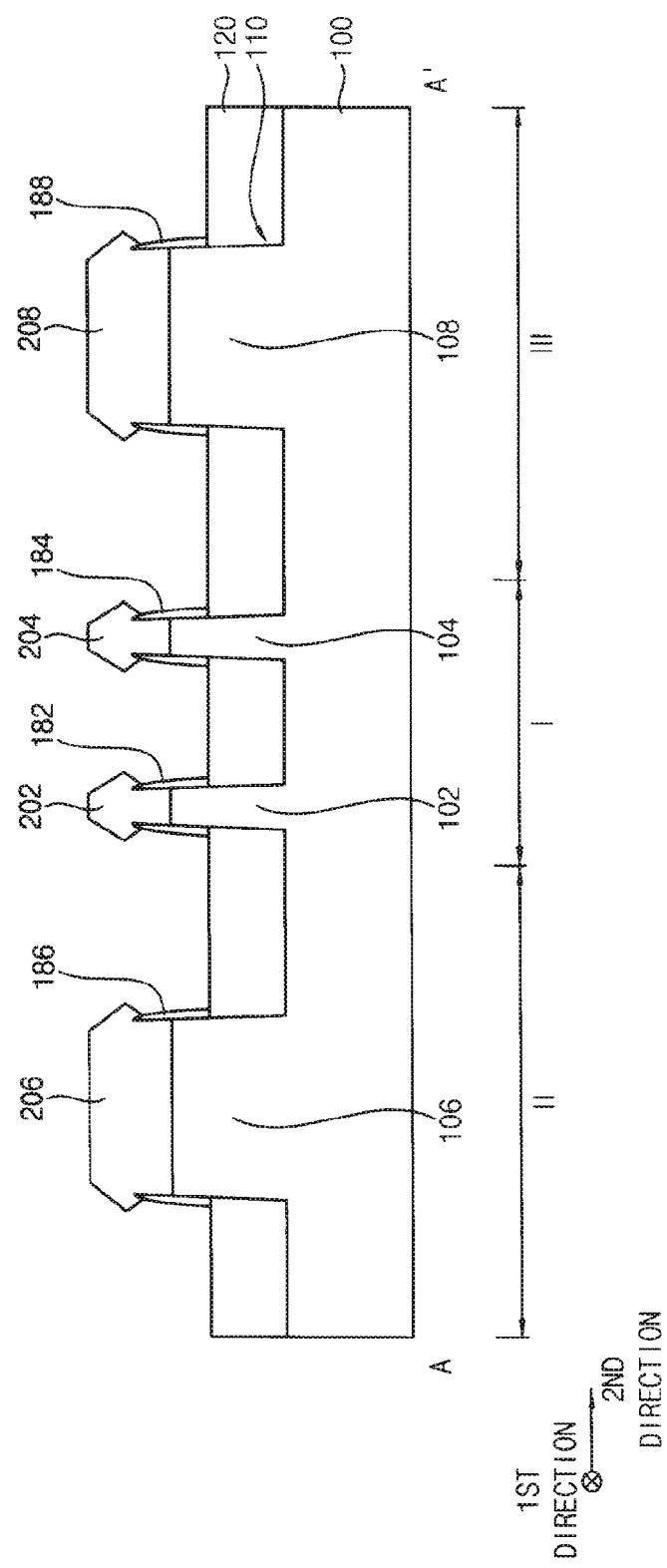
Figure 26:
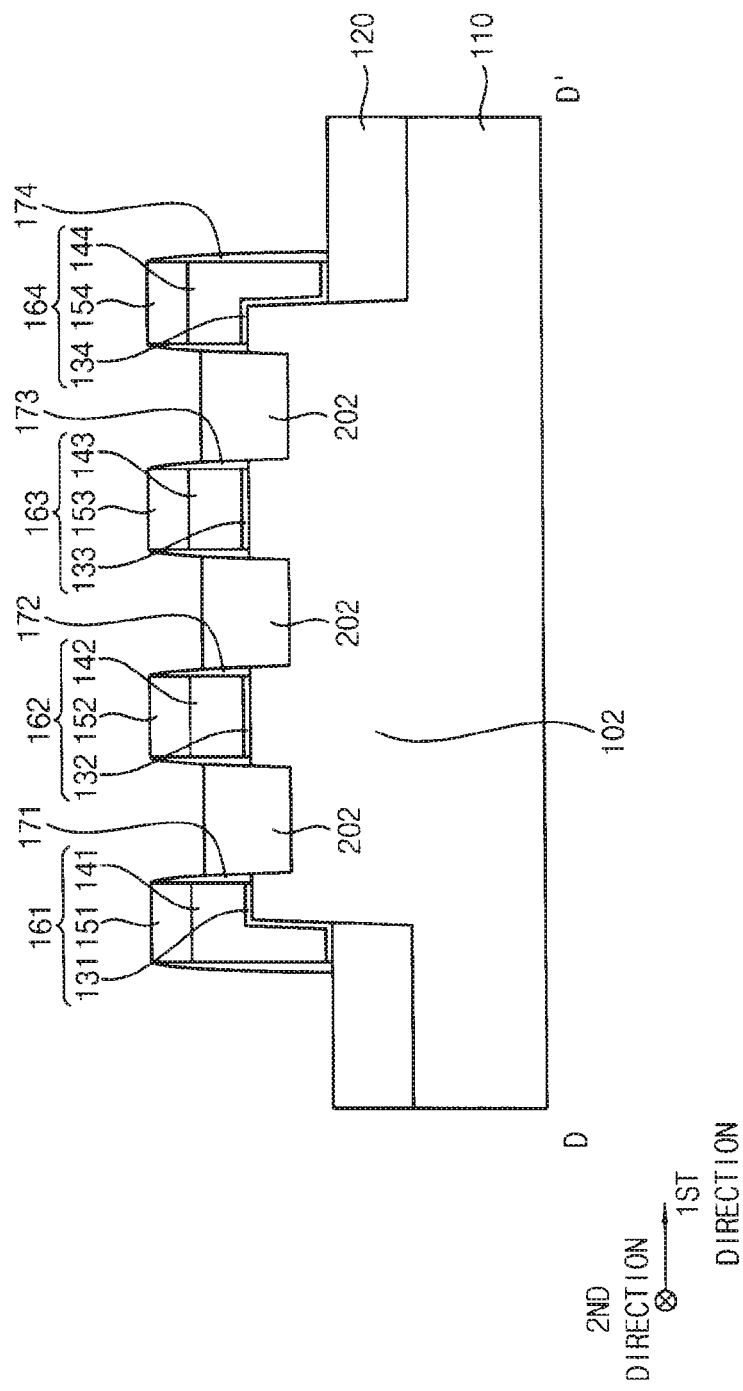

Referring to FIGS. 24 to 26, a selective epitaxial growth (SEG) process may be performed using upper portions of the first to fourth active regions 102, 104, 106 and 108 exposed by the first to fourth recesses 192, 194, 196 and 198, respectively, as a seed to form first to fourth source/drain layers 202, 204, 206 and 208 on the first to fourth active regions 102, 104, 106 and 108, respectively.

In example embodiments, the SEG process may be performed using, e.g., dichlorosilane ($SiH_2Cl_2$) gas and/or germane ($GeH_4$) gas, as a source gas to form a single crystalline silicon-germanium layer. In example embodiments, a p-type impurity source gas, e.g., diborane ($B_2H_6$) gas may be also used to form the single crystalline silicon-germanium layer doped with p-type impurities. Thus, the first and second source/drain layers 202 and 204 may be formed on the first and second active regions 102 and 104, respectively, in the first region I to serve as source/drain regions of PMOS transistors.

In example embodiments, the SEG process may be performed using, e.g., dichlorosilane ($SiH_2Cl_2$) gas and/or methylsilane ($SiH_3CH_3$) gas, as a source gas to form a single crystalline silicon carbide layer. In example embodiments, an n-type impurity source gas, e.g., phosphine ($PH_3$) gas may be also used to form the single crystalline silicon carbide layer doped with n-type impurities. Alternatively, the SEG process may be performed using only the silicon source gas, e.g., dichlorosilane ($SiH_2Cl_2$) gas, without using the carbon source gas, e.g., methylsilane ($SiH_3CH_3$) gas, so that a single crystalline silicon layer may be formed. Thus, the third and fourth source/drain layers 206 and 208 may be formed on the third and fourth active regions 106 and 108, respectively, in the second and third regions II and III to serve as source/drain regions of NMOS transistors.

In example embodiments, the first to fourth source/drain layers 202, 204, 206 and 208 may fill the first to fourth recesses 192, 194, 196 and 198, respectively, and further protrude from the first to fourth fin spacers 182, 184, 186 and 188, respectively. The first to fourth source/drain layers 202, 204, 206 and 208 may be grown not only in a vertical direction but also in a horizontal direction, and thus may have a cross-section taken along the first direction of which a shape is pentagon or hexagon.

Figure 27:
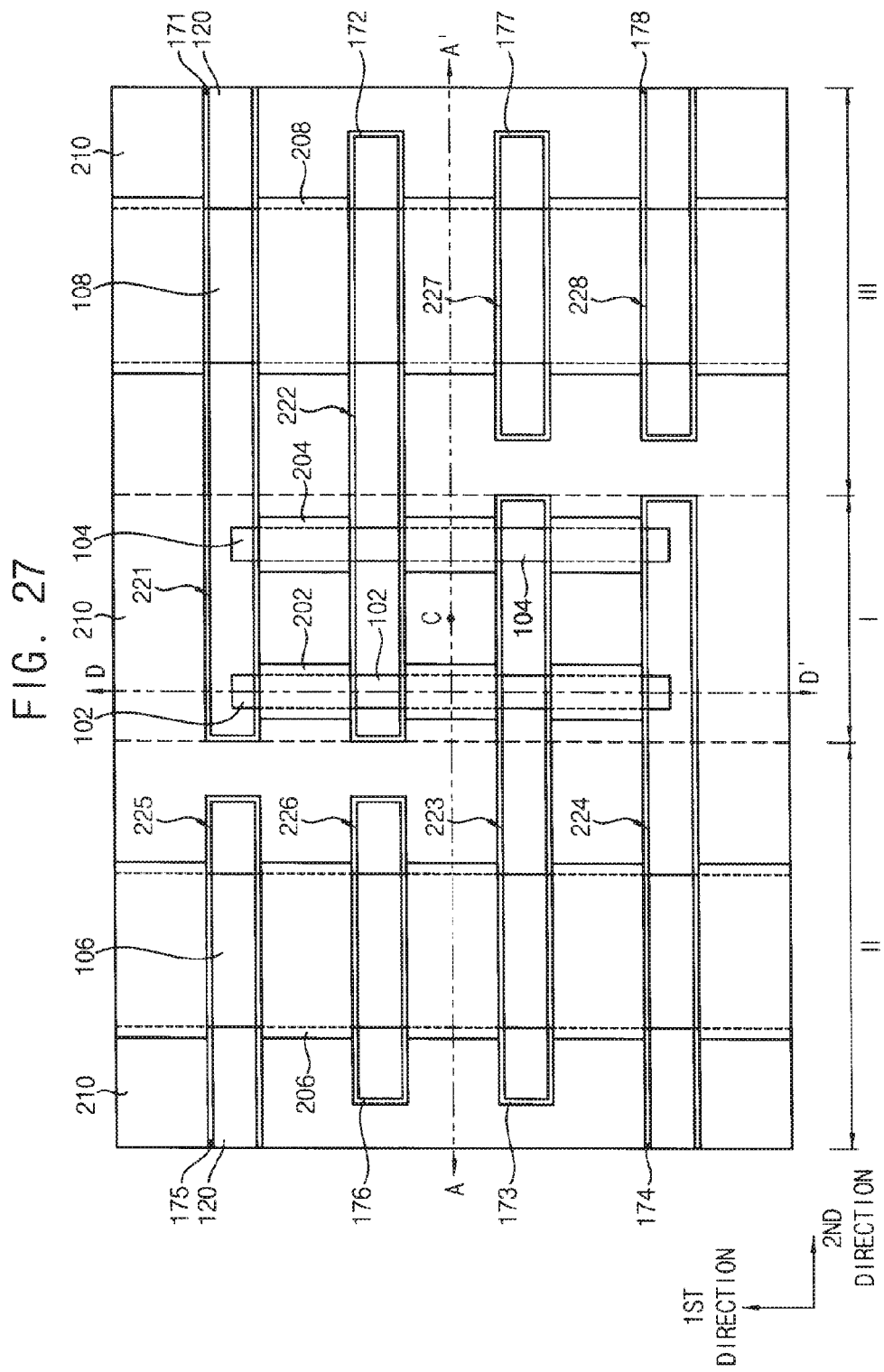
Figure 28:
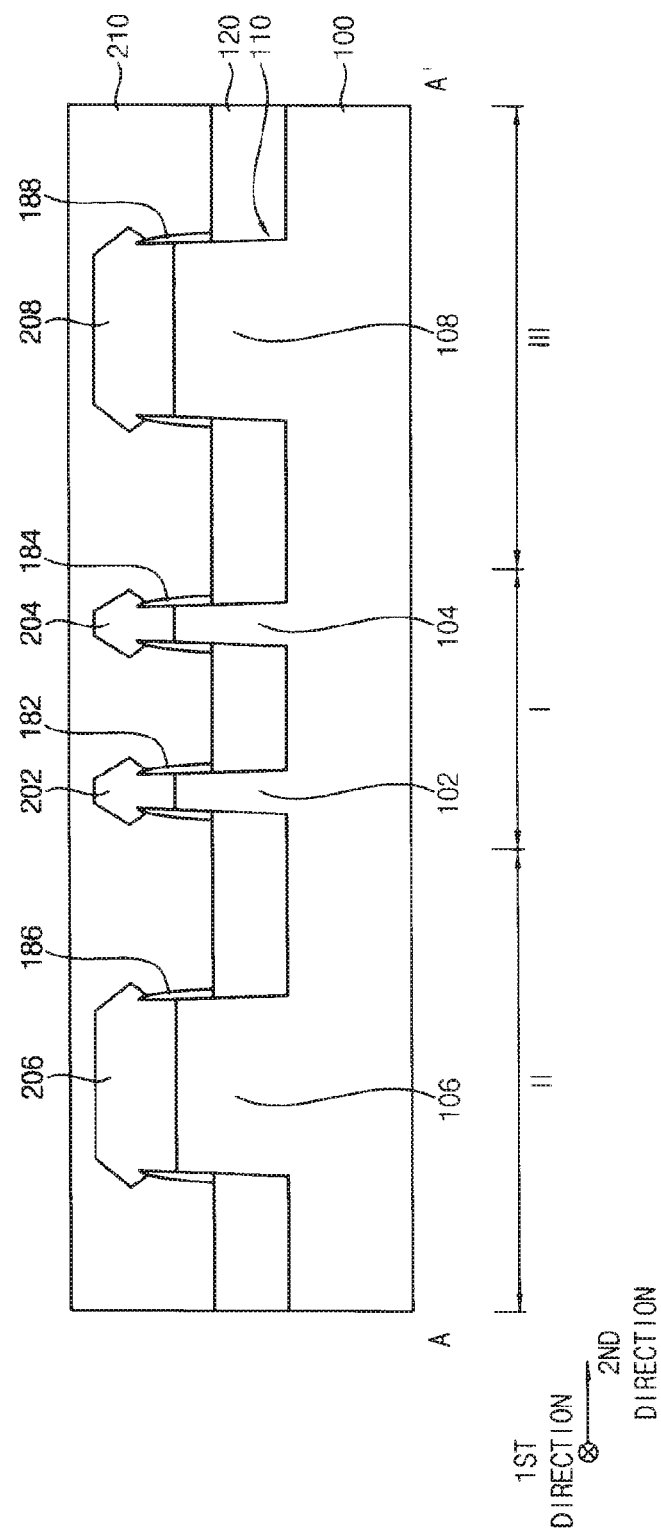
Figure 29:
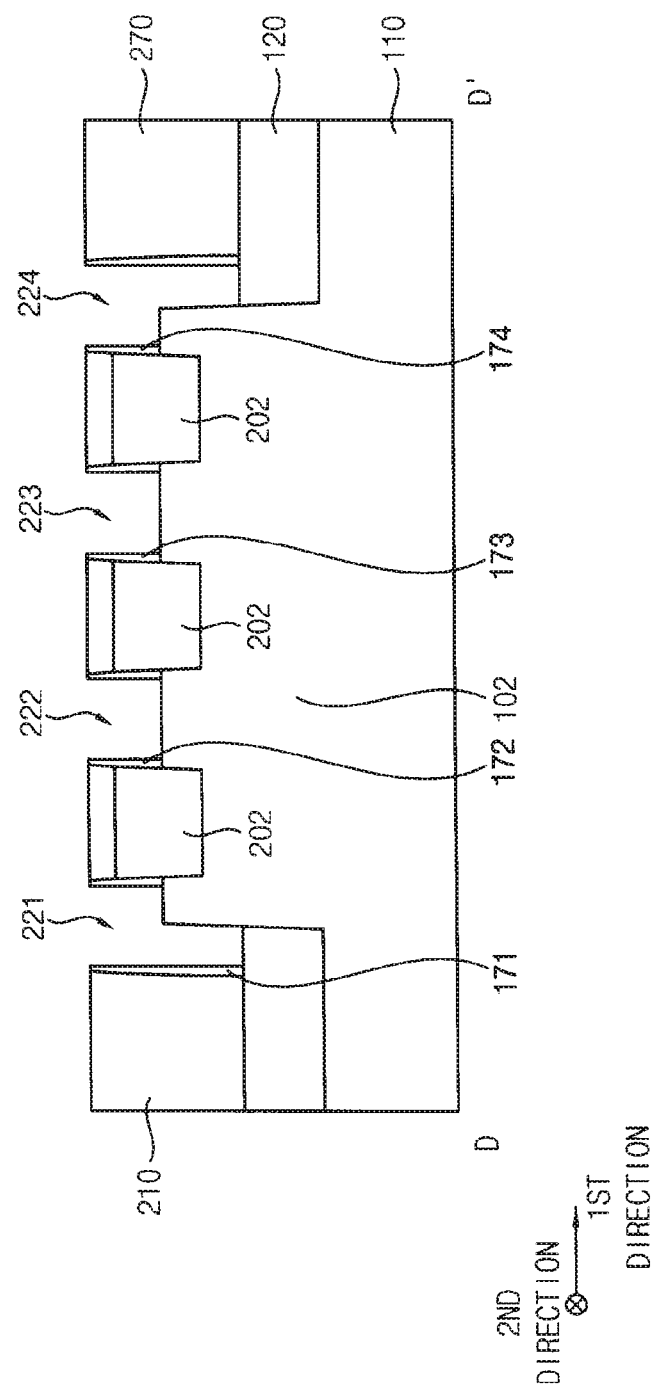

Referring to FIGS. 27 to 29, an insulating interlayer 210 covering the first to eighth dummy gate structures 161, 162, 163, 164, 165, 166, 167 and 168, the first to eighth gate spacers 171, 172, 173, 174, 175, 176, 177 and 178, and the first to fourth fin spacers 182, 184, 186 and 188, the first to fourth source/drain layers 202, 204, 206 and 208, and the isolation layer 120 may be formed to a sufficient height on the substrate 100, and the insulating interlayer 210 may be planarized until top surfaces of the first to fifth dummy gate electrodes 141, 412, 143, 144 and 145 of the first to fifth dummy gate structures 161, 162, 163, 164 and 165, and top surfaces of the sixth to eighth dummy gate electrodes of the sixth to eighth dummy gate structures 166, 167 and 168 may be exposed. During the planarization process, the first to eighth dummy gate masks 151, 152, 153, 154, 155, 156, 157 and 158 of the first to eighth dummy gate structures 161, 162, 163, 164, 165, 166, 167 and 168, respectively, and upper portions of the first to eighth gate spacers 171, 172, 173, 174, 175, 176, 177 and 178 may be also removed. In example embodiments, the planarization process may be performed by a chemical mechanical polishing (CMP) process and/or an etching process.

The exposed first to fifth dummy gate electrodes 141, 142, 143, 144 and 145, and the underlying first to fifth dummy gate insulation layer patterns 131, 132, 133, 134 and 135, the exposed sixth to eighth dummy gate electrodes, and the underlying sixth to eighth dummy gate insulation layer patterns may be removed to form first to eighth openings 221, 222, 223, 224, 225, 226, 227 and 228 exposing top surfaces of the first to fourth active regions 102, 104, 106 and 108, and the isolation layer pattern 120.

In example embodiments, the first to fifth dummy gate electrodes 141, 142, 143, 144 and 145, and the sixth to eighth dummy gate electrodes may be sufficiently removed by performing a dry etch process and performing a wet etch process. The wet etch process may be performed using, e.g., HF as an etching solution.

Figure 30:
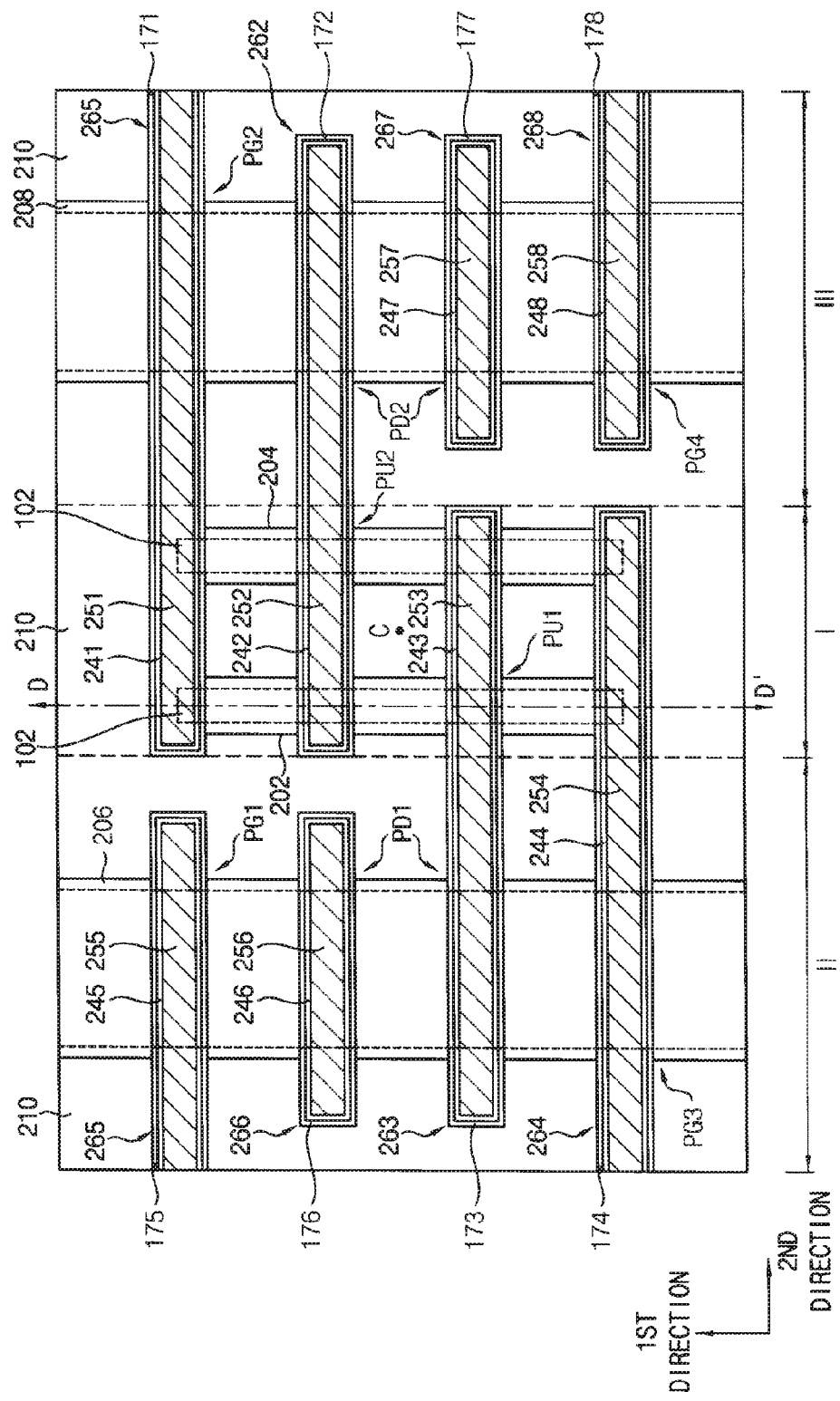
Figure 31:
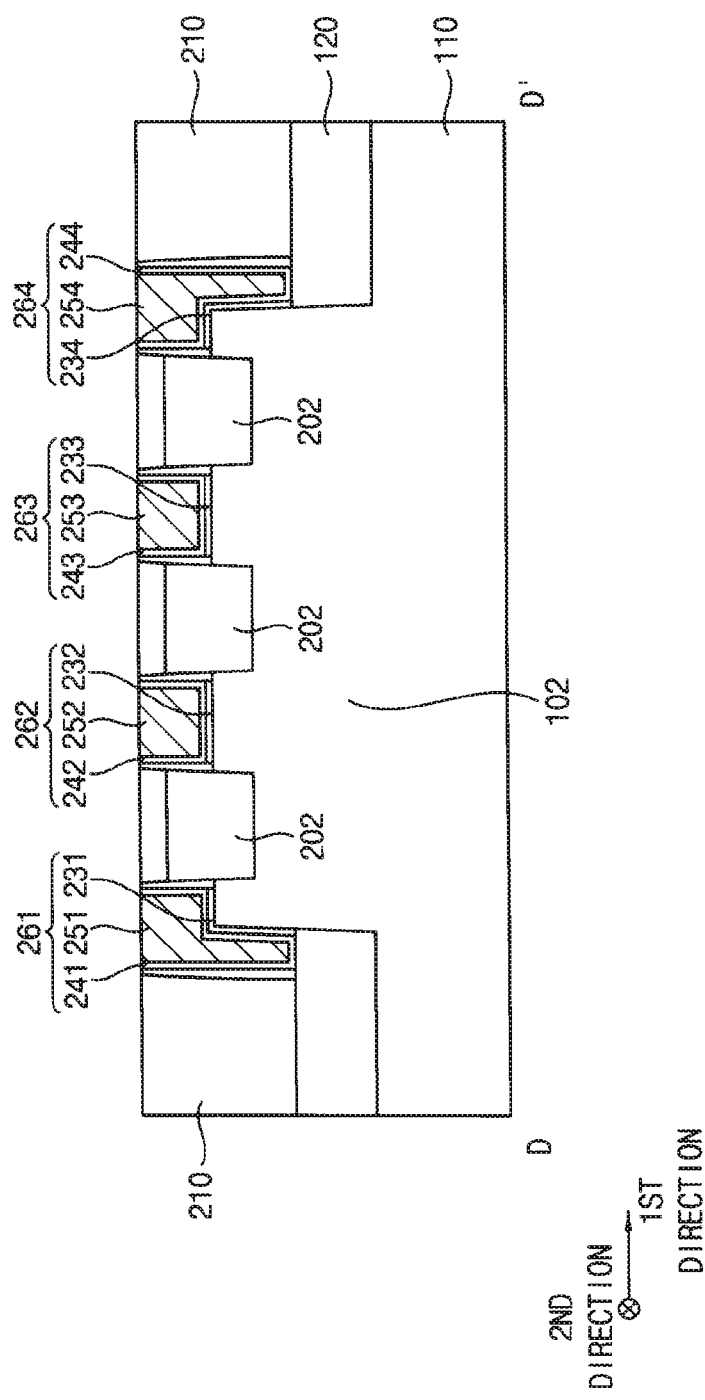
Figure 32:
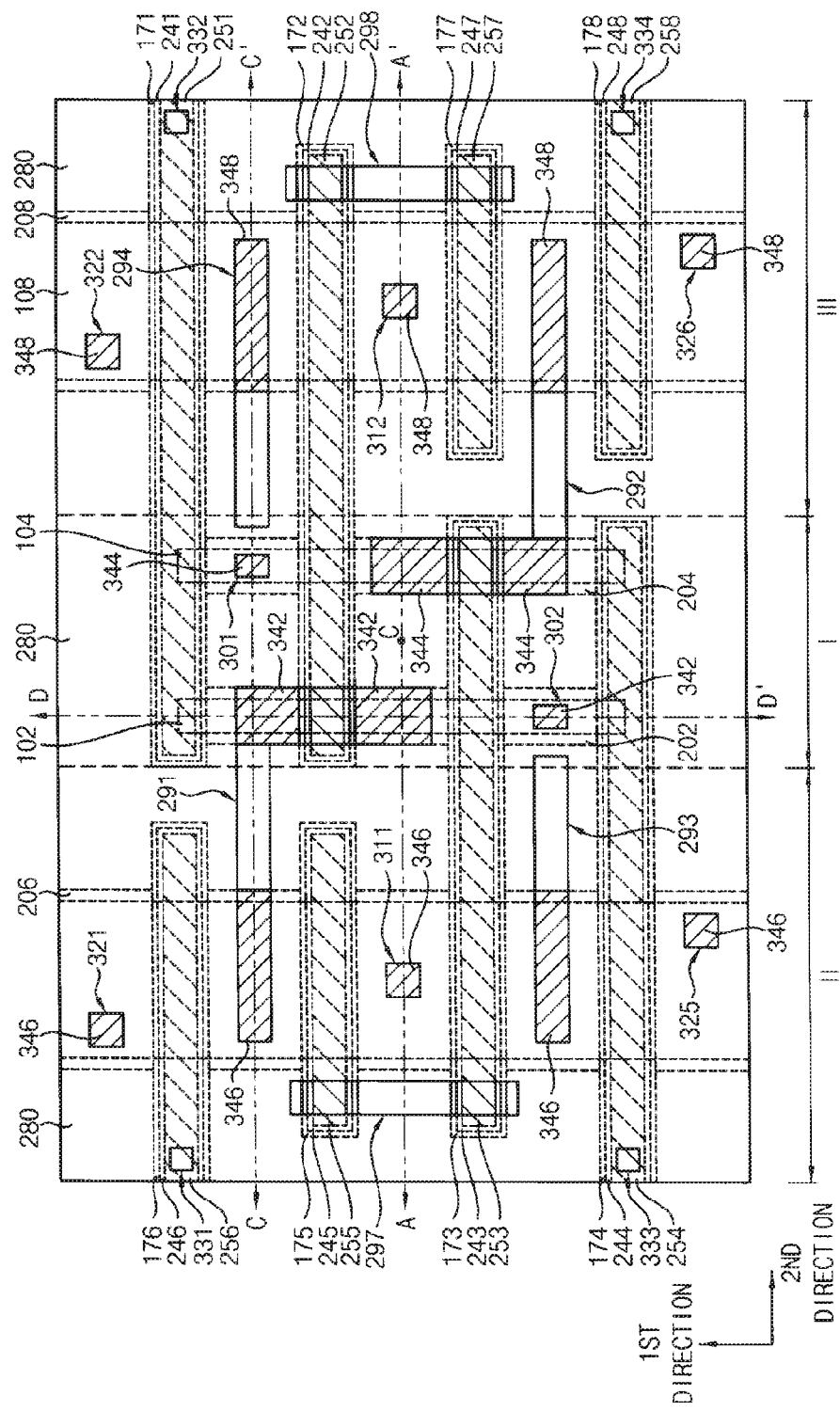
Figure 33:
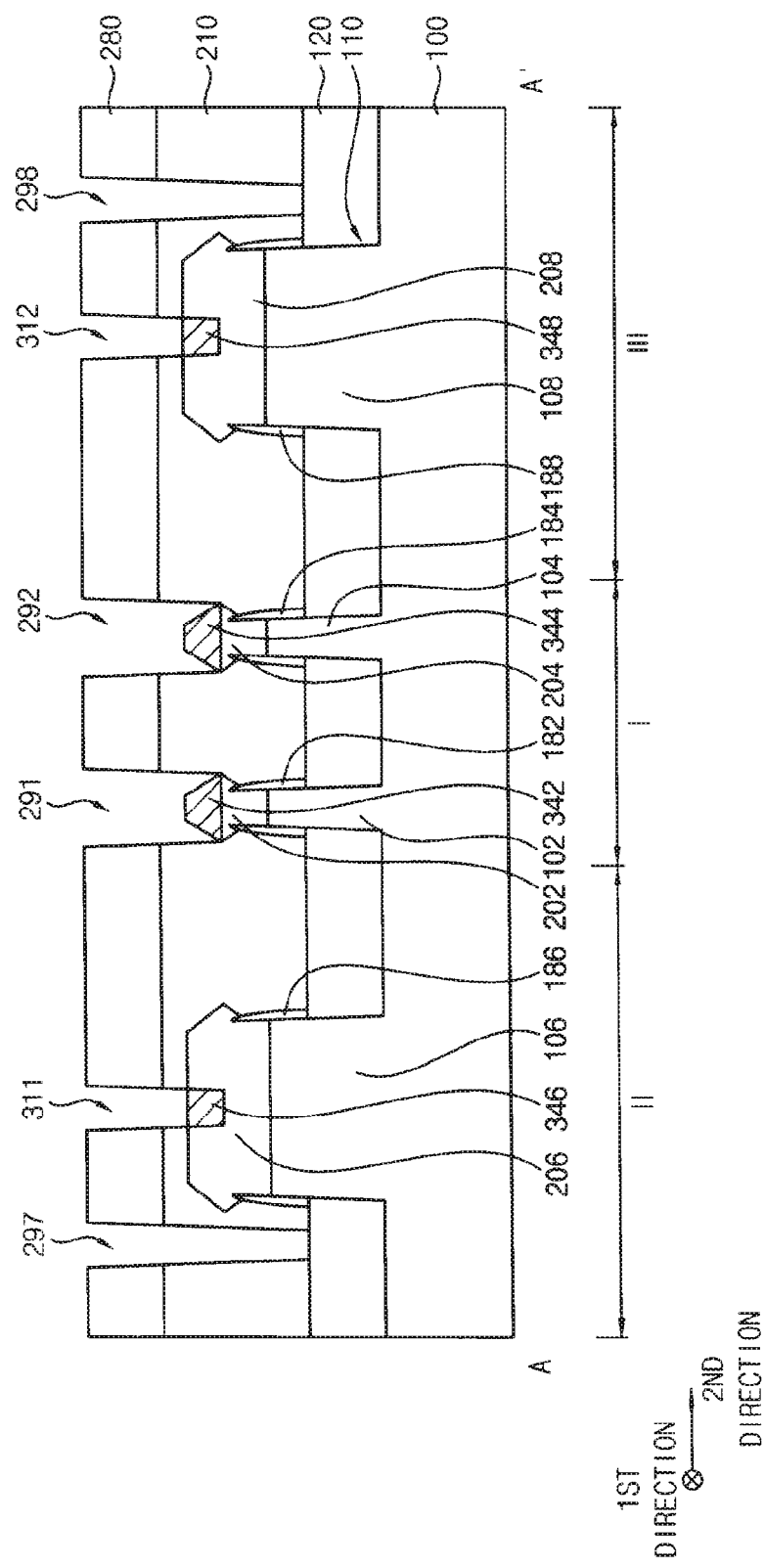

Referring to FIGS. 30 to 31, first to eighth gate structures 261, 262, 263, 264, 265, 266, 267 and 268 may be formed to fill the first to eighth openings 221, 222, 223, 224, 225, 226, 227 and 228, respectively.

Particularly, a thermal oxidation process may be performed on the top surfaces of the first to fourth active regions 102, 104, 106 and 108 exposed by the first to eighth openings 221, 222, 223, 224, 225, 226, 227 and 228 to form first to fourth interface layer patterns 231, 232, 233 and 234 in the first to fourth openings 221, 222, 223 and 224, respectively, and fifth to eighth interface layer patterns (not shown) in the fifth to eighth openings 225, 226, 227 and 228, respectively. However, the first to fourth interface layer patterns 231, 232, 233 and 234, and the fifth to eighth interface layer patterns may be also formed by a CVD process and/or an ALD process, and in example embodiments, may be also formed on top surfaces of the isolation layer pattern 120 exposed by the first to eighth openings 221, 222, 223, 224, 225, 226, 227 and 228.

In example embodiments, the first to fourth interface layer patterns 231, 232, 233 and 234, and the fifth to eighth interface layer patterns may not be formed.

A gate insulation layer may be formed on top surfaces of the first to fourth interface layer patterns 231, 232, 233 and 234 and the fifth to eighth interface layer patterns, the top surfaces of the isolation layer pattern 120 exposed by the first to eighth openings 221, 222, 223, 224, 225, 226, 227 and 228, sidewalls of the first to eighth openings 221, 222, 223, 224, 225, 226, 227 and 228, top surfaces of the first to eighth gate spacers 171, 172, 173, 174, 175, 176, 177 and 178, and a top surface of the first insulating interlayer 210, and a gate electrode layer may be formed on the gate insulation layer to sufficiently fill remaining portions of the first to eighth openings 221, 222, 223, 224, 225, 226, 227 and 228.

The gate insulation layer may be formed to include a metal oxide having a relatively high dielectric constant, e.g., hafnium oxide, tantalum oxide and/or zirconium oxide. The gate electrode layer may be formed to include a material having a relatively low resistance, e.g., a metal (for example, aluminum, copper and/or tantalum), or a metal nitride thereof, by an ALD process and/or a physical vapor deposition (PVD) process. In an example embodiment, a heat treatment process, e.g., a rapid thermal annealing (RTA) process, a spike rapid thermal annealing (spike RTA) process, a flash rapid thermal annealing (flash RTA) process or a laser annealing process, may be further performed. Alternatively, the gate electrode layer may be formed to include doped polysilicon.

The gate electrode layer and the gate insulation layer may be planarized until the top surface of the insulating interlayer 210 may be exposed to form first to eighth gate insulation layer patterns 241, 242, 243, 244, 245, 246, 247 and 248, and first to eighth gate electrodes 251, 252, 253, 254, 255, 256, 257 and 258 in the first to eighth openings 221, 222, 223, 224, 225, 226, 227 and 228, respectively. The first to eighth gate insulation layer patterns 241, 242, 243, 244, 245, 246, 247 and 248 may be formed to cover bottoms and sidewalls of the first to eighth gate electrodes 251, 252, 253, 254, 255, 256, 257 and 258, respectively.

The first interface layer pattern 231, the first gate insulation layer pattern 241 and the first gate electrode 251 may form the first gate structure 261, the second interface layer pattern 232, the second gate insulation layer pattern 242 and the second gate electrode 252 may form the second gate structure 262, the third interface layer pattern 233, the third gate insulation layer pattern 243 and the third gate electrode 253 may form the third gate structure 263, and the fourth interface layer pattern 234, the fourth gate insulation layer pattern 244 and the fourth gate electrode 254 may form the fourth gate structure 264. Additionally, the fifth interface layer pattern 235, the fifth gate insulation layer pattern 245 and the fifth gate electrode 255 may form the fifth gate structure 265, the sixth interface layer pattern 236, the sixth gate insulation layer pattern 246 and the sixth gate electrode 256 may form the sixth gate structure 266, the seventh interface layer pattern 237, the seventh gate insulation layer pattern 247 and the seventh gate electrode 257 may form the seventh gate structure 267, and the eighth interface layer pattern 238, the eighth gate insulation layer pattern 248 and the eighth gate electrode 258 may form the eighth gate structure 268.

The third gate structure 263 and the first source/drain layer 202 adjacent thereto may form a first pull-up transistor PU1, the second gate structure 262 and the second source/drain layer 204 adjacent thereto may form a second pull-up transistor PU2, the third and sixth gate structures 263 and 266 and the third source/drain layer 206 adjacent thereto may form a first pull-down transistor PD1, and the second and seventh gate structures 262 and 267 and the fourth source/drain layer 208 adjacent thereto may form a second pull-down transistor PD2.

The fifth gate structure 265 and the third source/drain layer 206 adjacent thereto may form a first pass-gate transistor PG1, the first gate structure 261 and the fourth source/drain layer 208 adjacent thereto may form a second pass-gate transistor PG2, the fourth gate structure 264 and the third source/drain layer 206 adjacent thereto may form a third pass-gate transistor PG3, and the eighth gate structure 268 and the fourth source/drain layer 208 adjacent thereto may form a fourth pass-gate transistor PG4.

The first and second pull-up transistors PU1 and PU2 may be PMOS transistors, and the first and second pull-down transistors PD1 and PD2, and the first to fourth pass-gate transistors PG1, PG2, PG3 and PG4 may be NMOS transistors.

In example embodiments, owing to the symmetries of the first to fourth active regions 102, 104, 106 and 108 and the first to eighth gate structures 261, 262, 263, 264, 265, 266, 267 and 268, with respect to the center C of the unit cell, the first and second pull-up transistors PU1 and PU2 may be in point symmetry, the first and second pull-down transistors PD1 and PD2 may be in point symmetry, the first and fourth pass-gate transistors PG1 and PG4 may be in point symmetry, and the second and third pass-gate transistors PG2 and PG3 may be in point symmetry. According to the symmetry, the transistors PU1, PU2, PD1, PD2, PG1, PG2, PG3 and PG4 may be easily formed.

Referring to FIGS. 32 to 35, a second insulating interlayer 280 may be formed on the first insulating interlayer 210, the first to eighth gate structures 261, 262, 263, 264, 265, 266, 267 and 268, and the first to eighth gate spacers 171, 172, 173, 174, 175, 176, 177 and 178, and the second insulating interlayer 280 and/or the first insulating interlayer 210 may be partially etched to form first to eighteenth holes 291, 292, 293, 294, 297, 298, 301, 302, 311, 312, 321, 322, 325, 326, 331, 332, 333 and 334 therethrough.

The first hole 291 may be formed to include a first portion extending in the first direction, and a second portion being in communication with the first portion and extending in the second direction. The first portion of the first hole 291 may expose the second gate structure 262, the second gate spacer 172, and a portion of the first source/drain layer 202 adjacent to the second gate structure 262 and the second gate spacer 172 in the first direction, and the second portion of the first hole 291 may expose a portion of the third source/drain layer 206 between the fifth and sixth gate structures 265 and 266, and a portion of the isolation layer pattern 120 adjacent to the portion of the third source/drain layer 206 in the second direction. The second hole 292 may be formed to include a first portion extending in the first direction, and a second portion being in communication with the first portion and extending in the second direction. The first portion of the second hole 292 may expose the third gate structure 263, the third gate spacer 173, and a portion of the second source/drain layer 204 adjacent to the third gate structure 263 and the third gate spacer 173 in the first direction, and the second portion of the second hole 292 may expose a portion of the fourth source/drain layer 208 between the seventh and eighth gate structures 267 and 268, and a portion of the isolation layer pattern 120 adjacent to the portion of the fourth source/drain layer 208 in the second direction. In example embodiments, the first and second holes 291 and 292 may be in point symmetry with respect to the center C of the unit cell.

The third hole 293 may be formed to extend in the second direction, and may expose a portion of the third source/drain layer 206 between the third and fourth gate structures 263 and 264, and a portion of the isolation layer pattern 120 adjacent to the portion of the third source/drain layer 206 in the second direction. The fourth hole 294 may be formed to extend in the second direction, and may expose a portion of the fourth source/drain layer 208 between the first and second gate structures 261 and 262, and a portion of the isolation layer pattern 120 adjacent to the portion of the fourth source/drain layer 208 in the second direction. In example embodiments, the third and fourth holes 293 and 294 may be in point symmetry with respect to the center C of the unit cell.

The fifth hole 297 may be formed to extend in the first direction, and may expose the third and sixth gate structures 263 and 266, the third and sixth gate spacers 173 and 176, and a portion of the isolation layer pattern 120 adjacent to the third and sixth gate structures 263 and 266 and the third and sixth gate spacers 173 and 176 in the first direction. The sixth hole 298 may be formed to extend in the first direction, and may expose the second and seventh gate structures 262 and 267, the second and seventh gate spacers 172 and 177, and a portion of the isolation layer pattern 120 adjacent to the second and seventh gate structures 262 and 267 and the second and seventh gate spacers 172 and 177 in the first direction. In example embodiments, the fifth and sixth holes 295 and 296 may be in point symmetry with respect to the center C of the unit cell.

The seventh hole 301 may be formed to expose a portion of the second source/drain layer 204 between the first and second gate structures 261 and 262, and the eighth hole 302 may expose a portion of the second source/drain layer 204 between the third and fourth gate structures 263 and 264. In example embodiments, the seventh and eighth holes 301 and 302 may be in point symmetry with respect to the center C of the unit cell.

The ninth hole 311 may be formed to expose a portion of the third source/drain layer 206 between the third and sixth gate structures 263 and 266, and the tenth hole 312 may expose a portion of the fourth source/drain layer 208 between the second and seventh gate structures 262 and 267. In example embodiments, the ninth and tenth holes 311 and 312 may be in point symmetry with respect to the center C of the unit cell.

The eleventh hole 321 may be formed to expose a portion of the third source/drain layer 206 adjacent to the fifth gate structure 265 in the first direction, and the twelfth hole 322 may be formed to expose a portion of the fourth source/drain layer 208 adjacent to the first gate structure 261 in the first direction. The thirteenth hole 325 may be formed to expose a portion of the third source/drain layer 206 adjacent to the fourth gate structure 264 in the first direction, and the fourteenth hole 326 may be formed to expose a portion of the fourth source/drain layer 208 adjacent to the eighth gate structure 268 in the first direction. In example embodiments, the eleventh and fourteenth holes 321 and 326 may be in point symmetry with respect to the center C of the unit cell, and the twelfth and thirteenth holes 322 and 325 may be in point symmetry with respect to the center C of the unit cell.

The fifteenth to eighteenth holes 331, 332, 333 and 334 may be formed to expose the fifth, first, fourth and eighth gate structures 265, 261, 264 and 268, respectively. In example embodiments, the fifteenth and eighteenth holes 331 and 334 may be in point symmetry with respect to the center C of the unit cell, and the sixteenth and seventeenth holes 332 and 333 may be in point symmetry with respect to the center C of the unit cell.

As illustrated above, the first to eighteenth holes 291, 292, 293, 294, 297, 298, 301, 302, 311, 312, 321, 322, 325, 326, 331, 332, 333 and 334 may be formed to have symmetry, and thus may be easily formed.

A metal layer may be formed on the first to fourth source/drain layers 202, 204, 206 and 208 exposed by the first to eighteenth holes 291, 292, 293, 294, 297, 298, 301, 302, 311, 312, 321, 322, 325, 326, 331, 332, 333 and 334, and thermally treated to be reacted therewith. Non-reacted portions of the metal layer may be removed. Thus, first to fourth metal silicide patterns 342, 344, 346 and 348 may be formed on the first to fourth source/drain layers 202, 204, 206 and 208, respectively.

Referring to FIGS. 36 to 41, first to eighteenth contact plugs 351, 352, 353, 354, 357, 358, 361, 362, 371, 372, 381, 382, 385, 386, 391, 392, 393 and 394 may be formed to fill the first to eighteenth holes 291, 292, 293, 294, 297, 298, 301, 302, 311, 312, 321, 322, 325, 326, 331, 332, 333 and 334, respectively.

In example embodiments, the first to eighteenth contact plugs 351, 352, 353, 354, 357, 358, 361, 362, 371, 372, 381, 382, 385, 386, 391, 392, 393 and 394 may be formed by forming a first conductive layer on the second insulating interlayer 280 to fill the first to eighteenth holes 291, 292, 293, 294, 297, 298, 301, 302, 311, 312, 321, 322, 325, 326, 331, 332, 333 and 334, and planarizing the first conductive layer until a top surface of the second insulating interlayer 280 may be exposed. The first conductive layer may be formed to include a metal, e.g., tungsten, titanium, tantalum, copper and/or aluminum, or a metal nitride, e.g., tungsten nitride, titanium nitride and/or tantalum nitride. In example embodiments, the first conductive layer may be formed to include a metal pattern (not shown) and a barrier layer pattern (not shown) surrounding a sidewall and a bottom of the metal pattern.

The first to eighteenth holes 291, 292, 293, 294, 297, 298, 301, 302, 311, 312, 321, 322, 325, 326, 331, 332, 333 and 334 may be formed to have symmetry, and thus the first to eighth contact plugs 351, 352, 353, 354, 357, 358, 361, 362, 371, 372, 381, 382, 385, 386, 391, 392, 393 and 394 may be also formed to have symmetry.

The first contact plug 351 may be formed to include a first portion extending in the first direction, and a second portion being connected to the first portion and extending in the second direction. The first contact plug 351 may be formed on a top surface of the second gate structure 262, a top surface of the second gate spacer 172, a portion of the first metal silicide pattern 342 adjacent to the second gate structure 262 and the second gate spacer 172 in the first direction, a portion of the third metal silicide pattern 346 between the fifth and sixth gate structures 265 and 266, and a portion of the isolation layer pattern 120 adjacent to the portion of the third metal silicide pattern 346 in the second direction. The second contact plug 352 may be formed to include a first portion extending in the first direction, and a second portion being connected to the first portion and extending in the second direction. The second contact plug 352 may be formed on a top surface of the third gate structure 263, a top surface of the third gate spacer 173, a portion of the second metal silicide pattern 344 adjacent to the third gate structure 263 and the third gate spacer 173 in the first direction, a portion of the fourth metal silicide pattern 348 between the seventh and eighth gate structures 267 and 268, and a portion of the isolation layer pattern 120 adjacent to the portion of the fourth metal silicide pattern 348 in the second direction.

The third contact plug 353 may be formed to extend in the second direction, and may be formed on a portion of the third metal silicide pattern 346 between the third and fourth gate structures 263 and 264, and a portion of the isolation layer pattern 120 adjacent to the portion of the third metal silicide pattern 346 in the second direction. The fourth contact plug 354 may be formed to extend in the second direction, and may be formed on a portion of the fourth metal silicide pattern 348 between the first and second gate structures 261 and 262, and a portion of the isolation layer pattern 120 adjacent to the portion of the fourth metal silicide pattern 348 in the second direction.

The fifth contact plug 357 may be formed to extend in the first direction, and may be formed on top surfaces of the third and sixth gate structures 263 and 266, top surfaces of the third and sixth gate spacers 173 and 176, and a portion of the isolation layer pattern 120 adjacent to the third and sixth gate structures 263 and 266 and the third and sixth gate spacers 173 and 176 in the first direction. The sixth contact plug 358 may be formed to extend in the first direction, and may be formed on top surfaces of the second and seventh gate structures 262 and 267, top surfaces of the second and seventh gate spacers 172 and 177, and a portion of the isolation layer pattern 120 adjacent to the second and seventh gate structures 262 and 267 and the second and seventh gate spacers 172 and 177 in the first direction.

The seventh contact plug 361 may be formed on a portion of the second metal silicide pattern 344 between the first and second gate structures 261 and 262, and the eighth contact plug 362 may be formed on a portion of the second metal silicide pattern 344 between the third and fourth gate structures 263 and 264.

The ninth contact plug 371 may be formed on a portion of the third metal silicide pattern 346 between the third and sixth gate structures 263 and 266, and the tenth contact plug 372 may be formed on a portion of the fourth metal silicide pattern 348 between the second and seventh gate structures 262 and 267.

The eleventh contact plug 381 may be formed on a portion of the third metal silicide pattern 346 adjacent to the fifth gate structure 265 in the first direction, and the twelfth contact plug 382 may be formed on a portion of the fourth metal silicide pattern 348 adjacent to the first gate structure 261 in the first direction. The thirteenth contact plug 385 may be formed on a portion of the third metal silicide pattern 346 adjacent to the fourth gate structure 264 in the first direction, and the fourteenth contact plug 386 may be formed on a portion of the fourth metal silicide pattern 348 adjacent to the eighth gate structure 268 in the first direction.

The fifteenth to eighteenth contact plugs 391, 392, 393 and 394 may be formed on top surfaces of the fifth, first, fourth and eighth gate structures 265, 261, 264 and 268, respectively.

Referring to FIGS. 42 to 48, a third insulating interlayer 400 may be formed on the second insulating interlayer 280, and the first to eighteenth contact plugs 351, 352, 353, 354, 357, 358, 361, 362, 371, 372, 381, 382, 385, 386, 391, 392, 393 and 394, and first to sixteenth vias 411, 412, 413, 414, 421, 422, 431, 432, 441, 442, 445, 446, 451, 452, 453 and 454 may be formed through the third insulating interlayer 400.

The first to sixteenth vias 411, 412, 413, 414, 421, 422, 431, 432, 441, 442, 445, 446, 451, 452, 453 and 454 may be formed by forming holes (not shown) through the third insulating interlayer 400, forming a second conductive layer on the third insulating interlayer 400 to fill the holes, and planarizing the second conductive layer until a top surface of the third insulating interlayer 400 may be exposed. The second conductive layer may be formed to include a metal, e.g., tungsten, titanium, tantalum, copper and/or aluminum, or a metal nitride, e.g., tungsten nitride, titanium nitride and/or tantalum nitride. In example embodiments, the second conductive layer may be formed to include a metal pattern (not shown) and a barrier layer pattern (not shown) surrounding a sidewall and a bottom of the metal pattern.

The first to fourth vias 411, 412, 413 and 414 may be formed on top surfaces of the first to fourth contact plugs 351, 352, 353 and 354, respectively, and the fifth to sixteenth vias 421, 422, 431, 432, 441, 442, 445, 446, 451, 452, 453 and 454 may be formed on top surfaces of the seventh to eighteenth contact plugs 357, 358, 361, 362, 371, 372, 381, 382, 385, 386, 391, 392, 393 and 394, respectively.

The first to sixteenth vias 411, 412, 413, 414, 421, 422, 431, 432, 441, 442, 445, 446, 451, 452, 453 and 454 may be formed to have symmetry. Particularly, the first and second vias 411 and 412, the third and fourth vias 413 and 414, the fifth and sixth vias 421 and 422, the seventh and eighth vias 431 and 432, the ninth and twelfth vias 441 and 446, the tenth and eleventh vias 442 and 445, the thirteenth and sixteenth vias 451 and 454, and the fourteenth and fifteenth vias 452 and 453 may be in point symmetry, respectively, with respect to the center C of the unit cell.

A fourth insulating interlayer 460 may be formed on the third insulating interlayer 400, and the first to sixteenth vias 411, 412, 413, 414, 421, 422, 431, 432, 441, 442, 445, 446, 451, 452, 453 and 454, and first to thirteenth conductive lines 471, 472, 481, 482, 483, 491, 492, 495, 496, 501, 502, 503 and 504 may be formed through the fourth insulating interlayer 460.

The first to thirteenth conductive lines 471, 472, 481, 482, 483, 491, 492, 495, 496, 501, 502, 503 and 504 may be formed by forming holes (not shown) through the fourth insulating interlayer 460, forming a third conductive layer on the fourth insulating interlayer 460 to fill the holes, and planarizing the third conductive layer until a top surface of the fourth insulating interlayer 460 may be exposed. The third conductive layer may be formed to include a metal, e.g., tungsten, titanium, tantalum, copper and/or aluminum, or a metal nitride, e.g., tungsten nitride, titanium nitride and/or tantalum nitride. In example embodiments, the third conductive layer may be formed to include a metal pattern (not shown) and a barrier layer pattern (not shown) surrounding a sidewall and a bottom of the metal pattern.

The first conductive line 471 may be formed to extend in the first direction on top surfaces of the first and third vias 411 and 413, and the second conductive line 472 may be formed to extend in the first direction on top surfaces of the second and fourth vias 412 and 414. The third conductive line 481 may be formed to extend in the first direction on top surfaces of the fifth and sixth vias 421 and 422. The fourth conductive line 482 may be formed to extend in the first direction on a top surface of the seventh via 431. The fifth conductive line 483 may be formed to extend in the first direction on a top surface of the eighth via 432.

The sixth conductive line 491 may be formed to extend in the first direction on a top surface of the ninth via 441. The seventh conductive line 492 may be formed to extend in the first direction on a top surface of the tenth via 442. The eighth conductive line 495 may be formed to extend in the first direction on a top surface of the eleventh via 445. The ninth conductive line 496 may be formed to extend in the first direction on a top surface of the twelfth via 446.

The tenth to thirteenth conductive lines 501, 502, 503 and 504 may be formed to extend in the first direction on top surfaces of the thirteenth to sixteenth vias 451, 452, 453 and 454, respectively.

As illustrated above, all of the first to thirteenth conductive lines 471, 472, 481, 482, 483, 491, 492, 495, 496, 501, 502, 503 and 504 may be formed to extend in the first direction, and thus may be easily formed in the fourth insulating interlayer 460.

The first to thirteenth conductive lines 471, 472, 481, 482, 483, 491, 492, 495, 496, 501, 502, 503 and 504 may have also symmetry. Particularly, the first and second conductive lines 471 and 472, the fourth and fifth conductive lines 482 and 483, the sixth and ninth conductive lines 491 and 496, the seventh and eighth conductive lines 492 and 495, the tenth and thirteenth conductive lines 501 and 504, and the eleventh and twelfth conductive lines 502 and 503 may be in point symmetry, respectively, with respect to the center C of the unit cell. All of the first to thirteenth conductive lines 471, 472, 481, 482, 483, 491, 492, 495, 496, 501, 502, 503 and 504 may extend in the first direction, and thus some of the first to thirteenth conductive lines 471, 472, 481, 482, 483, 491, 492, 495, 496, 501, 502, 503 and 504 may be in line symmetry with each other.

The first conductive line 471 may serve as a first connection line for connecting the first and third contact plugs 351 and 353 with each other by the first and third vias 411 and 413, and the second conductive line 472 may serve as a second connection line for connecting the second and fourth contact plugs 352 and 354 with each other by the second and fourth vias 412 and 414.

The third conductive line 481 may serve as a power line of the dual-port SRAM device, and each of the fourth and fifth conductive lines 482 and 483 may serve as a ground line thereof. The sixth and seventh conductive lines 491 and 492 may serve as a first bit line and a first complementary bit line, respectively, and the eighth and ninth conductive lines 495 and 496 may serve as a second bit line and a second complementary bit line, respectively.

Referring to FIGS. 2 to 8 again, a fifth insulating interlayer 510 may be formed on the fourth insulating interlayer 460, and the first to thirteenth conductive lines 471, 472, 481, 482, 483, 491, 492, 495, 496, 501, 502, 503 and 504, and seventeenth to twentieth vias 521, 522, 523 and 524 may be formed through the fifth insulating interlayer 510.

The seventeenth to twentieth vias 521, 522, 523 and 524 may be formed by forming holes (not shown) through the fifth insulating interlayer 510, forming a fourth conductive layer on the fifth insulating interlayer 510 to fill the holes, and planarizing the fourth conductive layer until a top surface of the fifth insulating interlayer 510 may be exposed. The fourth conductive layer may be formed to include a metal, e.g., tungsten, titanium, tantalum, copper and/or aluminum, or a metal nitride, e.g., tungsten nitride, titanium nitride and/or tantalum nitride. In example embodiments, the fourth conductive layer may be formed to include a metal pattern (not shown) and a barrier layer pattern (not shown) surrounding a sidewall and a bottom of the metal pattern.

The seventeenth to twentieth vias 521, 522, 523 and 524 may be formed on top surfaces of the tenth to thirteenth conductive lines 501, 502, 503 and 504, respectively, and may also have symmetry. Particularly, the seventeenth and twentieth vias 521 and 524, and the eighteenth and ninth vias 522 and 523 may be in point symmetry, respectively, with respect to the center C of the unit cell.

A sixth insulating interlayer 530 may be formed on the fifth insulating interlayer 510, and top surfaces of the seventeenth to twentieth vias 521, 522, 523 and 524, and fourteenth and fifteenth conductive lines 542 and 544 may be formed through the sixth insulating interlayer 530.

The fourteenth and fifteenth conductive lines 542 and 544 may be formed by forming holes (not shown) through the sixth insulating interlayer 530, forming a fifth conductive layer on the sixth insulating interlayer 530 to fill the holes, and planarizing the fifth conductive layer until a top surface of the sixth insulating interlayer 530 may be exposed. The fifth conductive layer may be formed to include a metal, e.g., tungsten, titanium, tantalum, copper and/or aluminum, or a metal nitride, e.g., tungsten nitride, titanium nitride and/or tantalum nitride. In example embodiments, the fifth conductive layer may be formed to include a metal pattern (not shown) and a barrier layer pattern (not shown) surrounding a sidewall and a bottom of the metal pattern.

The fourteenth conductive line 542 may be formed to extend in the second direction on top surfaces of the seventeenth and eighteenth vias 521 and 522. The fifteenth conductive line 544 may be formed to extend in the second direction on top surfaces of the ninth and twentieth vias 523 and 524.

The fourteenth and fifteenth conductive lines 542 and 544 may be in line symmetry with respect to an imaginary line extending in the second direction and crossing the center C of the unit cell.

The fourteenth and fifteenth conductive lines 542 and 544 may serve as first and second word lines, respectively, of the dual-port SRAM device. All of the first to thirteenth conductive lines 471, 472, 481, 482, 483, 491, 492, 495, 496, 501, 502, 503 and 504 serving as the power line, the ground line and the bit line of the dual-port SRAM device may be formed in the fourth insulating interlayer 460, and thus only the fourteenth and fifteenth conductive lines 542 and 544 serving as the word line may be formed in the sixth insulating interlayer 530. Accordingly, each of the fourteenth and fifteenth conductive lines 542 and 544 may have a large width in the first direction so as to have a low resistance. Particularly, only four active regions 102, 104, 106 and 108 may be formed in the unit cell in the first direction, and thus each of the fourteenth and fifteenth conductive lines 542 and 544 extending in the first direction may have a relatively short length so as to have a lower resistance.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A dual-port SRAM device, comprising:
   a substrate including,
      a field region,
      an isolation layer pattern on the field region, and
      first to fourth active fins protruding from the isolation layer pattern and extending in a first direction; and
   a unit cell including, first and second gate structures on the first, second and fourth active fins, each of the first and second gate structures extending in a second direction crossing the first direction, third and fourth gate structures on the first, second and third active fins, each of the third and fourth gate structures extending in the second direction, fifth and sixth gate structures on the third active fin, each of the fifth and sixth gate structures extending in the second direction, a first contact plug electrically connecting the sixth gate structure and the third gate structure, seventh and eighth gate structures on the fourth active fin, each of the seventh and eighth gate structures extending in the second direction, and a second contact plug electrically connecting the seventh gate structure and the second gate structure.

2. The dual-port SRAM device of claim 1, wherein the third gate structure on the first active fin and the second gate structure on the second active fin form first and second pull-up transistors, respectively, and the third and sixth gate structures electrically connected to each other through the first contact plug on the third active fin, and the second and seventh gate structures electrically connected to each other through the second contact plug on the fourth active fin form first and second pull-down transistors, respectively.

3. The dual-port SRAM device of claim 2, wherein the fifth gate structure on the third active fin and the first gate structure on the fourth active fin form first and second pass-gate transistors, respectively, and the fourth gate structure on the third active fin and the eighth gate structure on the fourth active fin form third and fourth pass-gate transistors, respectively.

4. The dual-port SRAM device of claim 3, further comprising:

a first word line electrically connected to the fifth and first gate structures forming the first and second pass-gate transistors, respectively; and a second word line electrically connected to the fourth and eighth gate structures forming the third and fourth pass-gate transistors, respectively.

5. The dual-port SRAM device of claim 3, further comprising:

a third contact plug electrically connecting a first pass-gate source/drain region of the first pass-gate transistor and a first pull-up source/drain region of the first pull-up transistor, and a fourth contact plug electrically connecting a fourth pass-gate source/drain region of the fourth pass-gate transistor and a second pull-up source/drain region of the second pull-up transistor.

6. The dual-port SRAM device of claim 5, wherein each of the third and fourth contact plugs includes a first portion extending in the first direction and a second portion extending in the second direction.

7. The dual-port SRAM device of claim 5, wherein the third and fourth contact plugs are in point symmetry with respect to a center of the unit cell.

8. The dual-port SRAM device of claim 5, wherein the third pass-gate transistor includes a third pass-gate source/drain region electrically connected to the third contact plug through a fifth contact plug, first and second vias, and a first connection line, and the second pass-gate transistor includes a second pass-gate source/drain region electrically connected to the fourth contact plug through a sixth contact plug, third and fourth vias, and a second connection line.

9. The dual-port SRAM device of claim 8, wherein the third and fifth contact plugs have top surfaces coplanar with each other, the first and second vias contact the top surfaces of the third and fifth contact plugs, respectively, and the first connection line contacts top surfaces of the first and second vias, and the fourth and sixth contact plugs have top surfaces coplanar with each other, the third and fourth vias contact the top surfaces of the fourth and sixth contact plugs, respectively, and the second connection line contacts top surfaces of the third and fourth vias.

10. The dual-port SRAM device of claim 9, wherein each of the first and second connection lines extends in the first direction.

11. The dual-port SRAM device of claim 9, further comprising:

a power line extending in the first direction, the power line being electrically connected to the first pull-up source/drain region through a seventh contact plug and a fifth via, and being electrically connected to the second pull-up source/drain region through an eighth contact plug and a sixth via; and a ground line extending in the first direction, the ground line being electrically connected to the first pull-down source/drain region through a ninth contact plug and a seventh via, and being electrically connected to the second pull-down source/drain region through a tenth contact plug and an eighth via.

12. The dual-port SRAM device of claim 11, further comprising:

a first bit line extending in the first direction, the first bit line being electrically connected to the first pass-gate source/drain region;

a first complementary bit line extending in the first direction, the first complementary bit line being electrically connected to the second pass-gate source/drain region;

a second bit line extending in the first direction, the second bit line being electrically connected to the third pass-gate source/drain region; and a second complementary bit line extending in the first direction, the second complementary bit line being electrically connected to the fourth pass-gate source/drain region.

13. The dual-port SRAM device of claim 12, wherein the first and second connection lines, the power line, the ground line, the first and second bit lines, and the first and second complementary bit lines have a top surface at a same level.

14. The dual-port SRAM device of claim 1, wherein the first and second active fins are in point symmetry with respect to a center of the unit cell, and the third and fourth active fins are in point symmetry with respect to a center of the unit cell.

15. The dual-port SRAM device of claim 1, wherein the first and second gate structures and the third and fourth gate structures are in point symmetry with respect to a center of the unit cell, and the fifth and sixth gate structures and the seventh and eighth gate structures are in point symmetry with respect to a center of the unit cell.

16. The dual-port SRAM device of claim 1, wherein the first, second, third and fourth active fins are the only active fins included in the unit cell, and the first and second gate structures are only on the first, second and fourth active fins.

17. The dual-port SRAM device of claim 1, wherein
the first, second, third and fourth active fins are the only active fins included in the unit cell, and
the third and fourth gate structures are only on the first, second and third active fins.

18. The dual-port SRAM device of claim 1, wherein
the first, second, third and fourth active fins are the only active fins included in the unit cell, and
the fifth and sixth gate structures are only on the third active fin.

19. The dual-port SRAM device of claim 1, wherein
the first, second, third and fourth active fins are the only active fins included in the unit cell, and
the seventh and eighth gate structures are only on the fourth active fin.

* * * * *